United States Patent
Watanabe et al.

(10) Patent No.: US 6,418,067 B1
(45) Date of Patent: *Jul. 9, 2002

(54) SEMICONDUCTOR MEMORY DEVICE SUITABLE FOR MERGING WITH LOGIC

(75) Inventors: Naoya Watanabe; Akira Yamazaki; Kazutami Arimoto; Takeshi Fujino; Isamu Hayashi; Hideyuki Noda, all of Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 60 days.

(21) Appl. No.: 09/592,454

(22) Filed: Jun. 9, 2000

(30) Foreign Application Priority Data

Jul. 12, 1999 (JP) ........................................ 11-197379(P)
Nov. 16, 1999 (JP) ........................................ 11-325381(P)

(51) Int. Cl.$^7$ ................................................. G11C 7/00
(52) U.S. Cl. ................................. 365/200; 365/230.03
(58) Field of Search ................................. 365/200, 203, 365/230.03, 230.06

(56) References Cited

U.S. PATENT DOCUMENTS

| | | | | |
|---|---|---|---|---|
| 4,380,066 A | * | 4/1983 | Spencer et al. | 365/200 |
| 5,021,944 A | * | 6/1991 | Sasaki et al. | 365/200 |
| 5,148,396 A | * | 9/1992 | Nakada | 365/189.03 |
| 5,477,492 A | * | 12/1995 | Ohsaki et al. | 365/200 |
| 5,579,280 A | | 11/1996 | Son et al. | 365/238.5 |
| 5,627,786 A | | 5/1997 | Roohparvar | 365/200 |
| 5,844,848 A | | 12/1998 | Cho | 365/190 |

FOREIGN PATENT DOCUMENTS

| | | |
|---|---|---|
| EP | 0491523 A1 | 6/1992 |
| EP | 0554052 A2 | 8/1993 |
| EP | 0559368 A2 | 9/1993 |
| JP | 2-289992 | 11/1990 |
| JP | 8-31175 | 2/1996 |
| JP | 11-195766 | 7/1999 |

OTHER PUBLICATIONS

"64Mb 6.8ns Random ROW Access DRAM Macro for ASICs", T. Kimura et al., IEEE Digest of Technical Papers, Feb. 17, 1999, pp. 416–417, 486.

"A Configurable DRAM Macro Design for 2112 Derivative Organizations to be Synthesized Using a Memory Generator", T. Yabe et al., IEEE Digest of Technical Papers, Feb. 5, 1998, pp. 72–73, 415.

* cited by examiner

Primary Examiner—Son Mai
(74) Attorney, Agent, or Firm—McDermott, Will & Emery

(57) ABSTRACT

Read data line pairs, write data line pairs, a spare read data line pair, and a spare write data line pair are provided extending in the column direction over a memory cell array. Spare bit repair is performed by replacing a data line pair. Column redundancy control circuit changes the timing for outputting the result of spare determination for a data write mode and for a data read mode. A semiconductor memory device suitable for merging with a logic and capable of reducing the current consumption and achieving a higher operation frequency is provided.

28 Claims, 47 Drawing Sheets

$:VBL = \dfrac{VccS}{2}$

SENSE POWER SUPPLY LINE (VccS)
PROVIDED ON MEMORY BLOCK (SEE FIGS. 12, 15)

: j = 0~3

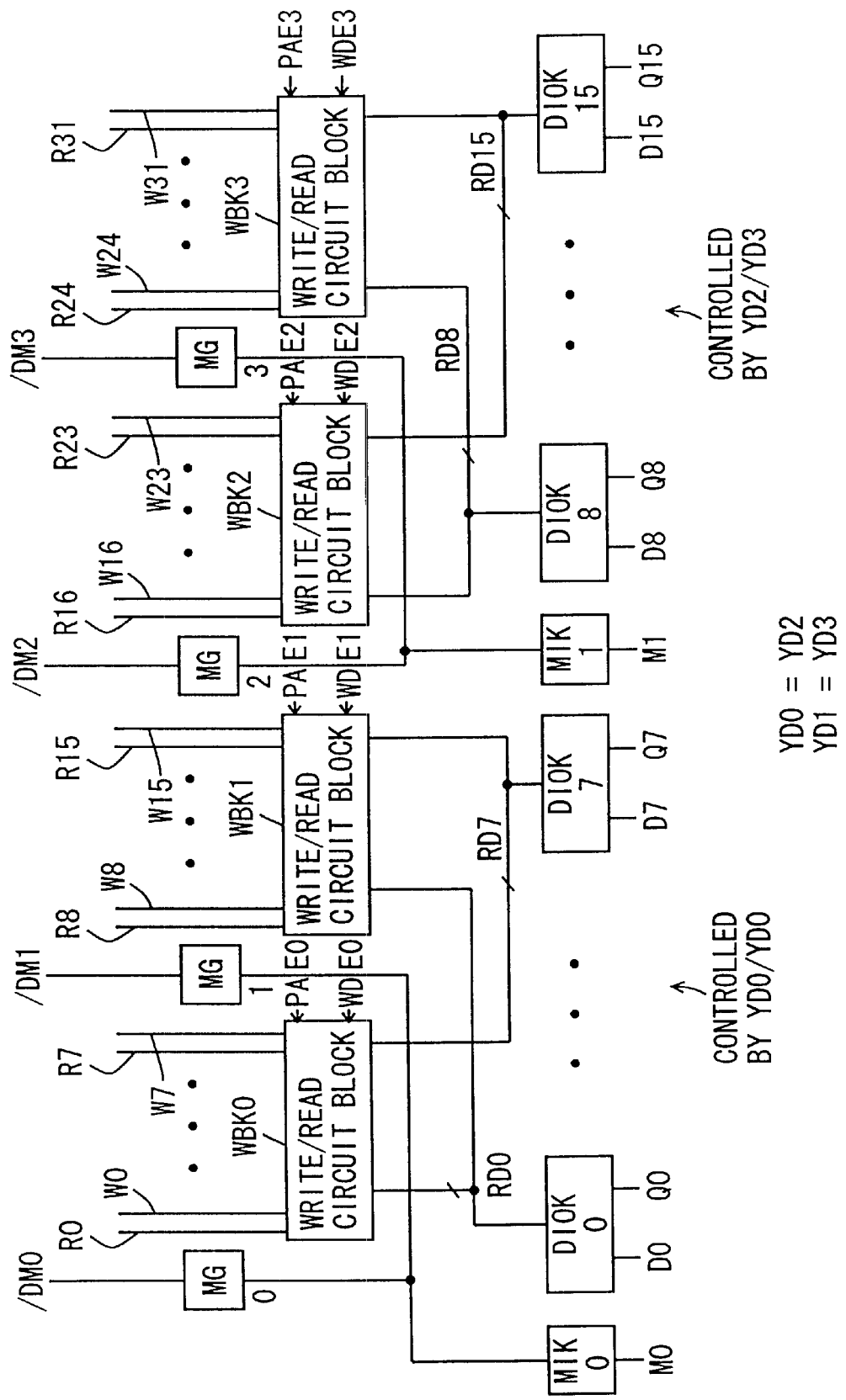
F I G. 5 7

SEMICONDUCTOR MEMORY DEVICE SUITABLE FOR MERGING WITH LOGIC

CROSS-REFERENCE

A subject matter of interest related to the present invention is disclosed in a co-pending U.S. patent application Ser. No. 09/451,709 filed on Dec. 1, 1999.

BACKGROUND OF THE INVENTION

1. Field of the Invention

The present invention relates to a semiconductor memory device, and specifically to a semiconductor memory device suitable for merging with a logic such as a logic device or a microprocessor. More specifically, the present invention is related to an arrangement of a data write/read portion of a logic-merged DRAM (Dynamic Random Access Memory).

2. Description of the Background Art

In recent years, a DRAM built-in system LSI (Large Scale Integration) having a DRAM and a logic device or a microprocessor integrated on the same semiconductor substrate has become widely adopted. The DRAM built-in system LSI has the following advantages over the conventional system having a discrete DRAM and a logic device soldered onto a printed-circuit board:

(1) There is no need to take into account the pin terminals of the discrete DRAM, so that wider space may be used for the data bus between a DRAM and a logic, and an improved data transfer rate is achieved, leading to an improved system performance;

(2) The data bus formed on a semiconductor substrate has a smaller parasitic capacitance than the wire on a printed-circuit board, so that the charge/discharge current of a signal line can be reduced, while the operating current consumed during data transfer can also be reduced; and (3) The package can be unified, and the data bus wiring and the control signal wiring on the printed-circuit board can be reduced in number so that smaller area is occupied on the printed-circuit board.

FIG. 58 is a diagram representing an example of an arrangement of a conventional DRAM built-in system LSI. In FIG. 58, the DRAM built-in system LSI has a logic circuit LG and a DRAM macro integrated on the same semiconductor substrate chip CH.

The DRAM macro includes memory arrays MA0 and MA1, each having a plurality of memory cells arranged in a matrix of rows and columns; row decoders XD0 and XD1 provided corresponding to memory arrays MA0 and MA1 for selecting addressed rows of the corresponding memory arrays MA0 and MA1; column decoders YD0 and YD1 provided corresponding to memory arrays MA0 and MA1 for selecting addressed columns of memory arrays MA0 and MA1; data paths DP0 and DP1 for communicating data with the memory cell columns selected by column decoders YD0 and YD1; and a control circuit CG for controlling the data access operation to memory arrays MA0 and MA1.

Data paths DP0 and DP1 are coupled to logic circuit LG via data buses DB0 and DB1, and control circuit CG is coupled to logic circuit LG via a control bus CTB. In FIG. 58, each of data buses DB0 and DB1 separately communicates 128-bit write data (D) and 128-bit read data (Q).

In the DRAM built-in system LSI shown in FIG. 58, row decoders XD0 and XD1 are disposed orthogonal to column decoders YD0 and YD1. Upon selecting the columns of memory arrays MA0 and MA1 with column decoders YD0 and YD1, data paths DP0 and DP1 can be coupled to the selected columns of memory arrays MA0 and MA1 in the shortest distance. In addition, since the DRAM macro and logic circuit LG are integrated on the same semiconductor chip CH, data buses DB0 and DB1 are not in any way limited with respect to the pitch condition and number of pin terminals so that a wide bus can be implemented.

FIG. 59 is a schematic representation of an arrangement of memory arrays MA0 and MA1 shown in FIG. 58. Since these memory arrays MA0 and MA1 have identical arrangement, they are generically shown as memory array MA in FIG. 59. Memory array MA includes a plurality of memory cell blocks MCB arranged in a matrix of rows and columns. Though not specifically shown, memory cells are arranged in a matrix of rows and columns within these memory cell blocks MCB.

Local IO line pair groups LIOs are provided corresponding to each of memory cell blocks MCB for communicating data with the corresponding memory cell blocks. A local IO line pair LIO communicates signals complementary one another. Moreover, a sense amplifier group SAs is arranged corresponding to each of memory cell blocks MCB. Sense amplifier group SAs has a shared sense amplifier arrangement and is shared by the memory cell blocks adjacent to one another in the column direction. These sense amplifier groups SAs includes sense amplifier circuits SA provided corresponding to the respective columns of the corresponding memory cell blocks, and perform sense, amplification, and latching of data of the columns of the corresponding memory cell blocks during activation. Sense amplifier group SAs is selectively coupled to the corresponding local IO line pair group LIOs.

Word line group WLs is disposed in common to memory cell blocks MCB arranged in alignment in the row direction. In operation, one word line WL of word line group WLs contained in one row block (or the block consisting of the memory cell blocks arranged in alignment in the row direction) is driven to the selected state.

Global IO line pairs GIO0 to GIO127 that extend in the column direction are disposed in regions between the memory cell blocks adjacent to one another in the row direction and a region outside of the memory cell blocks (these regions hereinafter referred to as inter-block regions). Four global IO line pairs are arranged in common to the memory cell blocks aligned in the column direction. Four local IO line pairs LIO are provided to each memory cell block, and a group of the four local IO line pairs LIOs correspondingly provided to each memory cell block MCB in one row block are coupled to the corresponding global IO line pairs via IO switches IOSW, respectively.

Each of global IO line pairs GIO0 to GIO127 transmits complementary signals, is coupled to a data path shown in FIG. 58, and is coupled to logic circuit LG via a write/read circuit within the data path.

Column select lines CSL are arranged extending in the column direction over memory cell array MA in the same interconnection layer as global IO line pairs GIO0 to GIO127. Column select line group CSLs are shared by memory cell blocks MCB disposed in alignment in the column direction. By IO switches IOSW, local IO line pair groups LIOs of a selected row block are coupled to global IO line pairs GIO0 to GIO127, while local IO line pair groups LIOs of non-selected row blocks are disconnected from global IO line pairs GIO0 to GIO127. Thus, four columns are simultaneously selected in each column block (or the block consisting of the memory cell blocks arranged in alignment in the column direction), and four local IO line pairs LIO are respectively coupled to the corresponding global IO line pairs.

In the array arrangement shown in FIG. 59, global IO line pairs GIO0 to GIO127 are coupled to logic circuit LG via the data paths. Therefore, increasing the bus width of data buses DB0 and DB1 between the DRAM macro and the logic circuit means increasing the number of global IO line pairs. In order to increase the number of global IO line pairs, the number of inter-block regions needs to be increased. A global IO line pair is a complementary signal line pair, and the increase in number of inter-block regions results in the increase in the area occupied by the global IO line pairs in a memory cell array and in the increase in the area of the region occupied by transfer gates connecting global IO line pairs GIO and local IO line pair LIO, which leads to a greater chip area.

FIG. 60 is a schematic representation of another conventional DRAM built-in system LSI. The arrangement shown in FIG. 60 is presented, for instance, by Yabe et al. in Digest of Technical Papers, 1999 IEEE ISSCC, on pp. 72 to 73 and p. 415.

In the DRAM built-in system LSI shown in FIG. 60, row decoders XD0 and XD1 as well as column decoders YX0 and YX1 are disposed in the region between memory arrays MA0 and MA1. Thus, row decoders and column decoders are provided within the same region.

The column decoders are not disposed between memory arrays MA0 and MA1 and data paths DP0 and DP1. Control circuit CG is disposed in the region between data paths DP0 and DP1.

FIG. 61 is a schematic representation of an arrangement of memory arrays MA0 and MA1 shown in FIG. 60. In FIG. 61, memory array MA (MA0, MA1) includes memory cell blocks MCB arranged in alignment both in the row direction and in the column direction. A sense amplifier band SAB including sense amplifier circuits is arranged corresponding to these memory cell blocks MCB. A column select line group CSLG extending in the row direction is arranged in the region of sense amplifier band SAB. A column select line group CSLG includes 8-bit column select lines CSLAi to CSLA(i+7) or CSLBi to CSLB(i+7). A word line group WLG is provided in parallel to these column select line groups CSLG. Word line group WLG includes 512 word lines WLAj to WLA(j+511) or WLBj to WLB(j+511). Here, i=8N and j=512N, and N is 0 or a natural number. 32-bit IO line group IOG extending in the column direction is provided over memory cell blocks MCB aligned in the column direction. For each column block, one spare IO data line pair SIO is provided in parallel to IO data line pair group IOG. Since a row block includes four memory cell blocks MCB, four spare 10 data line pairs SIO0 to SIO3 are provided.

In FIG. 61, the column select lines are divided into two groups of column select lines CSLA0 to CSLA71 and CSLB0 to CSLB71, because two word lines may be simultaneously driven to the selected state in this memory array, and the data of a memory cell connected to one of these two word lines is to be read. Therefore, the sense amplifier band through which column select lines CSLA64 to CSLA71 pass and the sense amplifier band through which column select lines CSLB0 to CSLB7 pass are separately provided so as to allow one word line from word lines WLA3584 to WLA4095 and one word line from word lines WLB0 to WLB511 to be simultaneously driven to the selected state.

In the arrangement shown in FIG. 61, 16 sense amplifiers per memory cell block MCB are coupled via column select gates to the respective IO data line pairs IO0 to IO127. One column select gate (per IO) is rendered conductive by a column select line. Since the column select gate is coupled to an IO data line pair, an IO switch for connecting a local IO line pair and a global IO line pair is not required. In addition, column select lines are disposed orthogonal to IO data line pairs, and the IO data line pairs are arranged extending over the memory cell array, so that there is no need to provide an interconnection region specially for the IO data line pairs, and the chip area can be reduced.

FIG. 62 is a schematic diagram representing an arrangement of a sense amplifier band for one memory cell block MCB. FIG. 62 shows a memory cell block to which column select lines CSLA0 to CSLA15 are provided. For one IO data line pair IO, eight sense amplifier circuits SA are disposed in one sense amplifier band. Each sense amplifier circuit SA is connected to a corresponding IO data line pair via a column select gate YG. While IO data line pairs IO0 and IO1 are shown in FIG. 62, 32-bit IO data line pairs IO0 to I031 are provided to memory cell block MCB. For the 32-bit IO data line pairs, one spare IO data line pair SIO is provided. Eight spare sense amplifier circuits are also disposed in one sense amplifier band for the spare IO data line pair SIO.

When one of column select lines CSLA0 to CSLA7 is driven to the selected state, one sense amplifier circuit is selected from a set of eight sense amplifier circuits as a unit, and the selected sense amplifier circuit is coupled to a corresponding IO data line pair via column select gate YG. Two sense amplifier bands are provided to a memory cell block. Since one of 16 column select lines CSLA0 to CSLA15 is driven to the selected state, 16 sense amplifier circuits are correspondingly provided to one IO data line pair. The same is true for the spare sense amplifier circuits. Thus, 32 columns out of 512 columns are simultaneously selected and connected to the corresponding IO data line pairs in memory cell block MCB by the column select lines. Defective bits repair for an IO data line pair is effected by replacing a set of 16 sense amplifier circuits with a set of 16 spare sense amplifier circuits.

Column select lines CSLA0 to CSLA15 each select the normal sense amplifier circuit and the spare sense amplifier circuit at the same time as shown in FIG. 62, and the data from the normal sense amplifier circuit and the data held by the spare sense amplifier circuit are simultaneously transferred to IO data line pairs and the spare IO data line pair.

As shown in FIG. 62, since a sense amplifier circuit is coupled to an IO data line pair via column select gate YG, the region for disposing transfer gates is no longer necessary. Moreover, since IO data line pairs IO are disposed extending over the memory cell array in the column direction, an increase in the number of IO data line pairs does not in any way require an increase in the area occupied by IO data line pairs.

FIG. 63 is a schematic diagram representing an arrangement of a data path of the DRAM macro shown in FIG. 60. FIG. 63 shows an arrangement of a 32-bit data path, i. e. an arrangement corresponding to one column block.

The data path includes preamplifiers PA0 to PA31, write drivers WDV0 to WDV31, and a spare preamplifier SPA and a spare write driver SWDV provided corresponding to spare IO data line pair SIO.

Preamplifiers PA0 to PA31 and spare preamplifier SPA amplify and output the data on IO data line pairs IO0 to I031 and spare IO data line pair SIO.

Write drivers WDV0 to WDV31 and spare write driver SWDV are activated according to a write driver enable signal WDE to drive the corresponding IO data line pairs IO0 to IO31 and spare IO data line pair SIO according to the received write data.

Write data mask signals /DM0 to /DM3 inhibiting a data write are also provided to write drivers WDV0 to WDV31. Each of these write data mask signals /DM0 to /DM3 inhibits writing of 8 bits of data as a unit. When data mask signals /DM0 to /DM3 and /DMS are activated instructing that the data write is to be masked, the corresponding write drivers attain the output high impedance state.

Preamplifiers PA0 to PA31, spare preamplifier SPA, write drivers WDV0 to WDV31, and a spare write driver SWDV each include a circuit for equalizing the corresponding data line pair according to an IO equalizing instruction signal IOEQ.

The data path further includes a column redundancy control circuit CRC for determining, according to row block address signals RBA0 to RBA3 designating a row block in the selected state, whether a defective column is addressed in a normal memory cell array, and according to the determination result, outputting selecting signals SIOSEL0 to SIOSEL31 designating an IO data line pair to be replaced by spare IO data line pair, and for generating signals SDMSEL0 to SDMSEL3 signaling whether to mask the spare memory cell data according to a data mask signal during a data write; 2:1 multiplexers MUX0 to MUX31 for selecting, according to selecting signals SIOSEL0 to SIOSEL31, one of the signals output from the corresponding preamplifiers PA0 to PA31 and spare preamplifier SPA; read data latches RDL0 to RDL31 provided corresponding to the respective 2:1 multiplexers MUX0 to MUX31 for taking in and outputting output signals RDF0 to RDF31 of multiplexers MUX0 to MUX31 in synchronization with a clock signal CLK; and output buffers QB0 to QB31 provided corresponding to the respective read data latches RDL0 to RDL31 for taking in output data RD0 to RD31 of read data latches RDL0 to RDL31 in synchronization with clock signal CLK to be output as output data Q0 to Q31.

Read data latches RDL0 to RDL31 take in the received data at the fall of clock signal CLK and attain the latching state at the rise of clock signal CLK. Output buffers QB0 to QB31 take in and output the output data of read data latches RDL0 to RDL31 in response to the rise of clock signal CLK.

The data path further includes input buffers DB0 to DB31 provided corresponding to the respective write data D0 to D31 from outside for taking in the received write data in synchronization with clock signal CLK; 32:1 spare multiplexer SMUX for selecting, according to spare IO selecting signal SIOSEL0 to SIOSEL31 from column redundancy control circuit CRC, one of internal write data WD0 to WD31 output from input buffers DB0 to DB31; write data latches WDL0 to WDL31 for taking in internal write data WD0 to WD31 from input buffers DB0 to DB31 in response to write driver enable signal WDE; a spare write data latch SWDL for taking in and outputting internal write data WDS from spare multiplexer SMUX in response to write driver enable signal WDE; write drivers WDV0 to WDV31 for driving IO data line pairs IO0 to IO31 according to output data WDD0 to WDD31 from write data latches WDL0 to WDL31 when activated in response to the activation of write driver enable signal WDE; and a spare write driver SWDV for driving spare IO data line pair SIO according to write data WDDS from spare write data latch SWDL when activated in response to write driver enable signal WDE. Write drivers WDV0 to WDV31 and spare write driver SWDV are set to the output high impedance state during the deactivation of write driver enable signal WDE.

The operation of a data path shown in FIG. 63 will be described with reference to the timing chart shown in FIG. 64. In the following description, a DRAM macro has a multi-bank arrangement.

At the rising edge of clock signal CLK at time T0 or time T1, write command WRITE instructing a data write is taken in along with a column bank address CBK indicating the bank to which a column access is made. At the same time, a column address signal indicating the selected column (not shown) is also taken in. An internal circuit, not shown, stores row block address signals RBA0 to RBA3 indicating a row block in the active state, and applies the stored row block address signals RBA0 to RBA3 to column redundancy control circuit CRC when write command WRITE is provided. An address indicating the IO data line pair to which a defective memory cell is connected for each row block is programmed in column redundancy control circuit CRC. An address signal indicating a defective IO data line pair of the row block is decoded according to row block address signals RBA0 to RBA3 to generate spare IO selecting signals SIOSEL0 to SIOSEL31.

On the other hand, before the result of spare determination becomes definite, input buffers DB0 to DB31 are activated, take in write data D0 to D31 from outside, and generate internal write data WD0 to WD31 that are latched into write data latches WDL0 to WDL31. Spare multiplexer SMUX selects one of the output data from input buffers DB0 to DB31 according to spare IO selecting signals SIOSEL0 to SIOSEL31 from column redundancy control circuit CRC and applies the selected output data to spare write data latch SWDL.

After the output data of write data latches WDL0 to WDL31 and spare write data latch SWDL are made definite, write driver enable signal WDE is driven to the active state or the logic high or "H" level, and IO equalizing instruction signal IOEQ attains the inactive state or the logic low or "L" level. Responsively, the precharging/equalizing operation of IO data line pairs IO0 to IO31 and spare IO data line pair SIO is completed, and write data is transmitted to these data line pairs IO0 to IO31 and SIO.

Moreover, at this time, a column decoder (not shown) performs a column select operation, and a column select line CSL corresponding to the addressed column is driven to the selected state or the "H" level. Consequently, data are written into memory cells via IO data line pairs IO0 to IO31 and spare IO data line pair SIO.

When data writing is performed sufficiently, column select line CSL is deactivated, and thereafter, the deactivation of write driver enable signal WDE as well as the activation of IO equalizing instruction signal IOEQ causes IO data line pairs IO0 to IO31 and spare IO data line pair SIO to be equalized and precharged to the power supply voltage level again.

When a read command READ instructing a data read is provided at time T2 or T3, a column bank address CBK and a column address signal (not shown) are taken in at the rising edge of clock signal CLK, as in the data write operation. Row block address signals RBA0 to RBA3 are applied to column redundancy control circuit CRC as in the data write operation according to read command READ and column bank address CBK, and column redundancy control circuit CRC drives one of spare IO line selecting signals SIOSEL0 to SIOSEL31 to the selected state. Along with the spare determination operation in column redundancy control circuit CRC, equalizing signal IOEQ is deactivated, and the equalizing operation for IO data line pairs IO0 to IO31 and spare IO data line pair SIO is completed. When the column decoder drives column select line CSL to the selected state, memory cell data is read out to these IO data line pairs IO0 to IO31 and spare IO data line pair SIO.

After the potentials of IO data line pairs IO0 to IO31 and spare IO data line pair SIO have changed sufficiently to reach the voltage levels sufficient for amplification by preamplifiers PA0 to PA31 and spare preamplifier SPA, a preamplifier activating signal PAE is activated and preamplifiers PA0 to PA31 and spare preamplifier SPA amplify and latch the signals on these IO data line pairs IO0 to IO31 and spare IO data line pair SIO. Preamplifiers PA0 to PA31 and spare preamplifier SPA each include flip-flop, and maintain and output valid data even after the deactivation of preamplifier activating signal PAE.

When outputs PAO0 to PAO31 and PAOS of preamplifiers PA0 to PA31 and spare preamplifier SPA become definite, preamplifier activating signal PAE is deactivated, and column select signal line CSL is also driven to the inactive state. On the other hand, equalizing signal IOEQ is activated, and IO data line pairs are precharged and equalized to a prescribed power supply voltage level again.

2:1 multiplexers MUX0 to MUX31 perform the selecting operation according to spare IO selecting signals SIOSEL0 to SIOSEL31 from column redundancy control circuit CRC, and one of the output signals PAO0 to PAO31 of preamplifiers PA0 to PA31 is replaced by an output signal PAOS from spare preamplifier SPA when a defective memory cell is addressed.

Thereafter, read data latches RDL0 to RDL31 latch output signals RDF0 to RDF31 of multiplexers MUX0 to MUX31 in response to the rise of clock signal CLK. Output buffers QB0 to QB31 take in data RD0 to RD31 from read data latches RDL0 to RDL31 in synchronization with the clock signal and output the output data Q0 to Q31 to logic circuit LG.

The arrangement where column select lines CSL (CSLA0 to CSLA71 and CSLB0 to CSLB71) are disposed in parallel to the word lines in a sense amplifier band accompanies a column redundant arrangement for one IO data line pair, i.e. it has an arrangement of replacing the IO data line pair with a spare IO data line pair. During a data write, after the spare determination is performed, the IO data line pairs are driven by write driver WDV0 to WDV31 and spare write driver SWDV. Conversely, in a read operation mode during which a data read is performed, column select line CSL is first driven to the selected state and the IO data line pairs are driven by sense amplifier circuits. Then, according to the result of spare determination, the replacement of IO data line pairs is carried out. The timing at which the result of spare determination is made definite is the same for a data write mode and for read mode, and in the data write mode, column select line CSL is driven to the selected state at a timing later than that in the read operation mode during which data read is performed. Therefore, when the read operation is performed in the cycle following the write operation, as shown in FIG. 64, the equalizing time $\Delta Teq(wr)$ for an IO data line pair becomes shorter than the equalizing time $\Delta Teq(rr)$ when a data read is performed in the cycle following the read operation.

When the cycle time is made shorter, the data read would be performed before IO data line pairs IO0 to IO31 and spare IO data line pair SIO are sufficiently precharged and equalized, so that amplification by a preamplifier cannot be accurately performed, resulting in the so-called "write recovery" problem. Thus, the cycle time could not be shortened to implement a high-speed operation.

The equalizing time $\Delta Teq(wr)$ may be ensured by delaying the timing at which column select line CSL is activated in the data read operation mode. In this case, however, the activation of preamplifier activating signal PAE is delayed accordingly, and thus, the timing of output data RDF0 to RDF31 of multiplexers MUX0 to MUX31 becoming definite is also delayed. Consequently, read data latches RDL0 to RDL31, in response to the rise of clock signal CLK, have entered the latched state so that there is no margin for the set-up time $\Delta Ts$ of input signals RDF0 to RDF31 to read data latches RDL0 to RDL31 relative to clock signal CLK, and an accurate reading of data cannot be ensured.

As seen from the above, when performing data write and data read into/from a memory cell using a common IO data line in a conventional DRAM macro, the cycle time cannot be made shorter due to the so-called "write recovery" problem. In order to perform data read operation a column latency of CL=2, the frequency of clock signal CLK needs to be lowered, so that a high-speed operation could not be performed.

In general, in a logic-merged DRAM, data bit widths differ according to the uses. From the viewpoint of the production cost, it is preferable to form common parts for DRAM macros of various data bit widths, and to change the arrangement of the input/output circuits according to the data bit widths. Therefore, in this case, the same numbers of write drivers and input buffers are provided regardless of the data bit width. The number of input buffers actually used are changed according to the data bit width, and write drivers are selectively coupled to the input buffers being used.

FIG. 65 is a schematic representation of an arrangement of a data write portion of a DRAM macro shown in FIG. 63 where the data bit width is reduced to one-fourth of its original width. In FIG. 65, input buffers DB0 to DB7 are provided for write data bits D0 to D7, respectively. Write drivers WDV0 to WDV31 of 32 bits are provided corresponding to input buffers, where four write drivers as a unit correspond to one input buffer. In addition, input buffer DB0 is coupled to write drivers WDV0 to WDV3, and input buffer DB7 is coupled to write drivers WDV28 to WDV31. These write drivers WDV0 to WDV31 are coupled to IO data line pairs IO0 to IO31, respectively.

Write drivers WDV0, WDV4, . . . WDV28 are activated in response to a write driver enable signal WDE0. Write drivers WDV3, WDV7, . . . WDV31 are activated in response to a write driver enable signal WDE3. A write data mask instruction signal /DM0 is applied to write drivers WDV0 to WDV7. A write data mask instruction signal /DM3 is applied to write drivers WDV24 to WDV31.

Thus, each of write data mask instruction signals /DM0 to /DM3 masks the write data on corresponding eight IO data line pairs as a unit. A data write operation is considered under this condition. Now, consider the situation in which write driver enable signal WDE0 is rendered active and write drivers WDV0, WDV (4k), . . . WDV28 are rendered active. Now, assume that write data mask instruction signals /DM0 to /DM3 are all rendered inactive, and a data write operation is performed.

IO data line pairs IO0 to IO31 are coupled to sense amplifier circuits (S.A) SA0 to SA31 via selected column select gates CSG0 to CSG31, respectively.

Non-selected write drivers are in the output high impedance state. In this case, write drivers WDV0, . . . , WDV (4k), . . . WDV28 transfer data corresponding to write data bits D0 to D7 to sense amplifiers SA0, SA (4k), . . . SA28. On the other hand, IO data line pairs excluding the IO data line pairs IO0, . . . , IO (4k), . . . IO28 are precharged to a power-supply voltage Vcc level (see FIG. 64). Therefore, in this case, a corresponding column select gate CSG is in the conductive state according to a column select signal CSL, and a non-selected sense amplifier circuit (S.A) receives this precharge voltage Vcc so that the latch data of the non-selected sense amplifier circuit (S.A) may possibly become inverted.

Thus, with the conventional arrangement in which a write driver is set to the inactive state according to a data write mask instruction signal, an internal data write circuit that accommodates different data bit widths cannot be implemented. Moreover, common chips cannot be used to adapt to the different data bit widths so that each chip will need to be designed individually according to the data bit width, which leads to a problem of higher production cost.

SUMMARY OF THE INVENTION

An object of the present invention is to provide a logic-merging DRAM operable in synchronization with a high-speed clock signal.

Another object of the present invention is to provide a logic-merging DRAM capable of performing a data write at a high speed.

A still another object of the present invention is to provide a logic-merging DRAM having a write data masking function that allows an accurate data write masking irrespective of the data bit width.

A still further object of the present invention is to provide a semiconductor memory device having a write data masking function that can accommodate different data bit widths with common chips.

The semiconductor memory device according to a first aspect includes a memory array having normal memory cells arranged in a matrix of rows and columns and spare memory cells for replacing defective normal memory cells among these normal memory cells arranged in a matrix of rows and columns; a defective address program circuit for storing the address of a defective normal memory cell; and a spare determination circuit for determining a match/mismatch between a provided address signal and the defective address from the defective address program circuit. The timing at which the spare determination circuit outputs the result of determination differs in the data write mode and in the data read mode.

The semiconductor memory device according to a second aspect of the invention includes a plurality of memory cells arranged in a matrix of rows and columns, and a plurality of sense amplifier circuits disposed corresponding to a row of memory cells and each for sensing and amplifying data of a memory cell of a corresponding column. The plurality of sense amplifier circuits are divided into a plurality of sense amplifier units, each of the units including a prescribed number of sense amplifier circuits.

The semiconductor memory device according to the second aspect further includes a plurality of internal data lines, a plurality of column select units provided corresponding to the plurality of sense amplifier units and each selecting one sense amplifier circuit from a corresponding sense amplifier unit in response to a column select signal; a plurality of write mask circuits each provided corresponding to a sense block including a predetermined number of sense amplifier units, and each for inhibiting connection between a sense amplifier circuit of a corresponding sense block and a corresponding internal data line in response to a corresponding data mask instruction signal; and a plurality of write drivers provided corresponding to the plurality of internal write data lines for transmitting internal write data to corresponding internal data lines when activated. The plurality of write drivers are divided into a plurality of write driver blocks corresponding to the write mask circuits.

The semiconductor memory device according to the second aspect further includes a plurality of mask gate circuits provided corresponding to the plurality of write mask circuits for providing data mask instruction signals to corresponding write mask circuits in response to a data mask instruction signal. Each mask gate circuit includes a gate circuit for activating a corresponding data mask instruction signal to inhibit a corresponding write mask circuit from being conductive when a corresponding write driver block is inactive.

By varying the timing at which the result of determination is outputted in the data write mode and in the data read mode, the timing for a column select can be optimized for both a data write and a data read, thereby achieving a high-speed access.

In particular, by providing a read data bus and a write data bus separately, the read data and the write data are kept from colliding with one another on the data bus, so that the so-called "write recovery" problem does not occur, and the cycle time can be made shorter.

Write drivers are divided into blocks corresponding to the respective write mask circuits, and a write mask circuit inhibits the connection between a sense amplifier circuit and an internal data line. As a result, when a write driver block is in the inactive state, the corresponding write mask circuit is activated and inhibits a data write operation so that the data held by a sense amplifier circuit is kept from being changed, and an accurate data write operation can be performed even when the input data bit width is changed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 57 is a schematic representation of another arrangement of a data write/read circuit portion of the seventh embodiment of the present invention;

DESCRIPTION OF THE PREFERRED EMBODIMENTS

First Embodiment

Figure 1:
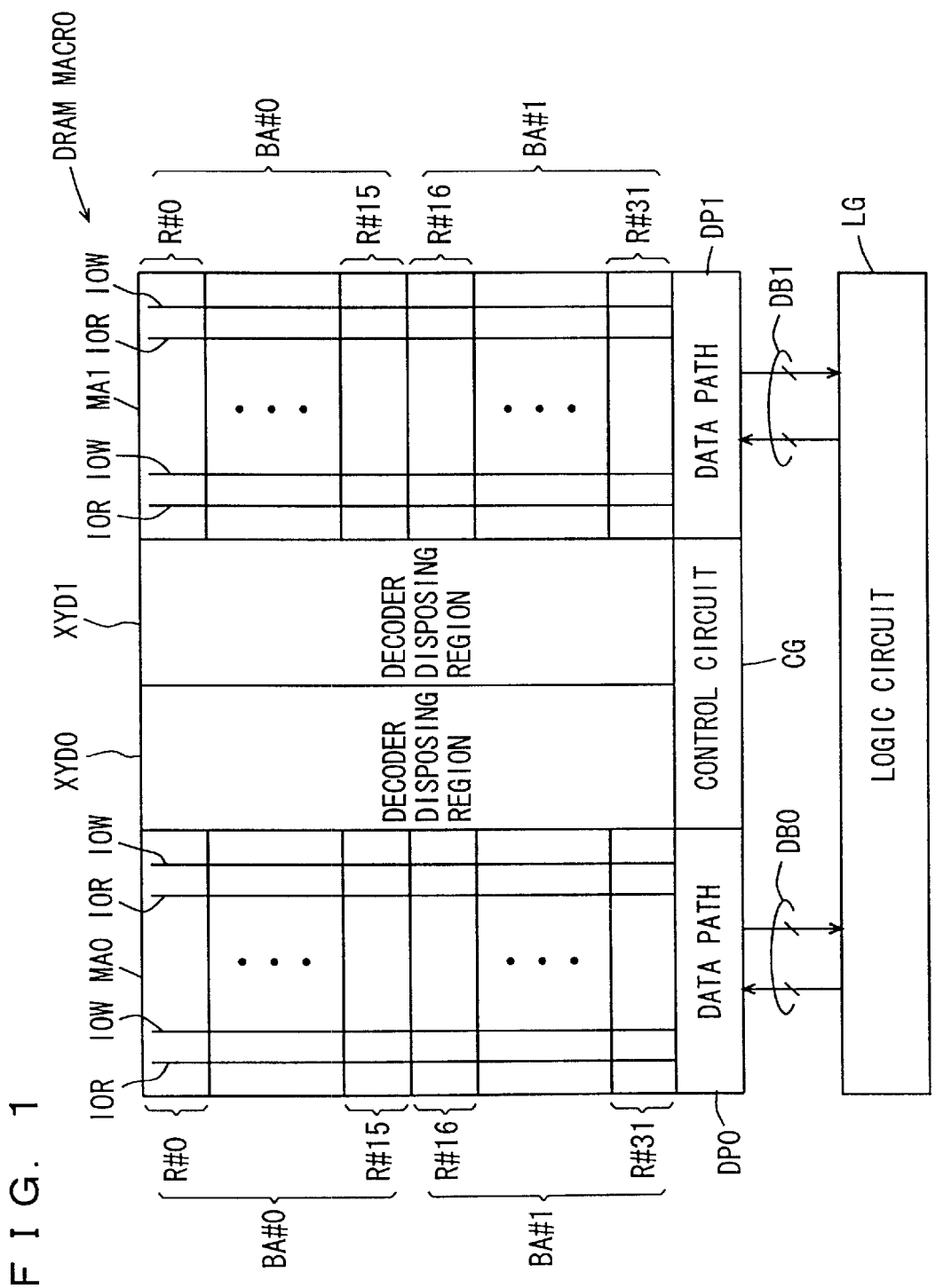
FIG. 1 is a schematic representation of an overall arrangement of a DRAM built-in system LSI according to the present invention.

FIG. 1 is a schematic representation of an overall arrangement of a DRAM built-in system LSI according to the present invention. As seen in FIG. 1, the DRAM built-in system LSI includes a logic circuit LG, and a DRAM macro for storing data for logic circuit LG. The DRAM macro includes two memory cell arrays MA0 and MA1, each divided into 32 row blocks R#0 to R#31. Row blocks R#0 to R#15 of memory cell arrays MA0 and MA1 form a bank BA#0, and row blocks R#16 to R#31 of memory cell arrays MA0 and MA1 form a bank BA#1.

A read data line pair IOR for transmitting data from a selected memory cell and a write data line pair IOW for transmitting write data to a selected memory cell are disposed extending in the column direction over memory cell arrays MA0 and MA1. Read data line pair IOR and write data line pair IOW are coupled to data paths DP0 and DP1 provided to memory cell arrays MA0 and MA1, respectively. Data paths DP0 and DP1 are coupled to logic circuit LG via data buses DB0 and DB1, respectively. Data buses DB0 and DB1 also transmit write data and read data via separate buses.

A decoder disposing region XYD0 for disposing a decoder for memory cell array MA0 as well as a decoder disposing region XYD1 for memory cell array MA1 is provided between memory cell arrays MA0 and MA1. Decoder disposing regions XYD0 and XYD1 include a row decoder provided corresponding to each of the row blocks, for selecting a memory cell row in the corresponding row block, a read column decoder provided corresponding to each row block for selecting a column to perform a data read of the corresponding row block, and a write column decoder provided corresponding to each row block for selecting a memory cell column to perform a data write of the corresponding row block.

A control circuit CG for controlling the memory cell selecting operation is provided in the region between data paths DP0 and DP1.

As shown in FIG. 1, by providing read data line pair IOR that transmits read data and write data line pair IOW that transmits write data separately, data can be read on read data line pair IOR before the voltage level of write data line pair IOW recovers to the precharged state, and thus the cycle time can be shortened. Moreover, logic circuit LG, for instance, includes a product-sum operation circuit that performs product-sum operation of data transmitted through data buses DB0 and DB1.

Figure 2:
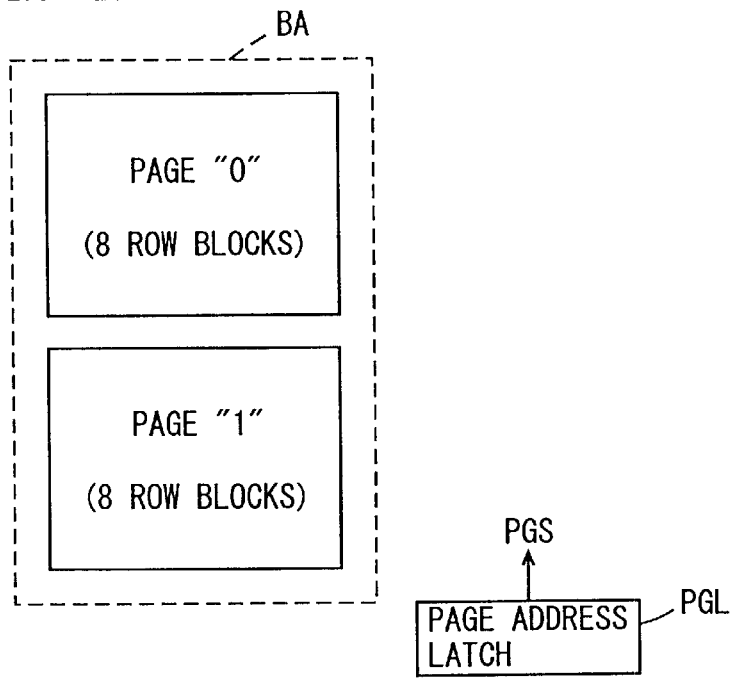
FIG. 2 is a schematic representation of a bank arrangement of a DRAM macro shown in FIG. 1.

FIG. 2 is a schematic representation of an arrangement of one bank BA in one memory cell array in the DRAM macro shown in FIG. 1. In FIG. 2, bank BA includes pages "0" and "1," each consisting of eight row blocks. In pages "0" and "1," respectively, word lines are simultaneously driven to the selected state. In column access, a page address is provided to a page address latch PGL, and according to a page selecting signal PGS from page address latch PGL, one of pages "0" and "1" is selected. Driving two word lines simultaneously to the selected state reduces the overhead in a page switching in a bank.

Figure 3:
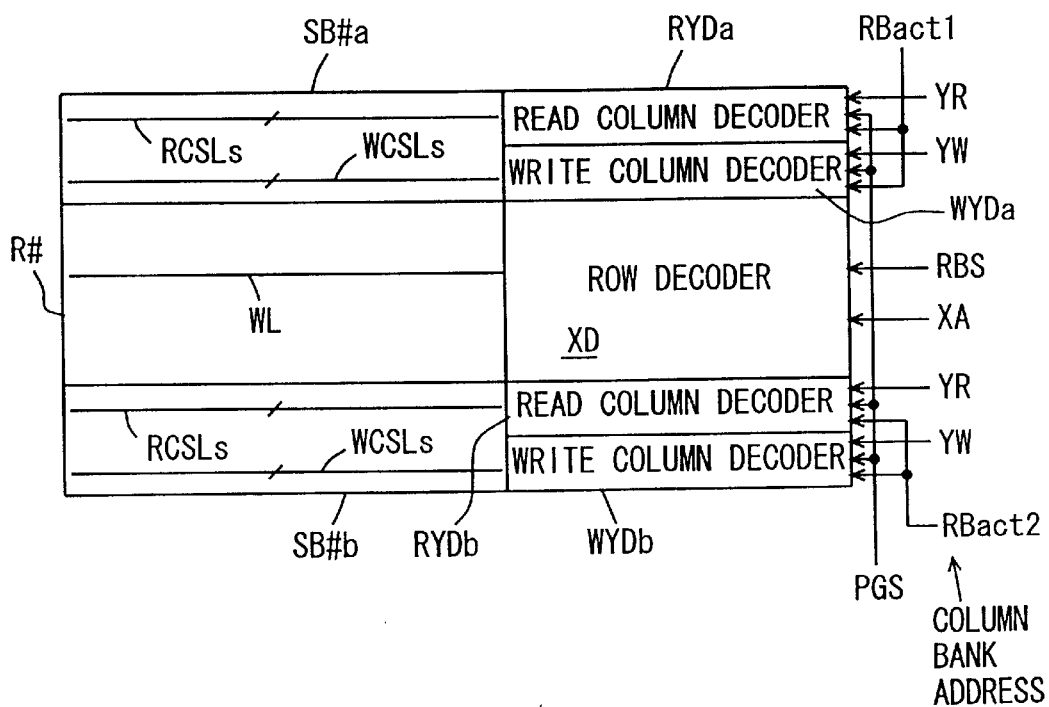
FIG. 3 is a schematic representation of an arrangement of a portion relating to a row block in the DRAM macro shown in FIG. 1.

FIG. 3 is a schematic representation of an arrangement of a portion related to one row block. A word line WL is disposed extending in the row direction in this row block R#. Sense amplifier bands SB#a and SB#b are arranged on two sides of row block R#. Within a page, sense amplifier bands SB#a and SB#b each are shared by the row blocks adjacent to one another in the column direction. As for the row block at a page boundary, sense amplifier bands are separately provided for the respective row blocks in the boundary region.

A read column select line group RCSLs and a write column select line group WCSLs are arranged in parallel with word line WL in sense amplifier bands SB#a and SB#b.

A read column decoder RYDa is provided for sense amplifier band SB#a and a read column decoder RYDb is provided for sense amplifier band SB#b in order to select a read column select line from read column select line group RCSLs. Write column decoders WYDa and WYDb are provided corresponding to sense amplifier bands SB#a and SB#b in order to select a write column select line from write column select line group WCSLs.

Read column decoders RYDa and RYDb receive a read column address signal YR, page selecting signal PGS, and row block activating instruction signals RBact1 and RBact2 to perform a decoding operation. Write column decoders WYDa and WYDb perform a decoding operation according to a write column address signal YW, page selecting signal PGS, and row block activating instruction signals RBact1 and RBact2. Row block activating instruction signals RBact1 and RBact2 instructs that one of row block R# and the row block adjacent to and above (or below) row block R# is in the active state, and that one word line WL in either of the row blocks is maintained at the selected state so that sense amplifier band SB#a (or SB#b) is in the active state.

A row decoder XD that receives a row block designating signal RBS and an X address signal XA is provided for selecting word line WL. Row block designating signal RBS is generated from a row block address signal and a bank address signal. Row decoder XD has internally a latch circuit, and maintains the selected state of word line WL until a precharge instruction signal is provided, even after row block designating signal RBS is driven to the non-selected state. The decoders shown in FIG. 3 are arranged corresponding to each row block in decoder disposing regions XYD0 and XYD1 shown in FIG. 1.

Row block activating instruction signal RBact1 is activated by a row block designating signal RBS indicating row block R# shown in FIG. 3 and by row block designating signal RBS for the row block adjacent to and above row block R#. Row block activating instruction signal RBact2 is generated based on row block designating signals for row block R# and the row block adjacent to and below row block R#. Row block designating signal RBS is driven to the active state in a row access (or upon application of an active command). Thus, column decoders are respectively provided for sense amplifier bands SB#a and SB#b, and the column decoder is activated depending on whether or not the row block sharing the corresponding sense amplifier band is in the active state.

Though not specifically shown in FIG. 3, the column decoder is arranged such that the column decoder is activated according to a column bank address provided in a column access, so that a column select operation is performed.

Moreover, in FIG. 2, pages of one bank BA are shown being divided into an upper half block and a lower half block. Pages "0" and "1" may, however, be arranged alternately by row-by-row block basis. In such a case, two word lines per page is driven to the selected state. From the logical product of a page address signal (an address signal that corresponds to a page designating signal PGS) and a row block designating signal, the active state of a corresponding sense amplifier band is detected. When the corresponding sense amplifier band is in the active state, the column decoder is activated, and the column select line is driven to the selected state according to the column select signal. Even in this case, the column select operation can be activated for the column decoder provided for each sense amplifier band depending on whether the corresponding sense amplifier band is in the active state.

Figure 4:
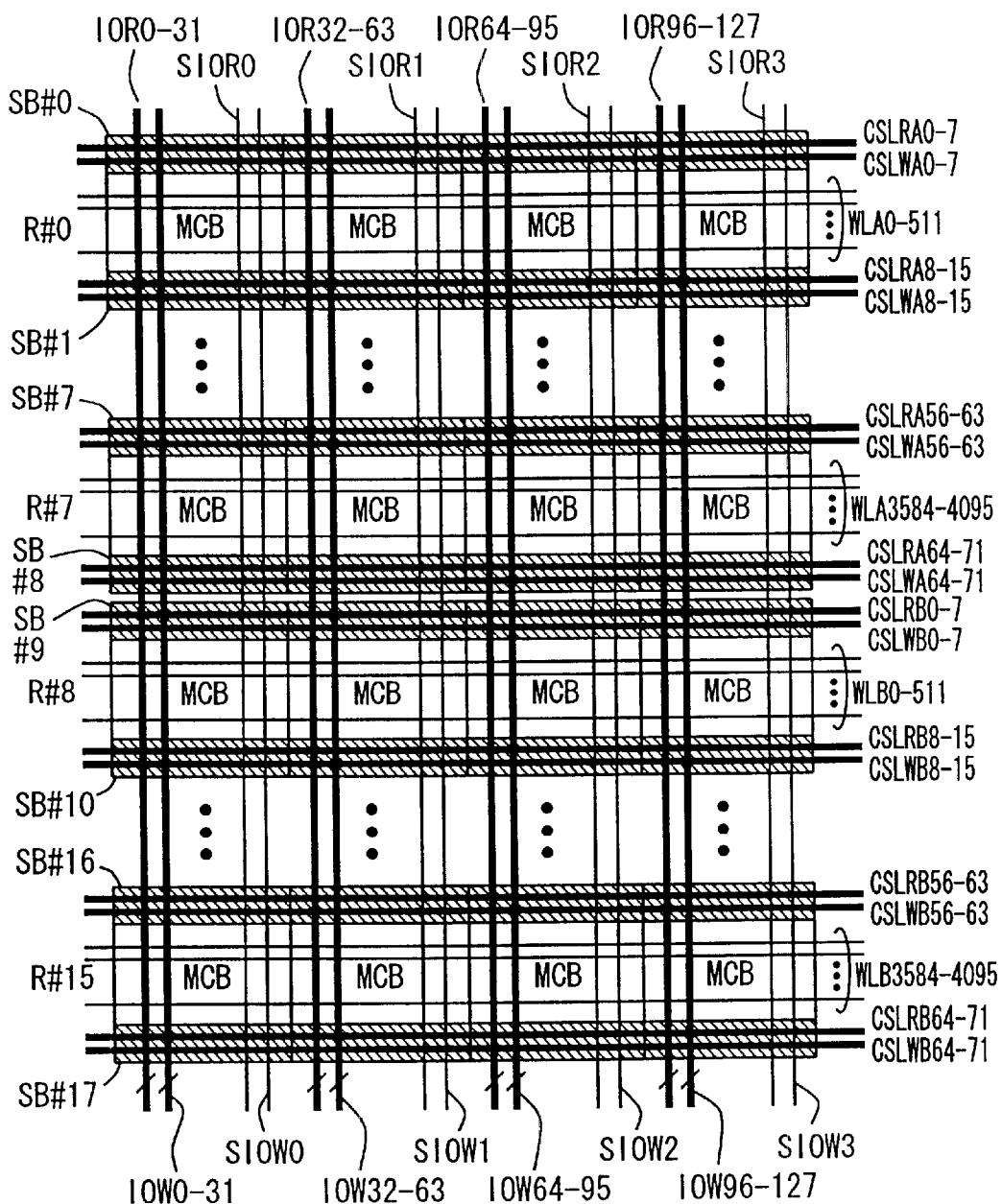
FIG. 4 is a schematic representation of an arrangement of an array portion in the DRAM macro shown in FIG. 1.

FIG. 4 is a schematic representation of an arrangement of one memory array MA. Sixteen row blocks R#0 to R#15 contained in one bank are shown in FIG. 4. Sense amplifier bands SB# are disposed on either side of row blocks R#0 to R#15 in the column direction. At the page boundary, sense amplifier bands SB#8 and SB#9 are provided for row blocks R#7 and R#8, respectively. 8-bit read column select lines CSLR and an 8-bit write column select lines CSLW are arranged in each of sense amplifier bands SB#0 to SB#17. A page is provided with 72 read column select lines CSLRA0 to CSLRA71 (or CSLRB0 to CSLRB71) and 72 write column select lines CSLWA0 to CSLWA71 (CSLWB0 to CSLWB71).

512 word lines WLA (or WLB) are disposed for each of row blocks R#0 to R#15.

Read data line pairs IOR0 to IOR127 and write data line pairs IOW0 to IOW127 are arranged extending in the column direction over the memory cell array. For 32-bit data line pairs, one spare read data line pair SIOR and one spare write data line pair SIOW are provided. 32-bit data line pairs IOR and IOW are provided for memory cell blocks MCB aligned in the column direction (column blocks). The data line pairs are replaced in a unit of a column block.

Figure 5:
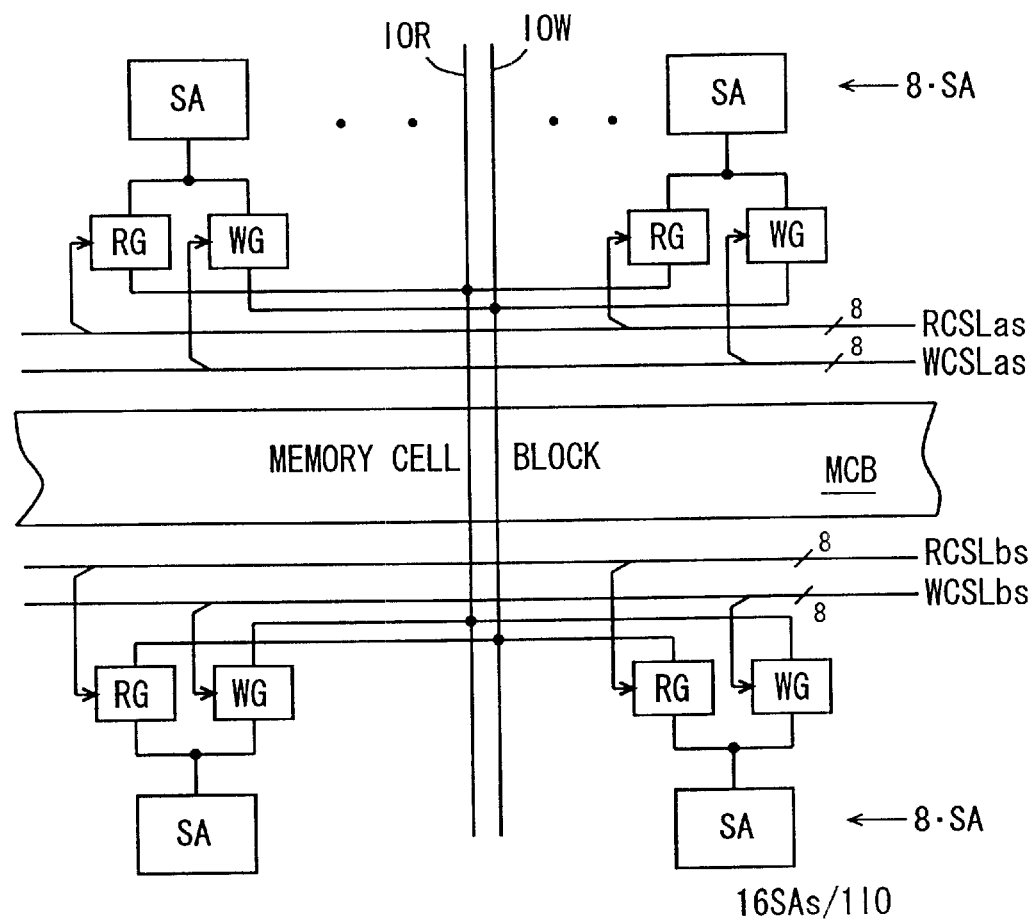
FIG. 5 is a schematic representation of an arrangement of a column select circuit in the DRAM macro shown in FIG. 1.

FIG. 5 is a schematic representation of an arrangement of a portion related to one data line pair. Eight sense amplifier circuits SA are provided above memory cell block MCB and eight other sense amplifier circuits SA are provided below memory cell block MCB for a read data line pair IOR and a write data line pair IOW. For each of these sense amplifier circuits SA, a read gate RG for coupling a corresponding sense amplifier circuit SA to read data line pair IOR and a write gate WG for coupling a corresponding sense amplifier circuit SA to write data line pair IOW are provided.

An 8-bit read column select line group RCSLas and an 8-bit write column select line group WCSLas are arranged above memory block MCB, and an 8-bit read column select line group RCSLbs and an 8-bit write column select line group WCSLbs are arranged below memory block MCB. One of the 16-bit read column select line groups RCSLas and RCSLbs is driven to the selected state (upon access to memory cell block MCB), or one of the 16-bit write column select line groups WCSLas and WCSLbs is driven to the selected state.

Thus, 16 sense amplifier circuits SA are disposed for one read data line pair IOR and one write data line pair IOW. In a similar manner, a spare read data line pair and a spare write data line pair are provided with 16 spare sense amplifier circuits. When there is a defective bit, the replacement is performed in a unit of 16 sense amplifier circuits (replacement of a data line pair).

Figure 6:
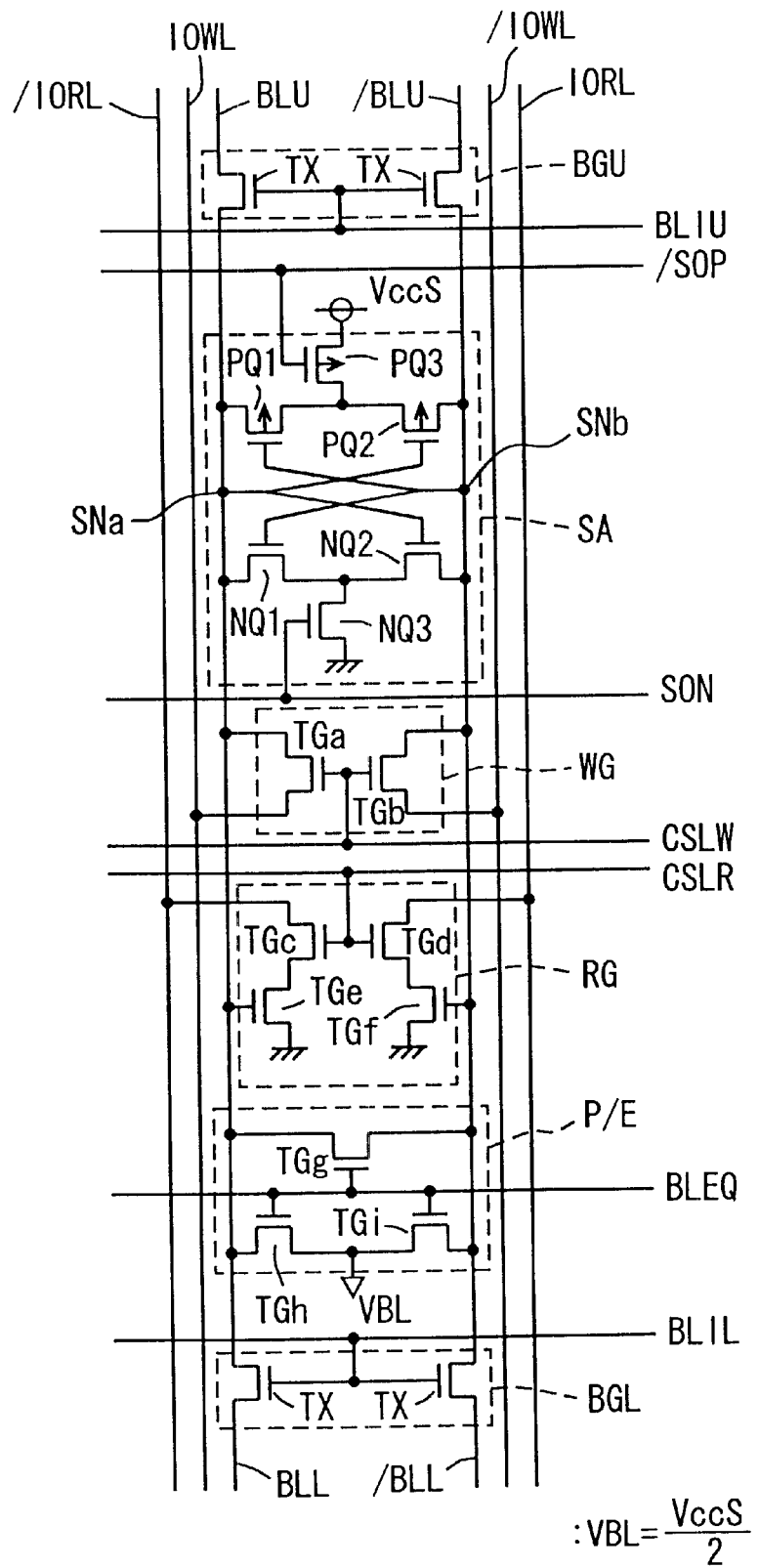
FIG. 6 is a schematic representation of an arrangement of a portion related to a sense amplifier circuit in the DRAM macro shown in FIG. 1.

FIG. 6 is a schematic representation of an arrangement of a sense amplifier band related to one sense amplifier circuit. In FIG. 6, sense amplifier SA is coupled to bit lines BLU and /BLU of the upper memory cell block via a bit line isolating gate BGU, and is also coupled to bit lines BLL and /BLL of the lower memory cell block via a bit line isolating gate BGL. Bit line isolating gates BGU and BGL are rendered conductive according to bit line isolating instruction signals BLIU and BLIL in their standby state, and only the memory cell block containing a selected memory cell is coupled to sense amplifier circuit SA in the active cycle.

Sense amplifier circuit SA includes cross-coupled P-channel MOS transistors PQ1 and PQ2, a P-channel MOS transistor PQ3 for transmitting a sense power supply voltage VccS to the sources of MOS transistors PQ1 and PQ2 in response to activation of a sense amplifier activating signal /SOP, cross-coupled N-channel MOS transistors NQ1 and NQ2, and an N-channel MOS transistor NQ3 rendered conductive in response to activation of a sense amplifier activating signal SON for transmitting the ground voltage to the sources of these MOS transistors NQ1 and NQ2. When activated, sense amplifier circuit SA senses, amplifies, and latches the memory cell data on sense nodes SNa and SNb.

Write gate WG includes transfer gates TGa and TGb rendered conductive in response to a column select signal on write column select line CSLW and electrically couple sense nodes SNa and SNb to write data lines IOWL and /IOWL.

Read gate RG includes N-channel MOS transistors TGe and TGf having their respective gates connected to sense nodes SNa and SNb, and N-channel MOS transistors TGc and TGd rendered conductive according to a signal on read column select line CSLR and electrically couple the drain nodes of these MOS transistors TGe and TGf to read data lines /IORL and IORL. Read gate RG has one of MOS transistors TGe and TGf rendered conductive in response to a signal potential on sense nodes SNa and SNb, and discharges one of read data lines IORL and /IORL toward the ground voltage level.

A precharging/equalizing circuit P/E, activated in response to a bit line equalizing instruction signal BLEQ to precharge and equalize sense nodes SNa and SNb to an intermediate voltage VBL (=VccS/2), is further provided for sense nodes SNa and SNb. Precharging/equalizing circuit P/E includes an N-channel MOS transistor TGg rendered conductive during activation of bit line equalizing instruction signal BLEQ to short-circuit sense nodes SNa and SNb, and N-channel MOS transistors TGh and TGi rendered conductive during activation of bit line equalizing instruction signal BLEQ to transmit intermediate voltage VBL to each of the sense nodes SNa and SNb.

By forming read gate RG with the differential stages formed of MOS transistors TGe and TGf, column select line CSLR can be driven to the selected state prior to completion of the sensing operation of sense amplifier circuit SA, so that a high-speed data read is achieved (since data read operation of read gate RG does not affect the sensing operation of sense amplifier circuit SA).

Figure 7:
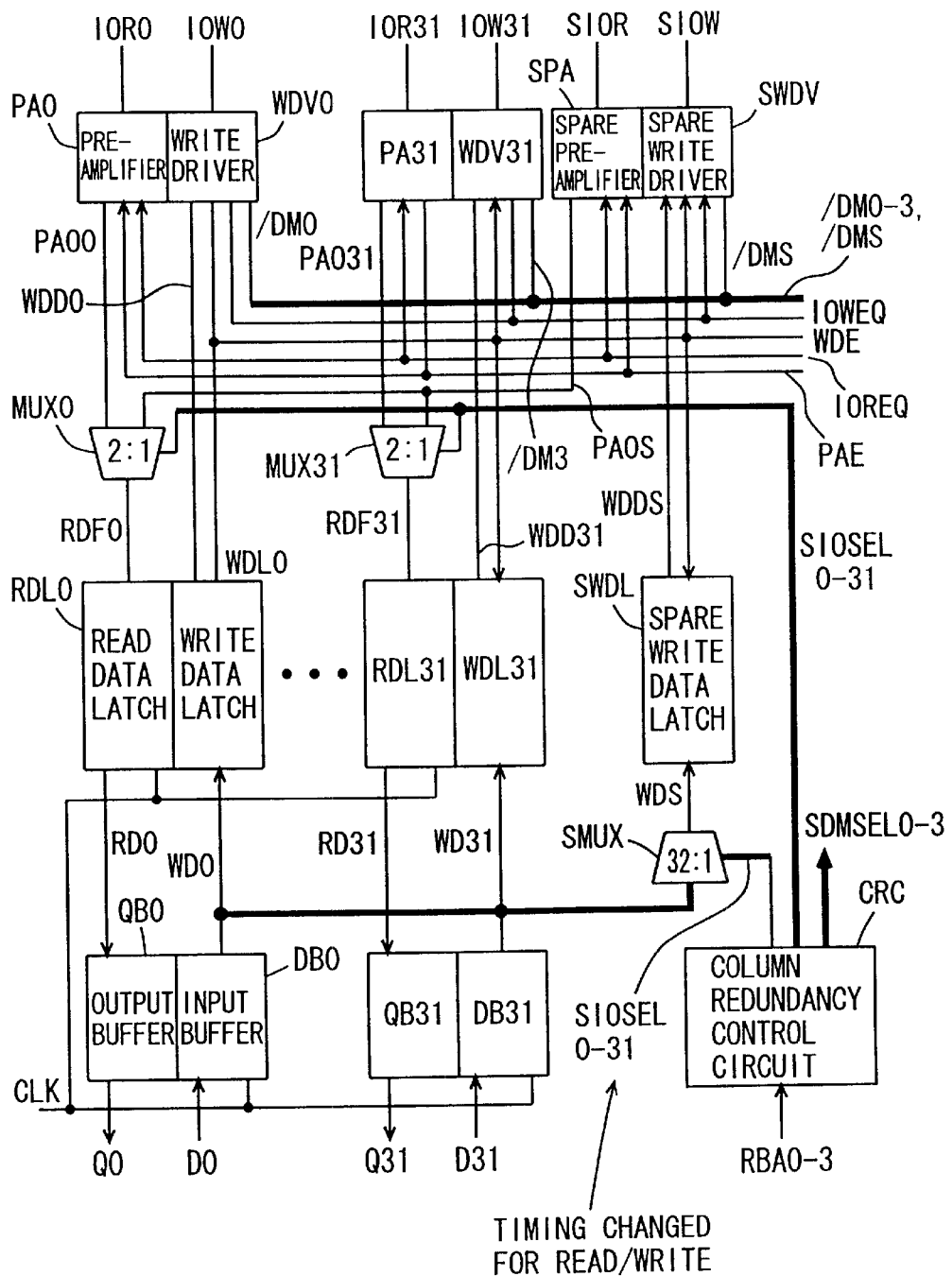
FIG. 7 is a schematic representation of an arrangement of a data path shown in FIG. 1.

FIG. 7 is a schematic representation of an arrangement of a data path that inputs and outputs data of 32 bits.

In FIG. 7, preamplifiers PA0 to PA31 are provided corresponding to the respective read data line pairs IOR0 to IOR31, and write drivers WDV0 to WDV31 are provided corresponding to the respective write data line pairs IOW0 to IOW31. Moreover, a spare preamplifier SPA is provided to a spare read data line pair SIOR, and a spare write driver SWDV is provided to a spare write data line pair SIOW.

Column redundancy control circuit CRC generates a spare data line selecting signal SIOSEL at different timings for a data write and for a data read, and provides spare data line selecting signal SIOSEL to multiplexers MUX0 to MUX31 and SMUX.

A read data line pair equalizing instruction signal IOREQ is provided to preamplifiers PA0 to PA31 and spare preamplifier SPA, and a write data line pair equalizing instruction signal IOWEQ is provided to write drivers WDV0 to WDV31 and spare write driver SWDV. As will be described in detail below, preamplifiers PA0 to PA31, spare preamplifier SPA, write drivers WDV0 to WDV31, and spare write driver SWDV can also function to precharge and equalize the corresponding data line pairs. The read data line pairs are equalized for the following reasons.

Read data line pairs IOR0 to IOR31 and spare read data line pair SIOR are complementary signal line pairs and are small in potential change during a data read. Preamplifiers PA0 to PA31 and spare preamplifier SPA amplify the very small potential difference of the corresponding read data line pair IOR. Therefore, a read data line pair must be brought to an equal potential before a column select line is activated so that accurate potential change that corresponds to the memory cell data may be generated on the read data line pair. In other words, when a preamplifier is activated at a prescribed timing after the column select line is activated, a potential difference already large enough for the amplification operation of the preamplifier needs to be generated on the read data line pair.

On the other hand, equalizing instruction signal IOWEQ is provided to write drivers WDV0 to WDV31 and spare write driver SWDV for the following reasons. Write data line pairs IOW0 to IOW31 and spare write data line pair SIOW are also complementary signal line pairs. In a data write, write mask data /DM0 to /DM3 and /DMS are utilized to mask the data write. If the write data line pair subject to masking the data write was not maintained at an equal potential, even if the write driver is set to the output high impedance state according to write mask data, a potential difference is generated on the complementary write data lines, and the write column select line is activated to couple the corresponding sense amplifier circuit to the write data line pair having the potential difference. The electrical charge flowing from the write data line pair having a large parasitic capacitance may possibly cause the inversion of the data held in the sense amplifier circuit. In order to prevent the inversion, the write data line pair is set at an equal potential prior to a data write operation.

Column redundancy control circuit CRC outputs spare data line selecting signal SIOSEL at different timings for a data write and for a data read so as to difference the timing for outputting the result of spare determination for a data read and for a data write. Thus, during a data write, the result of spare determination is output earlier to advance the activation of the write column select line. On the other hand, in the data read operation mode, the timing at which the result of spare determination is output is delayed so that, after read column select line RCSL is activated at an early timing, and when the output data from the preamplifier becomes definite, the memory cell data is selected according to the result of the spare determination. By allowing an early activation of the write column select line during a data write, the cycle time is shortened.

Multiplexers MUX0 to MUX31 are provided to preamplifiers PA0 to PA31, respectively, and perform the selecting operation according to spare data line selecting signals SIOSEL0 to SIOSEL31 in a read operation. Read data latches RDL0 to RDL31 for taking in and outputting a signal provided in synchronization with clock signal CLK are provided corresponding to multiplexers MUX0 to MUX31. Output buffers QB0 to QB31 for performing data output operation in synchronization with clock signal CLK are provided for read data latches RDL0 to RDL31, respectively.

Input buffers DB0 to DB31 are provided for a write data, and write data latches WDL0 to WDL31 are provided to these input buffers DB0 to DB31, respectively. Moreover, multiplexer SMUX for performing the selecting operation according to spare data line selecting signal SIOSEL from column redundancy control circuit CRC is provided for input buffers DB0 to DB31. Spare write data latch SWDL is provided for multiplexer SMUX.

Write data latches WDL0 to WDL31 and spare write data latch SWDL attain the latching state in response to the activation of write driver enable signal WDE. Now, the operation of the data path shown in FIG. 7 will be described with reference to the timing diagram shown in FIG. 8.

Write command WRITE instructing a data write is provided at time T0 or at time T1. Along with write command WRITE, at the same time, column bank address CBK and a page address for designating a column access bank (to which a column select operation is performed) as well as a column address are provided. According to column bank address CBK and the page address (not shown), row block address signals RBA0 to RBA3 for specifying a row block to be accessed are generated from a circuit (not shown but described later) and are provided to column redundancy control circuit CRC. When write command WRITE is provided, column redundancy control circuit CRC performs a spare determination operation at a relatively early timing, and drives, among spare data line selecting signals SIOSEL 0–3, the spare data line selecting signal indicating a defective write data line pair to the active state.

Input buffers DB0 to DB31 take in the externally provided write data D0 to D31 in synchronization with clock signal CLK and generate internal write data WD0 to WD31. One of internal write data WD0 to WD31 from input buffers DB0 to DB31 is selected by multiplexer SMUX according to spare data line selecting signals SIOSEL0 to SIOSEL31 from column redundancy control circuit CRC, and is provided to spare write data latch SWDL. When write data latches WDL0 to WDL31 and spare write data latch SWDL take in the received data and when output data WDD0 to WDD31 and WDDS are made definite, equalizing instruction signal IOWEQ attains the inactive state, and at the same time, write driver enable signal WDE is activated.

Write column select line CSLW is driven to the active state according to a column address signal substantially at the same time as the activation of write driver enable signal WDE. Thus, write driver WDV0 to WDV31 and spare write driver SWDV drive write data line pairs IOW0 to 1OW31 and spare write data line pair SIOW according to the provided data. When the signal potentials of write data line pairs IOW0 to 1OW31 and spare write data line pair SIOW have sufficiently changed and when the data in a sense amplifier circuit on the selected column of the selected row block changes according to the write data, write column select line CSLW and write driver enable signal WDE are deactivated. On the other hand, equalizing instruction signal IOWEQ is activated, and write data line pairs IOW0 to 1OW31 and spare write data line pair SIOW are precharged and equalized to a prescribed voltage level.

In data read, read command READ instructing a data read is provided at time T2 and time T3. When read command READ is provided, row block address signals RBA0 to RBA3 designating a row block to be accessed is generated according to column bank address CBK designating the column bank subject to a column access and a page address (not shown). Column redundancy control circuit CRC performs the spare determination operation according to address signals RBA0 to RBA3 for specifying the row block. On the other hand, read column select line CSLR in the row block to be column-accessed is activated according to a column address signal and column bank address CBK and a page address signal, and data in the memory cells on the selected columns (i. e. data latched from the sense amplifier circuit) are read on respective read data line pairs IOR0 to IOR31 and spare read data line pair SIOR.

The equalizing of the read data line pair is stopped immediately before the activation of read column select line CSLR (i. e. deactivation of equalizing instruction signal IOREQ). Thus, the potentials of read data line pairs IOR0 to IOR31 and spare read data line pair SIOR change according to the read data. When the potential change becomes sufficiently large, preamplifier activating signal PAE is activated, and preamplifiers PA0 to PA31 and spare preamplifier SPA operate to amplify the signal potential on the corresponding read data line pair, and internal read data PAO0 to PAO31 and PAOS become definite.

When read data PAO0 to PAO31 and PAOS from preamplifiers PA0 to PA31 and spare preamplifier SPA are made definite, multiplexers MUX0 to MUX31 perform the selecting operation according to spare data line selecting signals SIOSEL0 to SIOSEL31 from column redundancy control circuit CRC. Data RDF0 to RDF31 from multiplexers MUX0 to MUX31 are latched at the rise of clock signal CLK by read data latches RDL0 to RDL31, and thereafter, are output as output data Q0 to Q31 via output buffers QB0 to QB31 in synchronization with the rise of clock signal CLK.

By providing read data line pairs and write data line pairs separately, the read column selecting operation can be performed even with read command READ provided at time T2 when the signal potentials of write data line pairs IOW0 to IOW31 and spare write data line pair SIOW have not recovered to a prescribed precharge voltage. Since read data line pairs IOR0 to IOR31 and spare read data line pair SIOR are set at a prescribed precharged state, the signal potentials are accurately changed from the prescribed precharge voltage according to the memory cell data.

Therefore, there is no need to consider the problem of write recovery; that is, time $\Delta Teq(wr)$ required for precharge of the data lines during a write/read need not be considered at all so, that the cycle time can be shortened by the time difference $\Delta Teq(wr)$.

In addition, the result of spare determination is output at an early timing during the write operation, so that data WDS from spare multiplexer SMUX can be driven to the definite state at an early timing, and consequently, write driver enable signal WDE can be activated at an early timing. Therefore, the period during which data WDDS becomes indefinite shown by the shadowed areas in FIG. 8 can be made to come at an earlier time, and the activation period of write driver enable signal WDE can also be advanced in time relative to the period shown in FIG. 8. As a result, although conventionally the activation of a column select line in a write operation needs to be delayed because the outputting of the result of spare determination occurred at the same time for a data write mode and for a read mode, a column select line can be activated at an earlier time in a write operation according to the present invention, thereby achieving a shorter write cycle time.

In the read mode, only the following is required: a unique time period should be insured for the data read from a memory cell to reach a preamplifier, and after this period passes, the result of spare determination is made definite and a selecting operation is performed by a multiplexer. In a read operation, only the set-up time $\Delta Ts$ should be ensured for data RDF0 to RDF31 from multiplexers MUX0 to MUX31 with respect to read data latches RDL0 to RDL31. Since the data write can be speeded up, write column select line CSLW can be activated at an early timing, the write cycle time can be made shorter, and a high-speed operation frequency can be achieved.

Arrangement of Parts

Arrangement of a Write Driver

Figure 9:
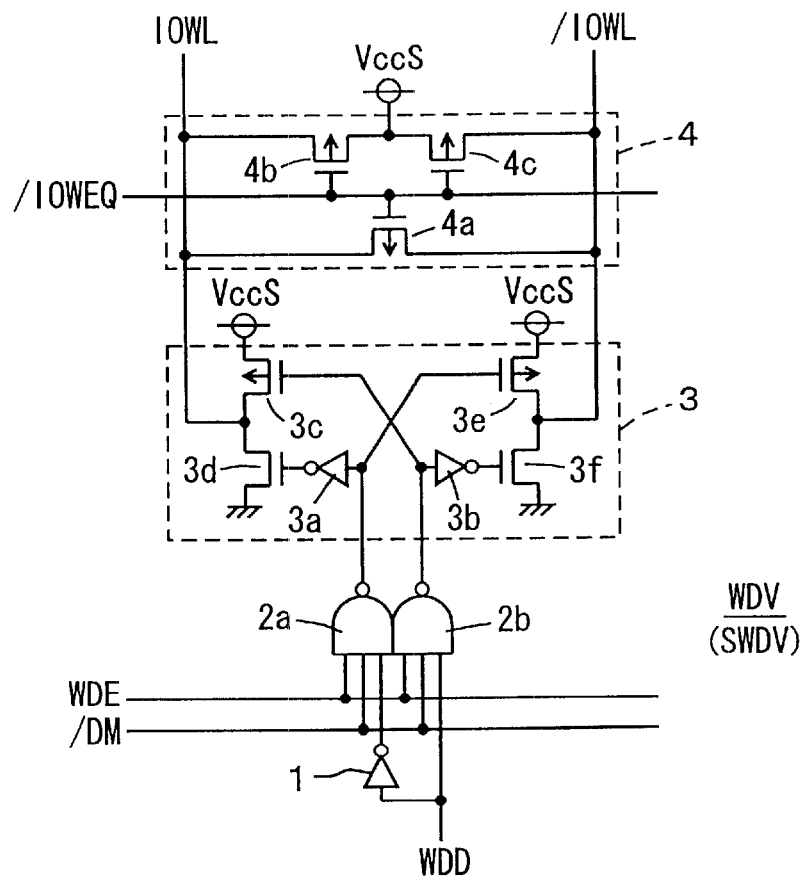
FIG. 9 is a diagram representing an arrangement of a write driver shown in FIG. 7.

FIG. 9 is a diagram representing an example of an arrangement of write drivers WDV0 to WDV31 and spare write driver SWDV shown in FIG. 7. Since write drivers WDV0 to WDV31 and spare write driver SWDV are identical in arrangement, a single representative write driver WDV is shown in FIG. 9.

As shown in FIG. 9, write driver WDV includes an inverter 1 for inverting internal write data WDD from a write data latch; an NAND circuit 2a for receiving write driver enable signal WDE, data mask instruction signal /DM, and an output signal from inverter 1; an NAND circuit 2b for receiving write driver enable signal WDE, data mask instruction signal /DM, and an internal write data WDD; a drive circuit 3 for driving write data lines IOWL and /IOWL that are complementary to one other according to output signals from NAND circuits 2a and 2b; and a data line equalizing/precharging circuit 4 activated in response to activation of a complementary write data line equalizing instruction signal /IOWEQ for equalizing and precharging write data lines IOWL and /IOWL to power supply voltage VccS level. Write data line equalizing instruction signal /IOWEQ is an inverted signal of a signal IOWEQ.

Drive circuit 3 includes inverters 3a and 3b for respectively inverting the output signals of NAND circuits 2a and 2b; a P-channel MOS transistor 3c rendered conductive when the output signal of NAND circuit 2b is at the "L" level, for transmitting power supply voltage VccS to write data line IOWL; an N-channel MOS transistor 3d rendered conductive when the output signal of inverter 3a is at the "H" level, for discharging write data line IOWL to the ground voltage level; a P-channel MOS transistor 3e rendered conductive when the output signal of NAND circuit 2a is at the "L" level, for transmitting power supply voltage VccS to write data line /IOWL; and an N-channel MOS transistor 3f rendered conductive when the output signal of inverter 3b is at the "H" level, for discharging write data line /IOWL to the ground voltage level.

Data equalizing/precharging circuit 4 includes P-channel MOS transistors 4a to 4c rendered conductive when equalizing instruction signal /IOWEQ is at the active state or the "L" level. When rendered conductive, MOS transistor 4a short-circuits write data lines IOWL and /IOWL. When rendered conductive, MOS transistors 4b and 4c respectively transmit power supply voltage VccS to write data lines IOWL and /IOWL.

Power supply voltage VccS is the same voltage level as power supply voltage VccS provided to sense amplifier circuit SA, that is, 2.0 V, for example. Power supply voltage VccS is generated by down-converting an external power supply voltage of 2.5 V, for example, by an internal voltage down converter (VDC). The peripheral circuits (such as a row decoder) of a memory cell array and the circuits of the data path receive the external power supply voltage as one operation power supply voltage for operation.

In write driver WDV shown in FIG. 9, either when write driver enable signal WDE is at the "L" level or when data mask instruction signal /DM is at the "L" level, both the output signals of NAND circuits 2a and 2b are at the "H" level, and the output signals of inverters 3a and 3b of drive circuit 3 both attain the "L" level. Therefore, in this state, MOS transistors 3c to 3f are all in the non-conductive state in drive circuit 3, and drive circuit 3 attains the output high impedance state.

On the other hand, when write driver enable signal WDE is at the "L" level, write data line equalizing instruction signal /IOWEQ is in the active state or the "L" level, and write data lines IOWL and /IOWL are maintained at the level of power supply voltage VccS by data line equalizing/precharging circuit 4.

When write driver enable signal WDE attains the active state or the "H" level, and when data mask instruction signal /DM is at the "H" level, NAND circuits 2a and 2b operate as inverter buffers, and generate internal signals according to internal write data WDD. Therefore, in this state, drive circuit 3 drives write data lines IOWL and /IOWL according to write data WDD.

Example of a Modified Spare Write Driver

Figure 10:
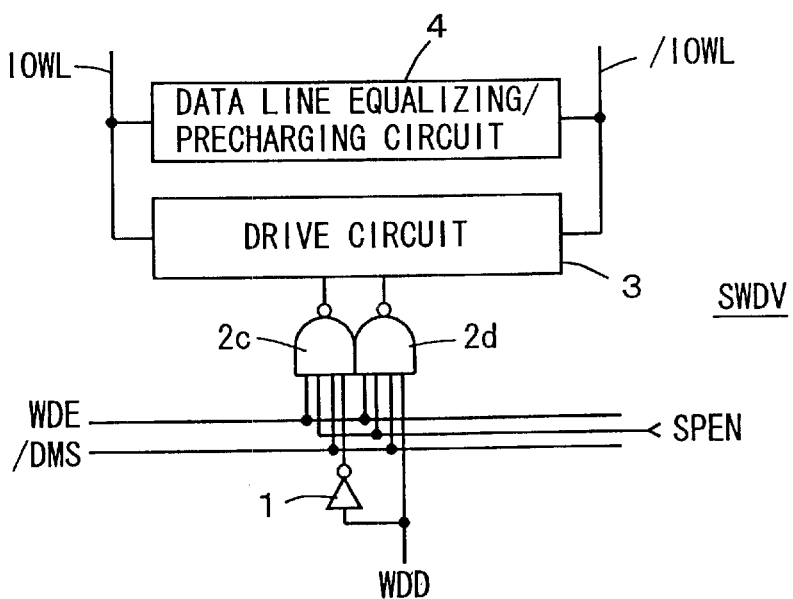
FIG. 10 is a schematic representation of a modification of the write driver shown in FIG. 7.

FIG. 10 is a schematic representation of a modification of spare write driver SWDV. In spare write driver SWDV shown in FIG. 10, a spare enable signal SPEN, write driver enable signal WDE, and data mask instruction signal /DMS are provided to NAND circuits 2c and 2d driving drive circuit 3. Drive circuit 3 and data line equalizing/precharging circuit 4 have the same arrangements as those shown in FIG. 9.

Spare enable signal SPEN is driven to the active state by column redundancy control circuit CRC when a spare memory cell is used to repair a defective bit. If the defective bit is not addressed, that is, when a spare write data line pair is not used, spare enable signal SPEN is held at the inactive state or the "L" level.

When spare enable signal SPEN is driven to the inactive state or the "L" level, the output signals of NAND circuits 2c and 2d both attain the "H" level, and drive circuit 3 attains the output high impedance state. Therefore, when a spare is not used, the current consumed by a spare write driver can be saved by holding the spare write driver at the output high impedance state.

Figure 11:
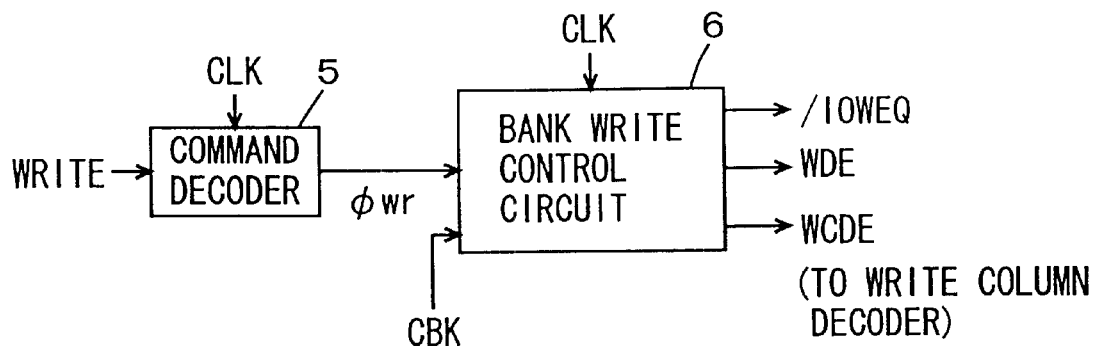
FIG. 11 is a schematic representation of an arrangement of a portion that generates a control signal shown in FIG. 9.

FIG. 11 is a schematic representation of an arrangement of a portion that generates a write control signal. In FIG. 11, a write control signal generating portion includes a command decoder 5 for taking in an external write command WRITE in synchronization with clock signal CLK to generate a write operation instruction signal φwr, and a bank write control circuit 6 for generating, according to write operation instruction signal φwr from command decoder 5 and a column bank address CBK, control signals /IOWEQ, WDE, and WCDE for a designated bank in synchronization with clock signal CLK. A write column decoder enable signal WCDE is provided to a write column decoder, and the write column decoder performs a decoding operation according to the activation of write column decoder enable signal WCDE, and decides the timing at which write column select line CSLW is to be activated.

Arrangement of a Write Mask Data Signal Generating Circuit

Figure 12:
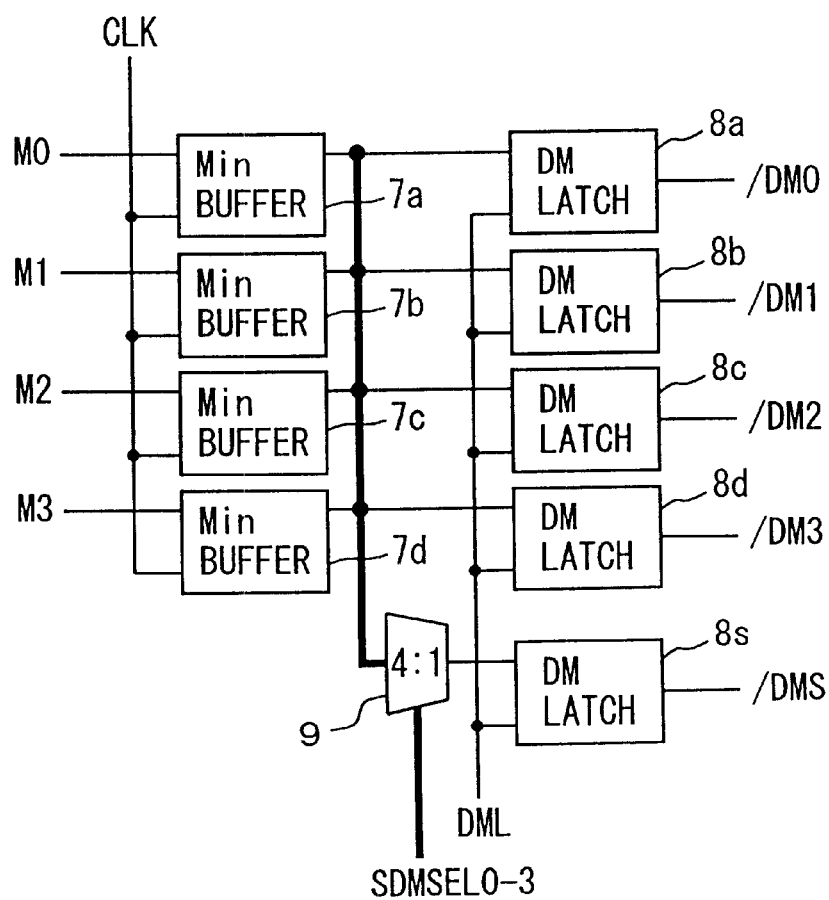
FIG. 12 is a schematic representation of an arrangement of a portion that generates a data mask signal shown in FIG. 7.

FIG. 12 is a schematic representation of an arrangement of a data mask instruction signal generating portion. In FIG. 12, the data mask instruction signal generating portion includes mask input (Min) buffers 7a to 7d respectively taking in data mask signals M0 to M3 provided externally in synchronization with clock signal CLK, data mask (DM) latches 8a to 8d provided corresponding to the respective mask buffers for latching output signals from mask input buffers 7a to 7d according to data mask latch instruction signal DML, a 4:1 multiplexer 9 for selecting one of output signals from mask input buffers 7a to 7d according to spare data mask selecting signals SDMSEL0 to SDMSEL3 from column redundancy control circuit CRC shown in FIG. 7, and a DM latch 8s for latching an output signal from multiplexer 9 according to data mask latch instruction signal DML. DM latches 8a to 8d output the data mask instruction signals /DM0 to /DM3, and DM latch 8s outputs a spare data mask instruction signal /DMS.

Data mask latch instruction signal DML is generated at a prescribed timing in synchronization with clock signal CLK in a data write operation.

Figure 13A:
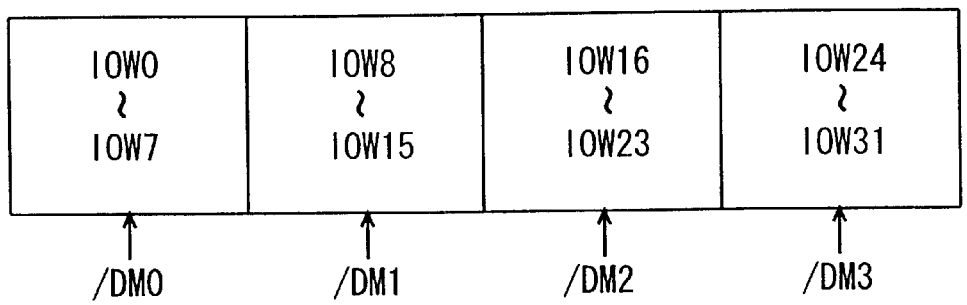
FIG. 13A shows the correspondence between a write data line pair and a data mask signal.

FIG. 13A shows the correspondence between data mask instruction signals /DM0 to /DM3 and write data bus line pairs IOW0 to IOW31. As shown in FIG. 13A, data mask instruction signals /DM0 to /DM3 each mask 8 bits of data. Data mask instruction signals /DM0, /DM1, /DM2, and /DM3 correspond to write data bus line pairs IOW0 to IOW7, IOW8 to IOW15, IOW16 to IOW23, and IOW24 to IOW31, respectively. Utilizing this correspondence relationship, spare data mask selecting signals SDMSEL0 to SDMSEL3 are generated.

Figure 13B:
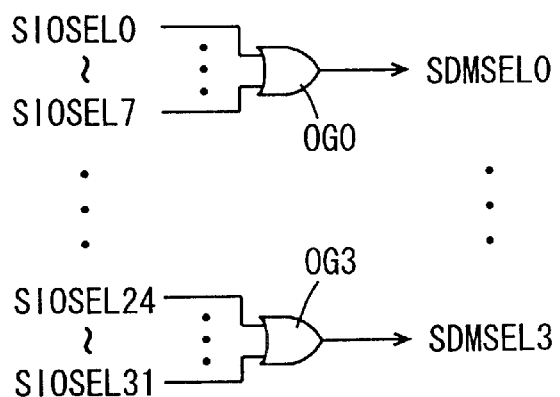
FIG. 13B is a schematic representation of an arrangement of a spare data mask selecting signal generating portion.

FIG. 13B is a schematic representation of an arrangement of a spare data mask selecting signal generating portion contained in column redundancy control circuit CRC. In FIG. 13B, the spare data mask selecting signal generating portion includes OR gates OG0 to OG3 each for receiving eight adjacent spare data line selecting signals. OR gate OG0 receives spare data line selecting signals SIOSEL0 to SIOSEL7 to generate a spare data mask selecting signal SDMSEL0. Similarly, OR gate OG3 receives spare data line selecting signals SIOSEL24 to SIOSEL31 to generate a spare data mask selecting signal SDMSEL3. The OR gate not shown in FIG. 13B, also, receives spare data line selecting signals by a unit of 8 bits and generates a corresponding spare data mask selecting signal.

Moreover, 8-input OR gates are utilized in the arrangement shown in FIG. 13B. The decoding operation of an address designating a data line to be replaced, however, is performed upon the generation of spare data line selecting signals SIOSEL0 to SIOSEL31, so that the decoding operation may be utilized in generating the spare data mask selecting signals.

Arrangement of a Row Block Address Generating Portion

Figure 14:
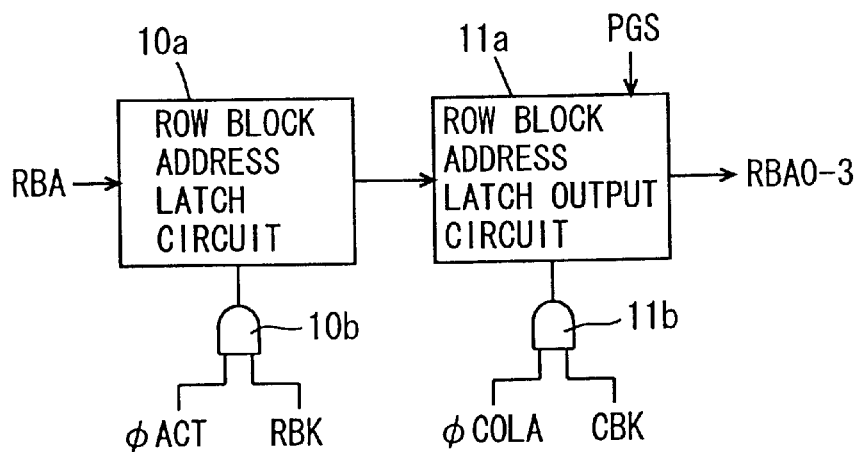
FIG. 14 is a schematic representation of an arrangement of a row block address signal generating portion shown in FIG. 7.

FIG. 14 is a schematic representation of an arrangement of a portion that generates a row block address signal provided to a column redundancy control circuit. In FIG. 14, the row block address signal generating portion includes an AND circuit 10b for receiving an array activating instruction signal φACT and a row bank address RBK, a row block address latch circuit 10a for taking in and latching a row block address signal RBA at the activation of an output signal from AND circuit 10b, an AND circuit 11b for receiving a column access operation instruction signal φCOLA and a column bank address signal CBK, and a row block address latch output circuit 11a for outputting as row block address signals RBA0 to RBA3 a row block address signal that is taken in and provided from row block address latch circuit 10a together with a page selecting signal PGS during the activation of an output signal of AND circuit 11b.

Array activating instruction signal φACT is activated when a row access command is provided and remains activated for a prescribed period of time. Row bank address RBK designates a bank to be accessed in a row access. There are two banks in the present embodiment, and when the bank related to the control signal generating portion is specified, the output signal of AND circuit 10b attains the active state.

Row block address signal RBA provided to row block address latch circuit 10a designates one of the eight row blocks, since there are two pages, and, for instance, the row blocks of the same position in each of the pages are designated. When a row access is performed with a page being a unit, a page address and a row block address are provided, and the word line selection is performed individually for each page.

Column access instruction signal φCOLA is driven to the active state when a read command or a write command is provided. Column bank address signal CBK is provided simultaneously when the read command or the write command is provided, and designates one of the two banks. Row block address latch output circuit 11a is activated when the column access instruction is provided and when the related bank is designated by the column bank address, and outputs row block address signal RBA latched and outputted by row block address latch circuit 10a along with page selecting signal PGS. Row block address signals RBA0 to RBA3 from row block address latch output circuit 11a are 4 bits, while row block address signal RBA provided to row block address latch circuit 10a are 3 bits (excluding the page address). Row block address latch output circuit 11a adds page selecting signal PGS in the most significant bit position of row block address signal RBA to generate the 4-bit row block address signals RBA0 to RBA3. Thus, one of the 16 row blocks is specified.

Arrangement of Column Redundancy Control Circuit

Figure 15:
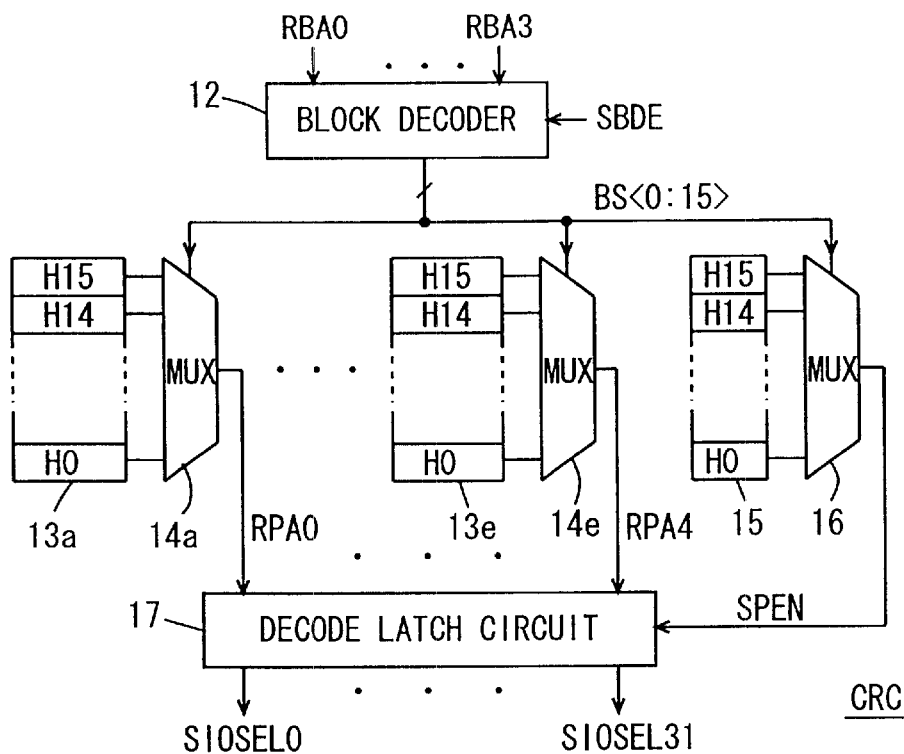
FIG. 15 is a schematic representation of an arrangement of a column redundancy control circuit shown in FIG. 7.

FIG. 15 is a schematic representation of an arrangement of a spare data line selecting signal generating portion of a column redundancy control circuit shown in FIG. 7. In FIG. 15, column redundancy control circuit CRC includes a block decoder 12 activated in response to a spare block decode enable signal SBDE for decoding row block address signals RBA0 to RBA3 to generate a block selecting signal BS<0:15>; program circuits 13a to 13e, including fuse circuits H0 to H15 provided corresponding to the respective row blocks, for storing an address of a defective data line pair; multiplexers (MUX) 14a to 14e provided corresponding to the respective program circuits 13a to 13e for selecting an output of a fuse circuit of a corresponding program circuit according to block selecting signal BS<0:15> from block decoder 12; a program circuit 15, including fuse circuits H0 to H15 correspondingly provided to the respective row blocks, for storing information indicating whether or not to replace a defective data line for each row block; a multiplexer (MUX) 16 for reading the program content of a fuse circuit of program circuit 15 in a corresponding row block according to block selecting signal BS<0:15> from block decoder 12; a decode latch circuit 17 activated in response to a spare enable signal SPEN from multiplexer 16 for decoding 5 bits of replacement data line address signals RPA0 to RPA4 to output spare data line selecting signals SIOSEL0 to SIOSEL31.

Fuse circuits H0 to H15 store a one-bit address. By decoding the storage contents of the fuse circuits of program circuits 13a to 13e in the same row block, defective data line address signal of 5 bits RPA0 to RPA4 is generated. Fuse circuits H0 to H15 in program circuit 15 store information on whether or not to perform the replacement for defect in the respective row blocks.

A specific arrangement of fuse circuits H0 to H15 is simply required to be capable of storing one bit of address by a fuse program, and the well known arrangement of a fuse program circuit that generates a signal instructing a specified operation mode by fixing the potential of a pad, for example, can be utilized.

Column redundancy control circuit CRC varies the timing at which spare data line selecting signals SIOSEL0 to SIOSEL31 are set to the definite state for a data write and for a data read.

Figure 16:
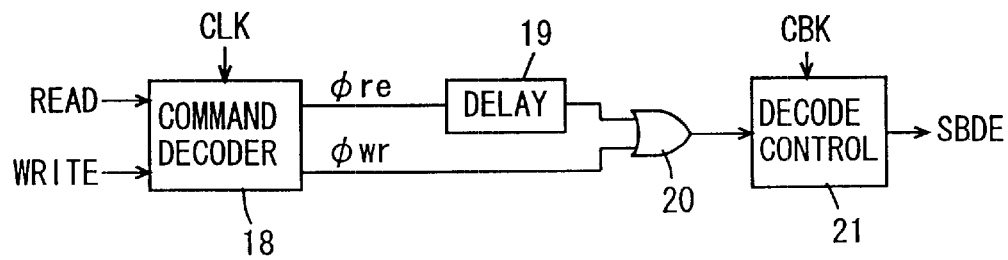
FIG. 16 is a schematic representation of an arrangement of a spare block decode enable signal generating portion shown in FIG. 7.

FIG. 16 is a schematic representation of an arrangement of a portion that generates a spare block decode enable signal SBDE shown in FIG. 15. In FIG. 16, a spare block decode enable signal generating portion includes a command decoder 18 for taking in commands READ and WRITE provided externally in synchronization with clock signal CLK to generate a read operation instruction signal φre and a write operation instruction signal φwr, a delay circuit 19 for delaying read operation instruction signal φre from command decoder 18 by a prescribed period of time, an OR circuit 20 for receiving an output signal of delay circuit 19 and write operation instruction signal φwr from command decoder 18, and a decode control circuit 21 for generating, according to an output signal from OR circuit 20 and a column bank address signal CBK, the spare block decode enable signal SBDE that remains activated for a prescribed period of time.

Command decoder 18 drives read operation instruction signal φre to the active state when read command READ is provided, and drives write operation instruction signal φwr to the active state when write command WRITE is provided. Decode control circuit 21 is activated when column bank address signal CBK is designating a corresponding bank, and holds spare block decode enable signal SBDE in the active state for a prescribed period of time according to the activation of an output signal from OR circuit 20.

According to the arrangement shown in FIG. 16, the timing at which block selecting signal BS<0:15> from block decoder 12 is generated in a data read operation is delayed from that in a data write operation. In a write operation, spare determination is performed at an early time and an internal write data provided from an input buffer is selected by a spare multiplexer SMUX (see FIG. 7), so that the write driver can be activated at an earlier timing. In a read operation, spare data line selecting signal SIOSEL needs only be driven to the definite state before the preamplifier output is made definite so that a spare data line selecting signal can be generated based on the spare determination and the result of the determination well in time even with delay circuit 19, and thus, the defect repair can be performed well in time.

Modification of Column Redundancy Control Circuit

Figure 17:
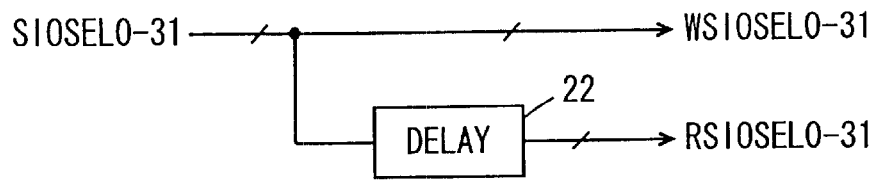
FIG. 17 is a schematic representation of an arrangement of a modification of the column redundancy control circuit shown in FIG. 15.

FIG. 17 is a diagram showing a modification of column redundancy control circuit CRC. In the arrangement shown in FIG. 17, spare data line selecting signals SIOSEL0 to SIOSEL31 from decode latch circuit 17 (see FIG. 15) are provided to spare multiplexer SMUX shown in FIG. 7 as spare write data line selecting signals WSIOSEL0 to WSIOSEL31. Moreover, spare data line selecting signals SIOSEL0 to SIOSEL31 from decode latch circuit 17 shown in FIG. 15 are provided via delay circuit 22 to multiplexers MUX0 to MUX 31 for selecting a preamplifier output shown in FIG. 7 as spare read data line selecting signals RSIOSEL0 to RSIOSEL31.

In the arrangement shown in FIG. 17, spare block decode enable signal SBDE is activated at the same timing for a data read and a data write, and delay circuit 19 of the circuit shown in FIG. 16 is removed. Thus, write data line to be replaced can be selected at an early timing during a data write operation.

Figure 18:
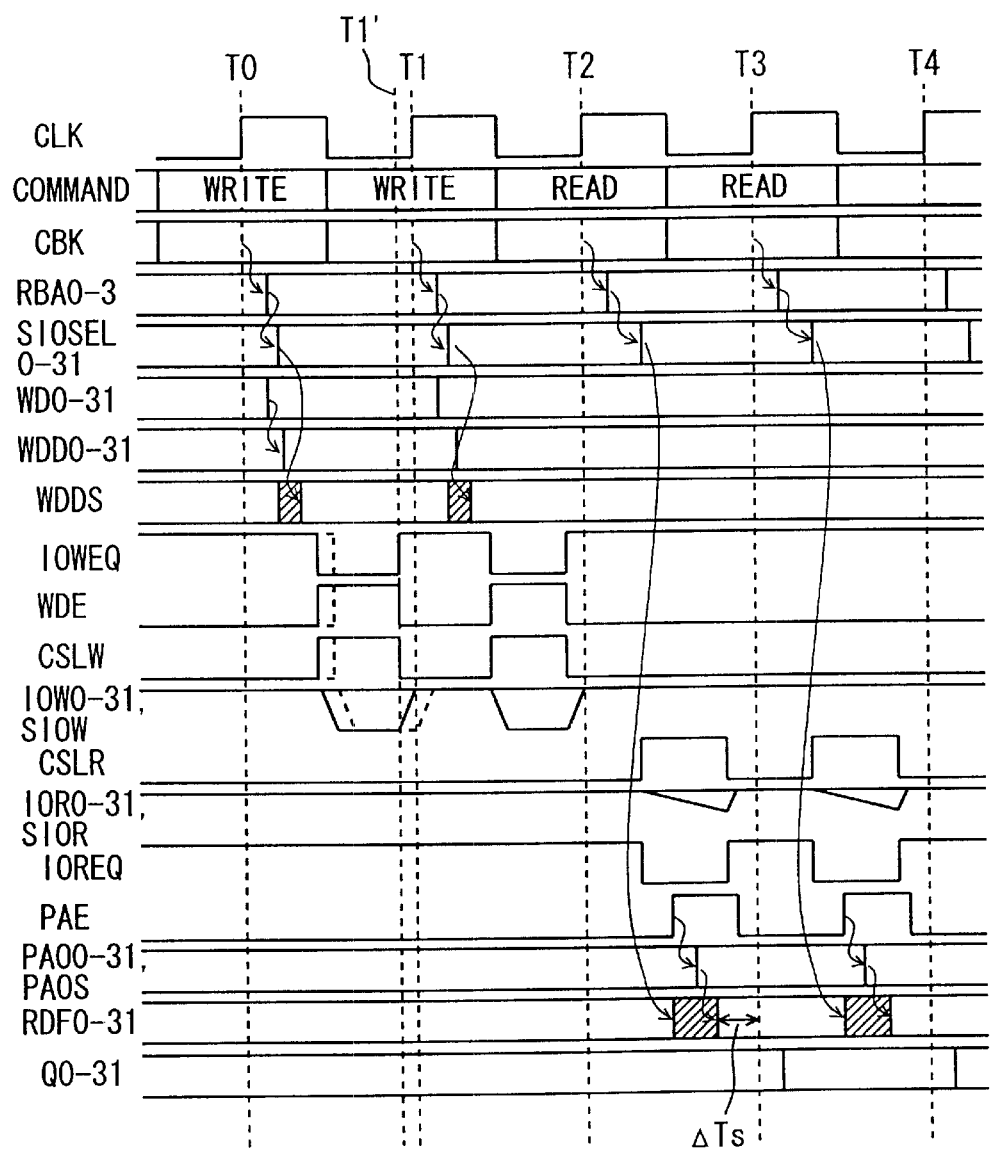
FIG. 18 is a timing chart representing operations of arrangements shown in FIGS. 15 to 17.

FIG. 18 is a timing diagram representing an example of operation waveform when the timing at which the result of the spare determination is obtained is varied for a read mode and for a write mode.

As shown in FIG. 18, when write command WRITE is provided at time T0 or time Tl, row address signals RBA0 to RBA3 are driven to the definite state according to column bank address signal CBK. Then, in a write mode, column redundancy control circuit CRC performs the decoding operation at an early timing and drives spare data line selecting signals SIOSEL0 to SIOSEL31 (WSIOSEL0 to WSIOSEL31) to the definite state.

Internal write data WD0 to WD31 from input buffers are latched by write data latches WDL0 to WDL31, and internal write data WDD0 to WDD31 are output. Since spare data line selecting signals SIOSEL0 to SIOSEL31 are driven to the definite state prior to or at about the same time as the time when the outputs of write data latches are made definite, spare write data WDDS is made definite at an early timing. Thus, write driver enable signal WDE and write column select line CSLW can be activated at an early timing.

Figure 8:
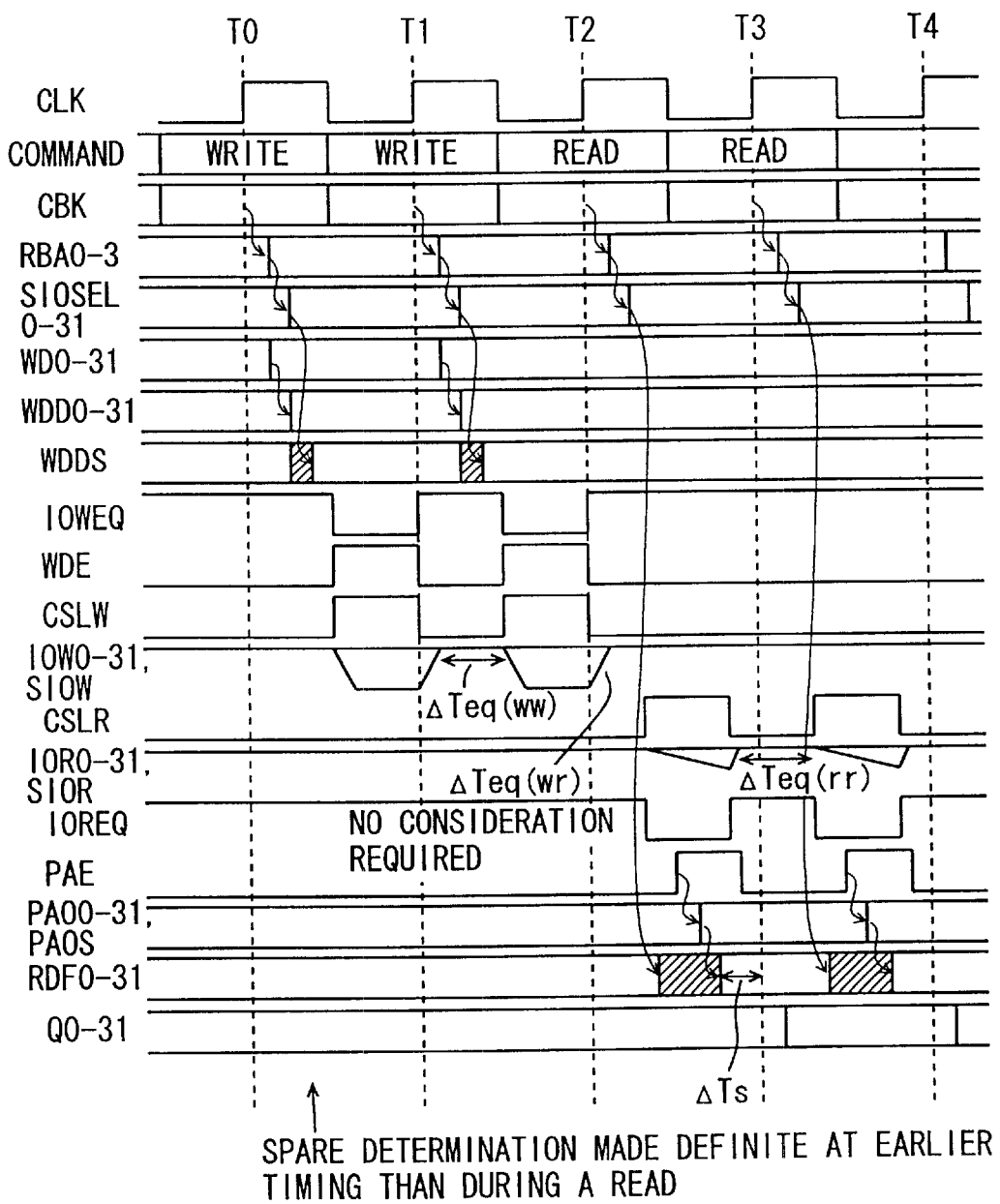
FIG. 8 is a timing diagram representing an operation of a semiconductor memory device according to a first embodiment of the present invention.

Therefore, it is possible to perform a data write operation at an earlier time than is shown in the timing diagram of FIG. 8 (shown by a dotted line in FIG. 18), so that a high-speed write operation is achieved. In the write operation, only the equalizing time $\Delta Teq(ww)$ needs to be ensured, and no collision of write data and read data occur since the read data bus and the write data bus are provided separately, so that the cycle time of clock signal CLK can be reduced. In other words, the rise of clock signal CLK at time T1 can be set at an earlier time T1', thereby achieving a shorter clock cycle and a higher operation frequency.

In a data read, read command READ is provided at time T2 and time T3. In this state, the time required until output data PAO0 to PAO31 and PAOS are output is determined by the memory array arrangement. Before preamplifier activating signal PAE is activated and output data PAO0 to PAO31 and PAOS are made definite, spare data line selecting signals SIOSEL0 to SIOSEL31 (RSIOSEL0 to RSIOSEL31) from the column redundancy control circuit are driven to the definite state. Therefore, the time during which the output signals of multiplexers MUX0 to MUX31 are in the indefinite state can be shortened, and the malfunctioning of an internal circuit due to an invalid data signal is prevented. In addition, the current consumed by the charging and discharging of a signal line due to the invalid data can be reduced.

Further, the arrangement of differencing the timing of spare determination for a data write and for a data read may be applied to the arrangement in which defective bit repair is performed by replacing the defective data line in the arrangement in which a common data line transmits read data and write data, to achieve the similar effect.

Moreover, in the arrangement shown in FIG. 15, a defective replacement read/write data line address is programmed by a fuse circuit provided to each of the row blocks. Defective replacement read/write data line address for a multiple of (for instance, two) row blocks may be programmed in a fuse circuit. Furthermore, a fuse circuit may be provided in common to a read data line pair and a write data line pair, while a spare determination circuit (MUX16 and a decoder latch circuit) may be provided separately for a read data line pair and a write data line pair.

As seen from the above, according to the first embodiment of the present invention, a read data bus and a write data bus are provided separately and the spare determination operation is done at different timing in a read operation mode and in a write operation mode, so that the data read operation can be performed before the data lines are fully equalized after the data write operation. In addition, it is possible to make a data write to occur at an earlier time, and thus a higher operation frequency is achieved.

Second Embodiment

Figure 19:
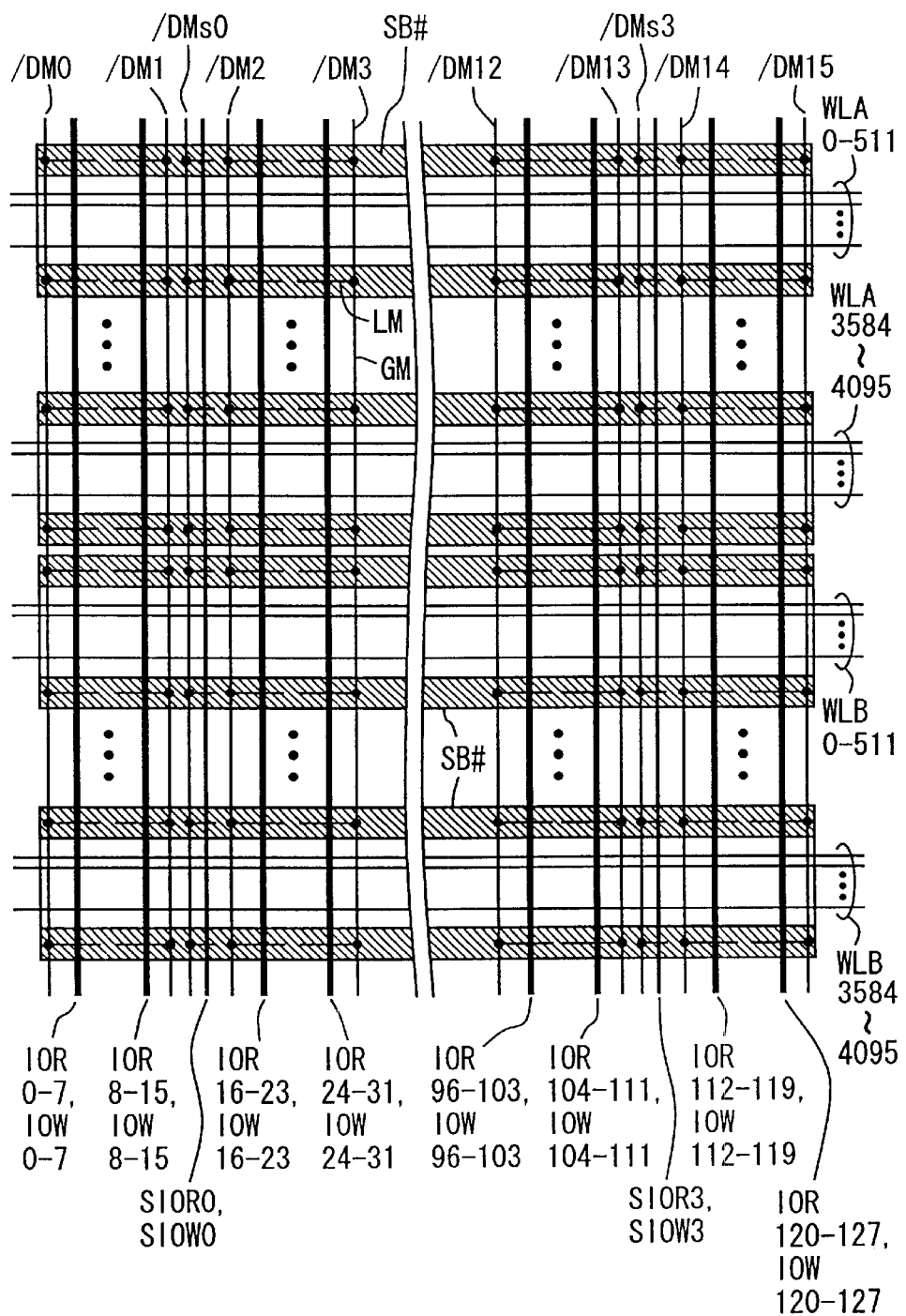
FIG. 19 is a schematic representation of an arrangement of a memory array portion according to a second embodiment of the present invention.

FIG. 19 is a schematic representation of an arrangement of a DRAM macro array portion according to a second embodiment of the present invention. There are 16 row blocks disposed in the arrangement shown in FIG. 19, and word lines WLA0 to WLA4095 and word lines WLB0 to WLB4095 are distributed, with 512 lines per row block. A sense amplifier band SB# is arranged between the row blocks.

A read data line pair IOR and a write data line pair IOW are provided in parallel in the column direction over the memory cell array. In FIG. 19, a read data line pair and a write data line pair are indicated by the same interconnection line. Write data mask lines /DM0 to /DM15 each are provided corresponding to the 8-bit read data line pairs and write data line pairs. A spare read data line pair SIOR and a spare write data line pair SIOW are provided for 32-bit read data line pairs and write data line pairs. Data mask lines /DM0 to /DM15 are provided in the same interconnection layer as these read data line pairs IOR and write data line pairs IOW or in an upper layer. Data mask lines /DM0 to /DM15 include a global mask line GM that extends along the column direction and a local data mask line LM provided corresponding to 8-bit sense amplifier circuits in each sense amplifier band SB#. In a column select operation, all local data mask signals are driven in each column block. Thus, a data mask signal is set to a data write inhibiting state or a data write permitting state according to a mask instruction signal M even in a non-selected row block.

Figure 20:
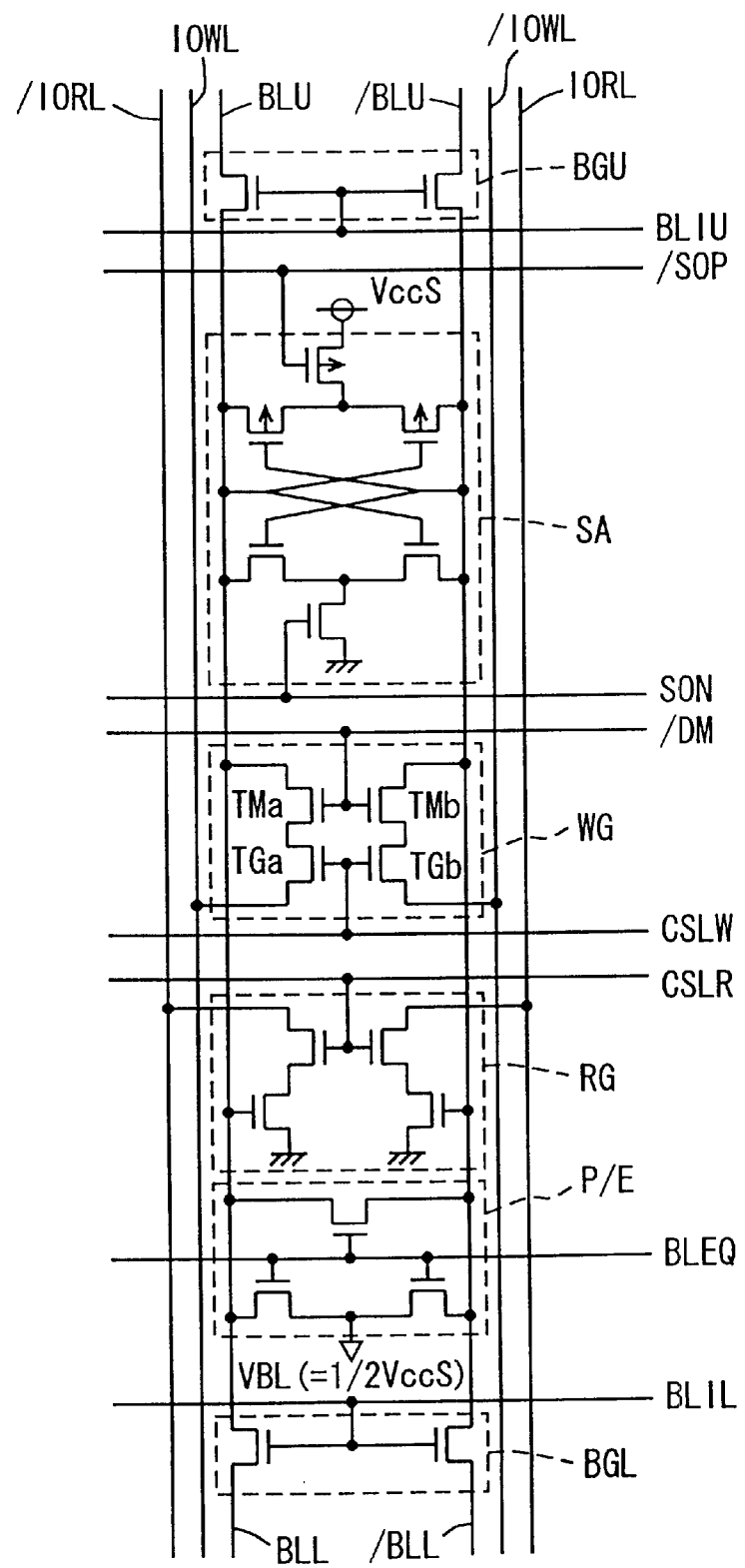
FIG. 20 is a diagram representing an arrangement of a portion relating to a sense amplifier circuit according to the second embodiment of the present invention.

FIG. 20 is a diagram representing an arrangement of a portion related to one sense amplifier circuit. In the arrangement shown in FIG. 20, a write gate WG includes transfer gates TGa and TGb rendered conductive in response to a signal on a write column select line CSLW, and transfer gates TMa and TMb connected in series to transfer gates TGa and TGb for receiving a write data mask signal /DM at their respective gates. Other parts of the arrangement are the same as those shown in FIG. 6, and the same reference characters are provided to the corresponding parts. Detailed description relating to these corresponding parts is not repeated here.

In write gate WG, transfer gates TGa and TGb are connected to write data lines IOWL and /IOWL, and transfer gates TMa and TMb receiving write data mask signal /DM at the control gates thereof are connected to a sense amplifier circuit. Write data mask signal /DM is at the "H" level when a data write is permitted, and is at the "L" level when the data write is inhibited. Therefore, even when write data mask signal /DM is set to the state indicating a data write, if write column select line CSLW is in the non-selected state, transfer gates TGa and TGb are in the non-conductive state. The load on write data lines IOWL and /IOWL is only the source junction capacitances of transfer gates TGa and TGb of write gate WG.

On the other hand, when transfer gates TMa and TMb are connected to write data lines IOWL and /IOWL, diffusion capacitances of transfer gates TMa and TMb and source diffusion capacitance of transfer gates TGa and TGb would be connected to the write data lines in a data write, causing a greater load for a write driver.

Figure 21:
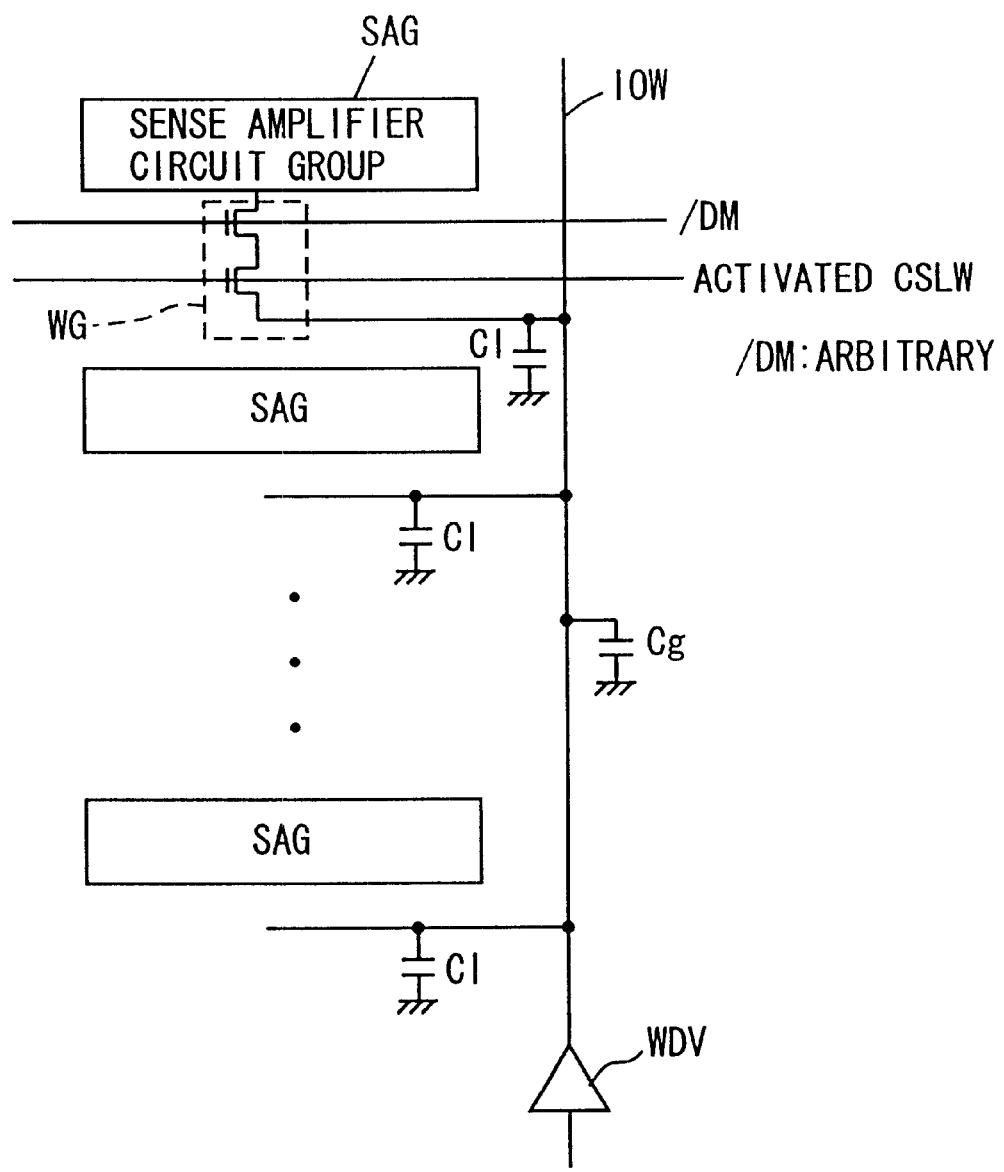
FIG. 21 is a schematic representation of a write path of one-bit data according to the second embodiment of the present invention.

More specifically, as shown in FIG. 21, a plurality (18 per bank) of sense amplifier circuit groups SAG are provided corresponding to write data line pair IOW. Each sense amplifier circuit group SAG includes eight sense amplifier circuits. One of the eight sense amplifier circuits is selected by a write column select line. A transfer gate receiving write column select signal CSLW is connected to write data line pair IOW in write gate WG. In this state, regardless of the state of data mask signal /DM, source diffusion capacitance Cl of a transfer gate coupled to a write column select line is only connected to write data line pair IOW in a non-selected sense amplifier circuit group. Line capacitance Cg is connected to write data line pair IOW. Thus, write driver WDV only drives parasitic capacitances Cg and Cl, so that write data line pair IOW can be driven at a high speed.

If a transfer gate receiving data mask signal /DM in a write gate is connected to a write data line pair, when data write is permitted, source diffusion capacitance and drain diffusion capacitance of a transfer gate receiving mask data as well as source diffusion capacitance of a transfer gate coupled to a write column select line would contribute as capacitance Cl so that the capacitance value becomes greater, and the driving load of write driver WDV becomes greater.

Thus, as shown in FIG. 20, in an arrangement where a transfer gate receiving data mask signal /DM is connected to a sense amplifier circuit, the diffusion capacitance of the transfer gate receiving the data mask signal can be hidden away from write driver WDV by a transfer gate coupled to a non-selected write column select line so that the load of write driver WDV is alleviated, and a high-speed data write operation is achieved.

Moreover, by the arrangement of write gate WG shown in FIG. 20, a period tRCD between the dispatch of a bank activation command (ACT) and the time when a column-related command can be dispatched in a mask write operation can be shortened as will be described below.

Figure 22A:
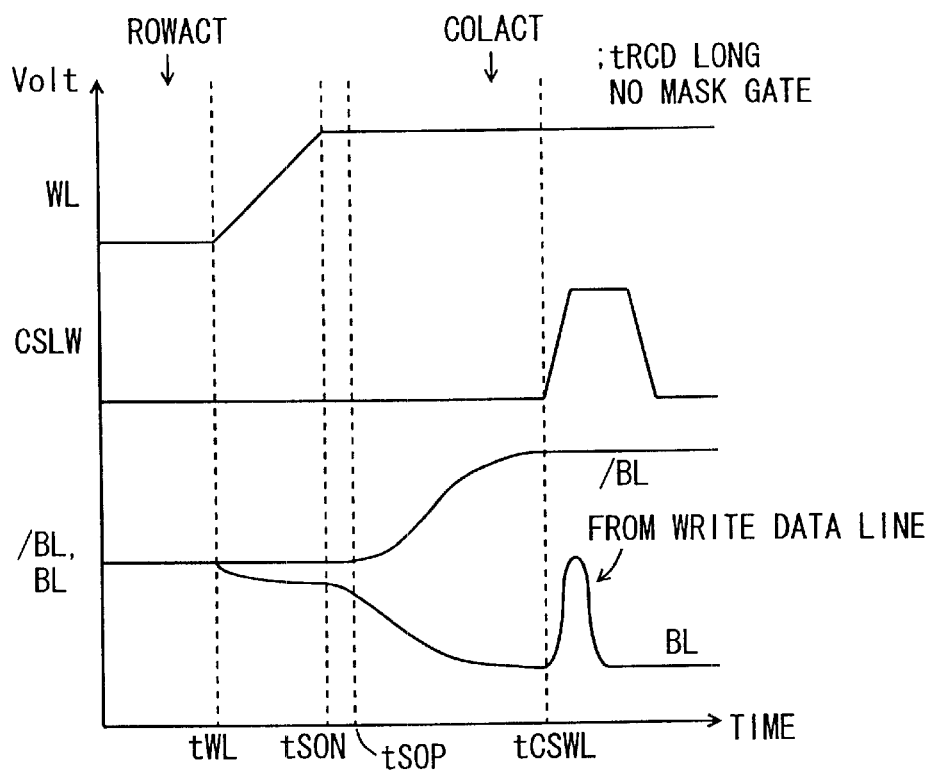
FIGS. 22A and 22B are signal waveform diagrams related to the description of an effect of a write gate shown in FIG. 20.

FIG. 22A is a diagram showing the signal waveforms in the case in which only transfer gates TGa and TGb shown in FIG. 6 are included as write gate WG. As shown in FIG. 22A, when a row access command ROWACT is provided, the voltage level of a selected word line WL in a selected row block rises at time tWL. With the rise of voltage of word line WL, memory cell data is read on bit lines BL and /BL. FIG. 22A shows a signal waveform of the case where "L" level data is read on bit line BL.

An N sense amplifier (or a sense amplifier formed by an N-channel MOS transistors) of a sense amplifier circuit is activated at time tSON, and thereafter, a P sense amplifier (or a sense amplifier formed by P-channel MOS transistors) of a sense amplifier circuit is activated at time tSOP, thereby the voltage levels of bit lines BL and /BL are respectively amplified to "L" level and "H" level according to the data.

If time tRCD is sufficiently long, write column select line CSLW is activated at time tCSLW when a column access command COLACT (write command) is provided. Write data line IOWL is already precharged to sense power supply voltage VccS by a write driver. When a write mask operation is performed, write driver WDV is set to the output high impedance state (see FIG. 9). The precharged voltage of the write data line, however, is accumulated in parasitic capacitances Cg and Cl shown in FIG. 21, and when a write gate is formed only of a pair of transfer gates, the electrical charge stored in the parasitic capacitance flows in from the write data line when write column select line CSLW is activated and the voltage level of bit line BL rises. Since, however, the sensing operation by the sense amplifier circuit is complete and the sense amplifier is in the latching state, even when the "L" level potential rises, it is discharged by the sense amplifier circuit so that the data is not destructed.

Figure 22B:
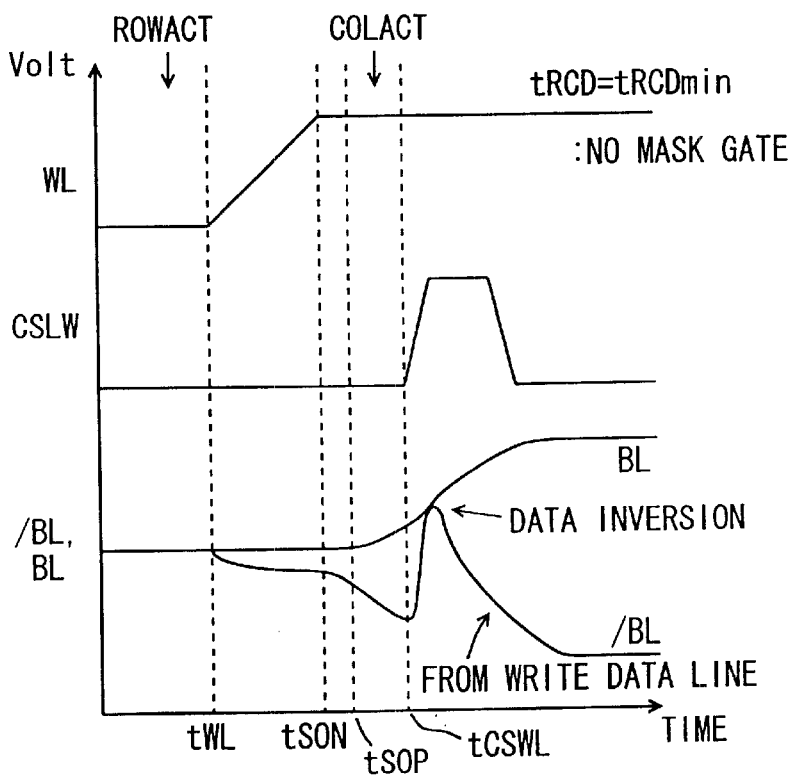

On the other hand, as shown in FIG. 22B, if period tRCD from the time when row access command ROWACT is provided to the time when column access command COLACT is provided is the minimum time tRCDmin, write column select line CSLW may be activated before the completion of the sense amplifier operation. Since the sense amplifier operation is not completed, the voltage level of a sense node of the sense amplifier circuit rises due to the electrical charge flowing in from the parasitic capacitance of the write data line. If an "L" level bit line is being discharged by the sense amplifier circuit, when the electrical charge from the write data line is injected at a higher speed (in comparison to the "H" level bit line), and when the voltage levels of the sense nodes (SNa and SNb) of the sense amplifier circuit become substantially equal, the potential difference between the bit lines goes below the sensible voltage of the sense amplifier circuit. In such a case, as shown in FIG. 22B, the memory cell data is destructed if the data is inverted. This problem of inversion of data occurs in a sense amplifier circuit, particularly when the contact resistance value (contact at a sense node) to a bit line of a transistor in the sense amplifier circuit varies due to process variation (since the sensing margin is smaller).

The fact that a column select operation cannot be started until the sensing operation is completed in order not to destruct the data means that a column-related operation cannot be started for until a long period after a bank activation command (a row access command) is dispatched. Consequently, the so-called RAS-CAS delay time (tRCD) cannot be shortened, leading to longer access time and degraded system performance.

By utilizing a write gate with transfer gates TMa, and TMb as well as transfer gates TGa and TGb connected in series, data mask signal /DM is at the "L" level so that transfer gates TMa and TMb attain the non-conductive state, and no electrical charge flows into sense nodes of a sense amplifier circuit from the write data lines when a data write is masked.

Moreover, even when a data read is performed for the same address after a mask write operation (for instance, a write verified read), no data read is performed under the voltage level of the bit line is raised due to an electrical charge injection from a write data line during the mask write operation, so that data can be read accurately.

First Modification

Figure 23:
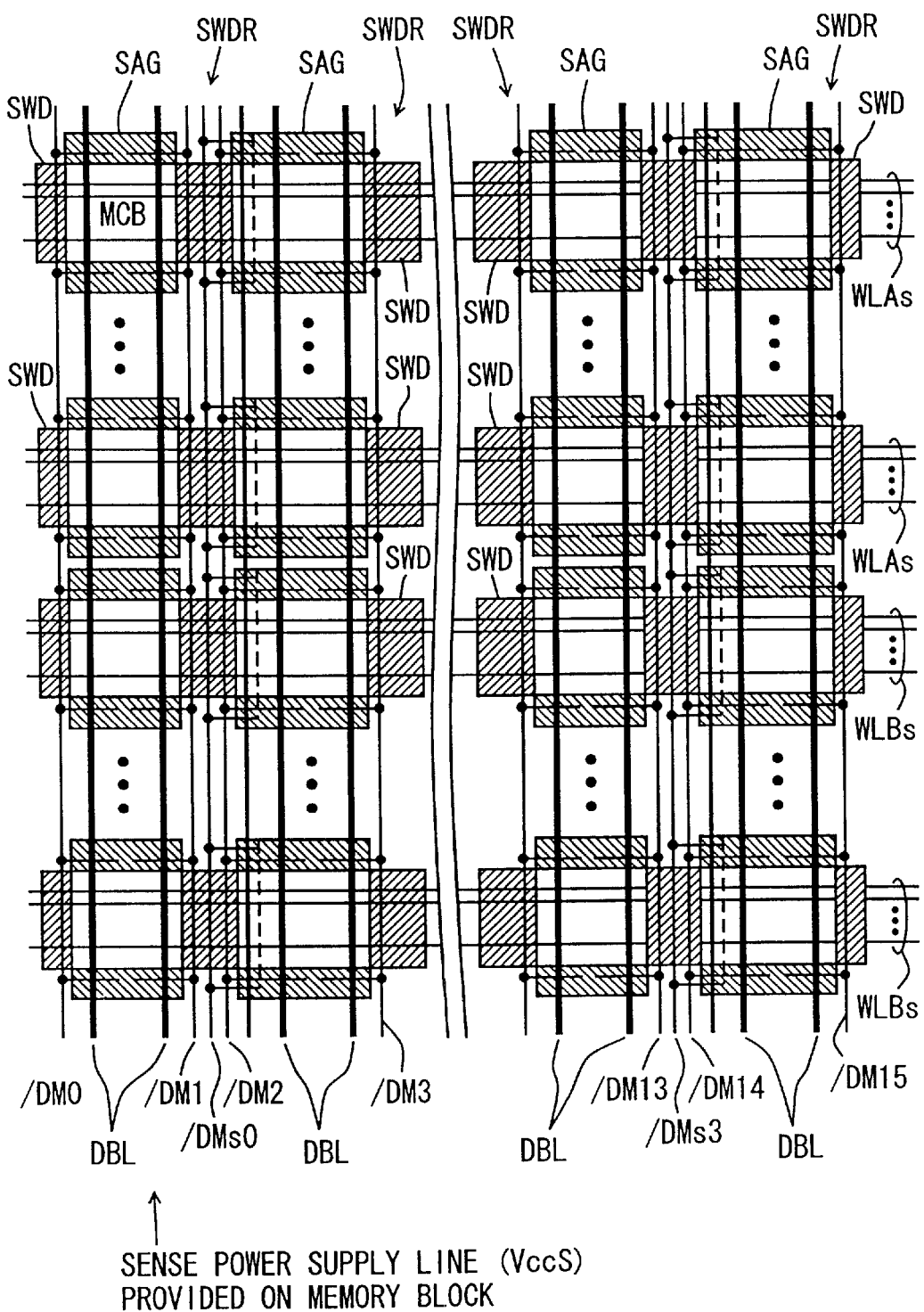
FIG. 23 is a schematic representation of an arrangement of a first modification of the second embodiment of the present invention.

FIG. 23 is a diagram showing a first modification of the second embodiment of the present invention. In FIG. 23, a memory cell row block is divided into a plurality of memory cell blocks along the row direction, and a sub-word line driver SWD is arranged between the memory cell blocks. Sense amplifier circuit groups SAG are provided for the respective memory cell blocks MCB.

Thus, in the array arrangement shown in FIG. 23, a word line has a hierarchical word line arrangement, a main word line is provided in common to row blocks, and a sub-word line is provided for each memory cell block. Sub-word line driver SWD is arranged in a sub-word line driver disposing region SWDR, and is shared by two memory cell blocks adjacent to one another in the row direction. In the hierarchical word line arrangement, a sub-word line driver is provided corresponding to a respective sub-word line, and a main word line is disposed to a corresponding to a prescribed number of sub-word lines. Each sub-word line driver drives a corresponding sub-word according to at least the signal potential on the corresponding main word line. In this case, an arrangement may be used in which a sub-word line driver drives a corresponding sub-word line to the selected state according to a signal on a main word line and a sub-word line selecting signal (when multiple sub-word lines are provided corresponding to one main word line).

In sub-word line driver disposing region SWDR, a sub-word line driver is disposed, but no memory cell nor sense amplifier circuit is arranged. Data mask lines /DM0 to /DM15 are respectively arranged in sub-word line driver disposing region SWDR. In FIG. 23, a read data bus and a write data bus are shown together as a composite data bus DBL. Each of data mask lines /DM0 to /DM15 are provided corresponding to an 8-bit read/write data bus DBL. By arranging data mask lines /DM0 to /DM15 to extend over sub-word line driver disposing region SWDR, some free region is created in the region of a memory cell block MCB. A sense power supply line for transmitting sense amplifier power supply voltage VccS and ground voltage Vss is provided in this free region of the memory cell block, in the same layer as the read data bus and the write data bus or in an upper layer, to supply sense power supply voltage stably to each sense amplifier circuit.

In FIG. 23, the regions receiving data mask signals /DMs0 to /DMs3 shown by the dotted lines within the memory cell blocks indicate spare column regions.

Second Modification

Figure 24:
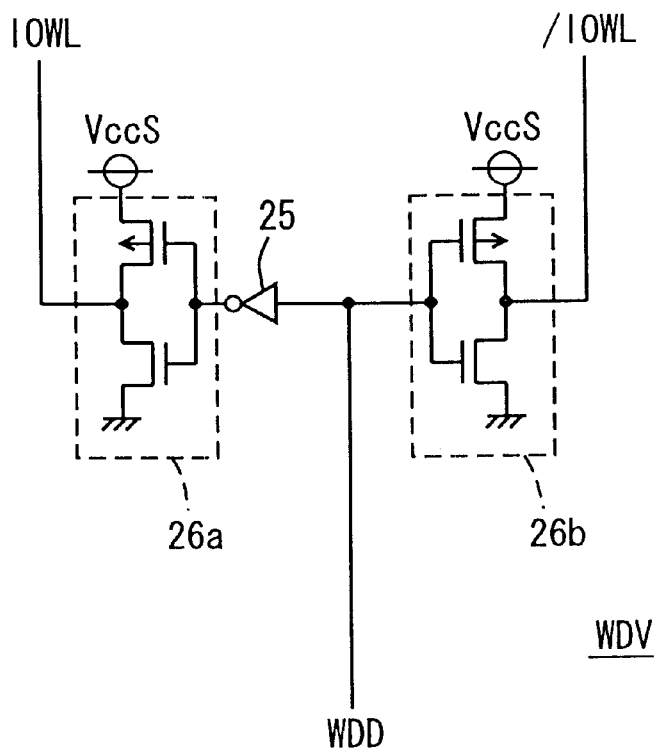
FIG. 24 is a diagram representing an arrangement of a write driver according to a second modification of the second embodiment of the present invention.

FIG. 24 is a diagram representing an arrangement of a second modification of the second embodiment of the present invention. An arrangement of write driver WDV (or spare write driver SWDV) shown in FIG. 24 includes an inverter 25 for inverting internal write data WDD, a CMOS inverter circuit 26a for driving write data line IOWL according to an output signal of inverter 25, and a CMOS inverter circuit 26b for driving a complementary write data line /IOWL according to internal write data WDD. Write driver WDV (or spare write driver SWDV) shown in FIG. 24 is a bi-state buffer that two-value-drives write data lines IOWL and /IOWL (driving to H or L level, normally), and has no output high impedance state. The equalizing/precharging operation for write data lines IOWL and /IOWL is not performed. Thus, this write driver operates statically according to internal write data WDD. CMOS inverters 26a and 27b operate using the voltage having the same voltage level as sense power supply voltage VccS as the operation power supply voltage. No problem arises even when using such a two-value driving write driver, as described below with reference to FIG. 25.

Figure 25:
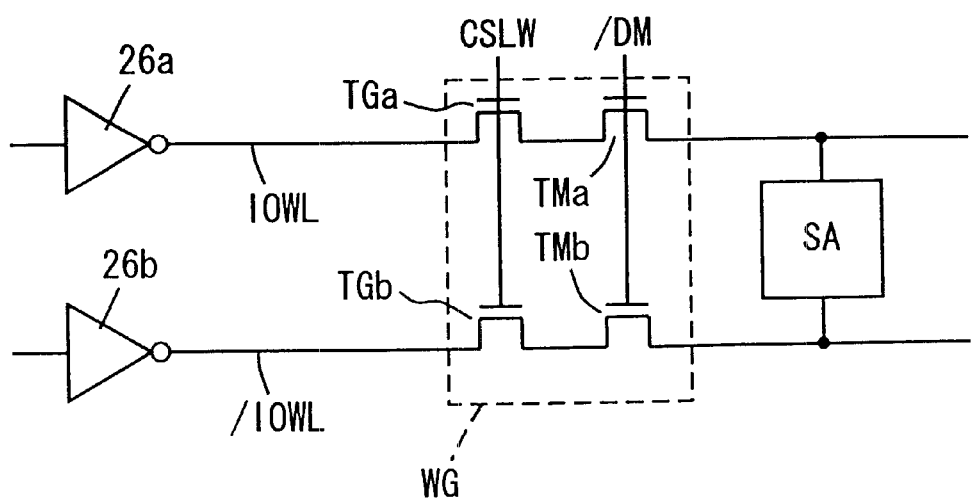
FIG. 25 is a schematic representation of a data write path in use of a write driver shown in FIG. 24.

When a data write is not performed (during a read operation or in a standby state), write column select line CSLW is in the inactive state, and transfer gates TGa and TGb are in the non-conductive state so that sense amplifier circuit SA is disconnected from write data lines IOWL and /IOWL, as can be seen from FIG. 25.

When a data write is masked during the data write, write mask signal /DM is in the active state, and transfer gates TMa and TMb are in the non-conductive state so that sense amplifier circuit SA is disconnected from write data lines IOWL and /IOWL. Consequently, during the write mask, there is no need to equalize the potentials of write data lines IOWL and /IOWL since sense amplifier circuit SA is disconnected from write data lines IOWL and /IOWL. The original purpose of the equalizing operation is to prevent the writing of uncertain data by transmission of the potential difference between the write data lines to the sense amplifier circuit while the write driver is in the output high impedance state. When a data write is not performed, however, sense amplifier circuit SA is disconnected from write data lines IOWL and /IOWL. Thus, there is no need for an equalizing operation, and no problem arises even when the write data lines are two-value driven.

Figure 26:
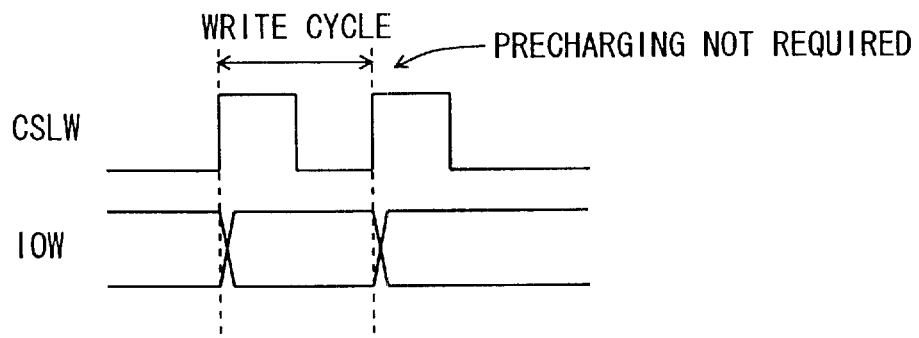
FIG. 26 is a signal waveform diagram representing an operation during the use of the write driver shown in FIG. 25.

As shown in FIG. 24, by utilizing a bi-state buffer for write driver WDV and spare write driver SWDV, the use of write driver enable signal WDE and equalizing signal /IOWEQ is no longer necessary. The data write time is determined only by the active period of write column select line CSLW, as shown in FIG. 26. The time period for equalizing write data lines IOWL and /IOWL, or the precharging period, is no longer necessary so that a shorter write cycle time and a high operation frequency of the data write are achieved.

Third Modification

Figure 27:
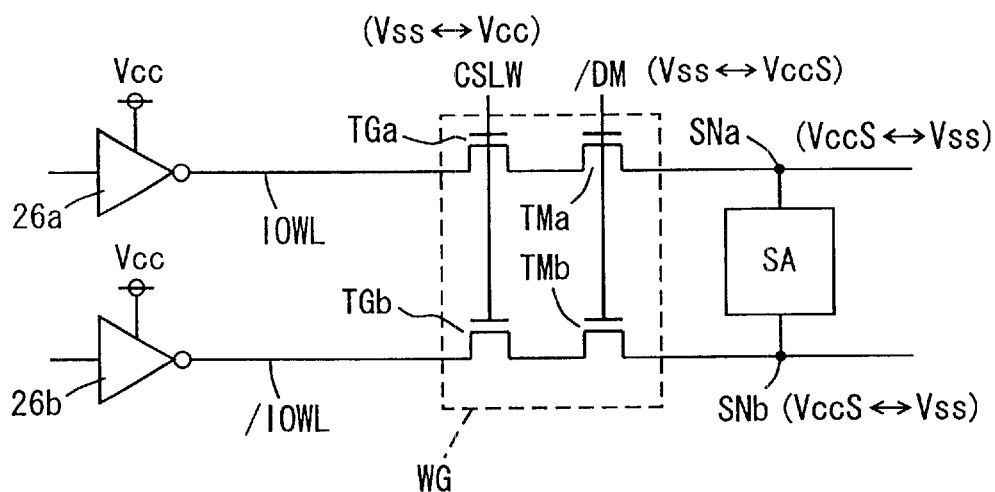
FIG. 27 is a schematic representation of an arrangement of a third modification of the second embodiment of the present invention.

FIG. 27 is a diagram representing a third modification of the second embodiment of the present invention. In the arrangement shown in FIG. 27, the write driver receives an external power supply voltage Vcc as the operation power supply voltage. Although CMOS inverter circuits 26a and 26b are shown in FIG. 27, inverter 25 shown in FIG. 24 also receives external power supply voltage Vcc as the operation power supply voltage. Data mask signal /DM is set to the voltage level having the same amplitude as sense amplifier power supply voltage VccS. Thus, data mask signal /DM varies between ground voltage Vss and sense power supply voltage VccS. On the other hand, write column select signal CSLW has its amplitude set at external power supply voltage level, and is changed between ground voltage Vss and external power supply voltage Vcc.

Transfer gates TGa and TGb are activated in write gate WG when a data write is performed. When data write is not performed, write column select line CSLW is in the inactive state, and transfer gates TGa and TGb are in the non-conductive state. In addition, during a write mask for masking a data write, data mask signal /DM is at ground voltage Vss level, and transfer gates TMa and TMb are in the non-conductive state. Thus, in these states, sense amplifier circuit SA is disconnected from write driver WDV or the spare write driver. Moreover, during a data write, data mask signal /DM is set at sense power supply voltage VccS level.

Figure 28:
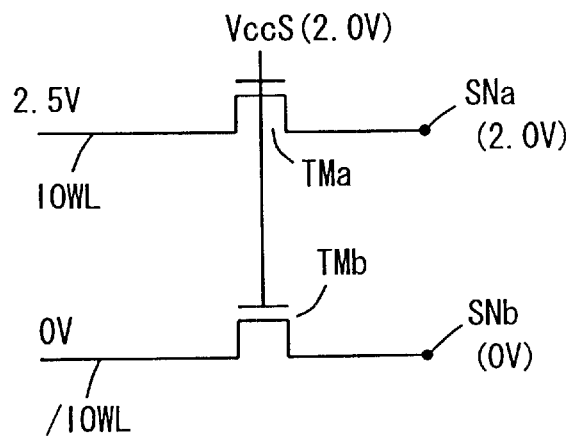
FIG. 28 is a schematic representation of an arrangement of a third modification of the second embodiment of the present invention.

Now, as seen in FIG. 28, a case is considered in which a voltage (2.5 V) of external power supply voltage Vcc level is transmitted according to write data on write data line IOWL. In such a case, the voltage of a gate of transfer gate TMa in write gate WG is at sense power supply voltage VccS level, i. e. 2.0 V. Sense node SNa of sense amplifier circuit SA attains "H" level according to the "H" level data from the write driver. After a signal having a lower voltage level than 2.0 V is transmitted to the sense node due to the loss of threshold voltage of transfer gate TMa, sense node SNa is held at sense power supply voltage 2.0 V level by sense amplifier circuit SA. If the threshold voltage of transfer gate TMa is greater than 0.5 V, no current flows in this state via transfer gate TMa. Thus, transfer gate TMa has its gate and its source interconnected, and attains a state equivalent to a PN diode so that it becomes non-conductive.

At this time, "L" level data is transmitted on write data line /IOW, and ground voltage Vss (=0 V) is transmitted, thereby driving sense node SNb to ground voltage level. In this case, although transfer gate TMb is in the conductive state, the two voltage levels are the same, and no through current flow is caused.

Therefore, a data write is stably performed by driving a write driver with external power supply voltage Vcc.

Figure 29:
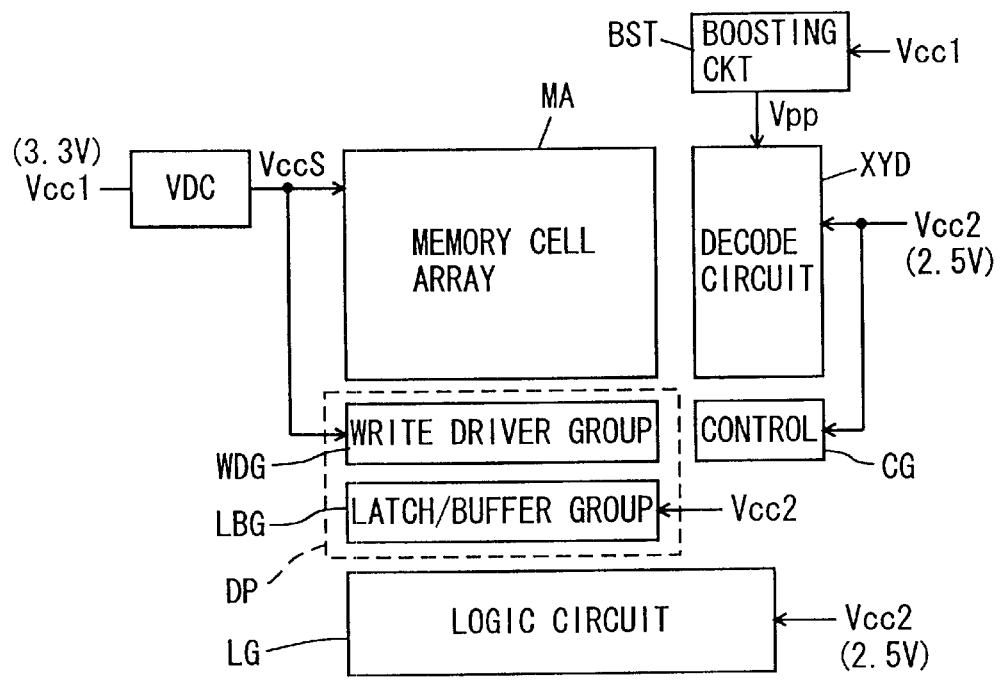
FIG. 29 is a schematic representation of a power supply arrangement according to the second embodiment of the present invention.

FIG. 29 is a diagram representing an example of a power supply configuration. This power supply configuration is utilized in the first embodiment or the second embodiment. In FIG. 29, write driver group WDG in a data path DP receives as an operation power supply voltage a power supply voltage VccS from a voltage down converter VDC for down-converting external power supply voltage Vcc1. Power supply voltage VccS from voltage down converter VDC is also utilized as power supply voltage for driving a sense amplifier circuit inside a memory cell array MA.

A decode circuit XYD for selecting a memory cell in memory cell array MA is provided with an external power supply voltage Vcc2 and a boosted voltage Vpp from a boosting circuit BST for boosting external power supply voltage Vcc1. Boosted voltage Vpp is used to drive a word line. External power supply voltage Vcc2 is for example 2.5 V, and external power supply voltage Vcc1 is for example 3.3 V.

Further, external power supply voltage Vcc2 is provided as operation power supply voltage to logic circuit LG, a latch/buffer group contained in data path DP, and control circuit CG.

In the arrangement shown in FIG. 29, the write driver only drives the write data line up to sense power supply voltage level so that a data line amplitude greater than necessary is not created.

In write driver group WDG, however, 128 write drivers are provided for each memory cell array, and the total of 256 bits of write drivers operate simultaneously. When power supply voltage VccS from voltage down converter circuit VDC is utilized, in the data write operation, sense power supply voltage VccS may be significantly lowered so that an accurate data write cannot be performed (i. e. destruction of normal memory cell data caused by malfunctioning of the sense amplifier circuit due to sense power supply noise). Although the sense amplifier circuit consumes a large amount of current during this operation, as far as the power supply voltage becomes stable within a prescribed period, the sense amplifier circuit can sense and amplify memory cell data by accurate sensing operation. Thus, the response speed of voltage down converter VDC is relatively slowed, and it is possible that the drop in power supply voltage VccS cannot be sufficiently compensated for during the write operation of the write driver group.

Consequently, as shown in FIG. 27, external power supply voltage Vcc is utilized for a write driver.

Figure 30:
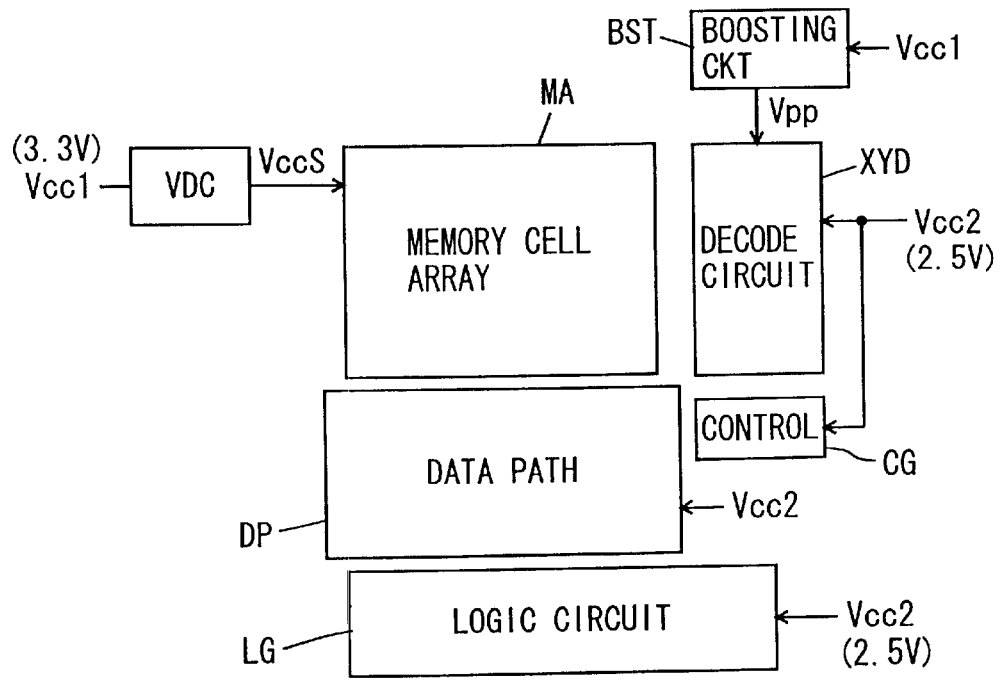
FIG. 30 is a diagram representing a second example of a power supply arrangement according to the second embodiment of the present invention.

FIG. 30 is a diagram representing a power supply distribution according to the third modification. In the arrangement shown in FIG. 30, external power supply voltage Vcc2 is provided to data path DP. A circuit contained in data path DP operates according to external power supply voltage Vcc2. A write driver group also operates according to external power supply voltage Vcc2. Other parts of the power supply layout configuration is the same as those shown in FIG. 29.

When external power supply voltage Vcc2 is applied to a write driver group as an operation power supply voltage, the amplitude of charging/discharging of the write data line in a write driver operation becomes large so that, though the operating current increases, power consumption can be reduced. More specifically, when sense power supply voltage VccS is utilized, sense power supply voltage VccS is generated from external power supply voltage Vcc1, and the current is provided from external power supply voltage Vcc1. If the amplitude of a signal line is 2.0 V, then the consumed power would be proportional to 2.0 V·3.3 V. On the other hand, when the write data line is driven using only external power supply voltage Vcc2, consumed power would be proportional to 2.0 V·2.0 V. Thus, power consumption is lower when only external power supply voltage Vcc2 is used to drive the write data line.

Figure 31:
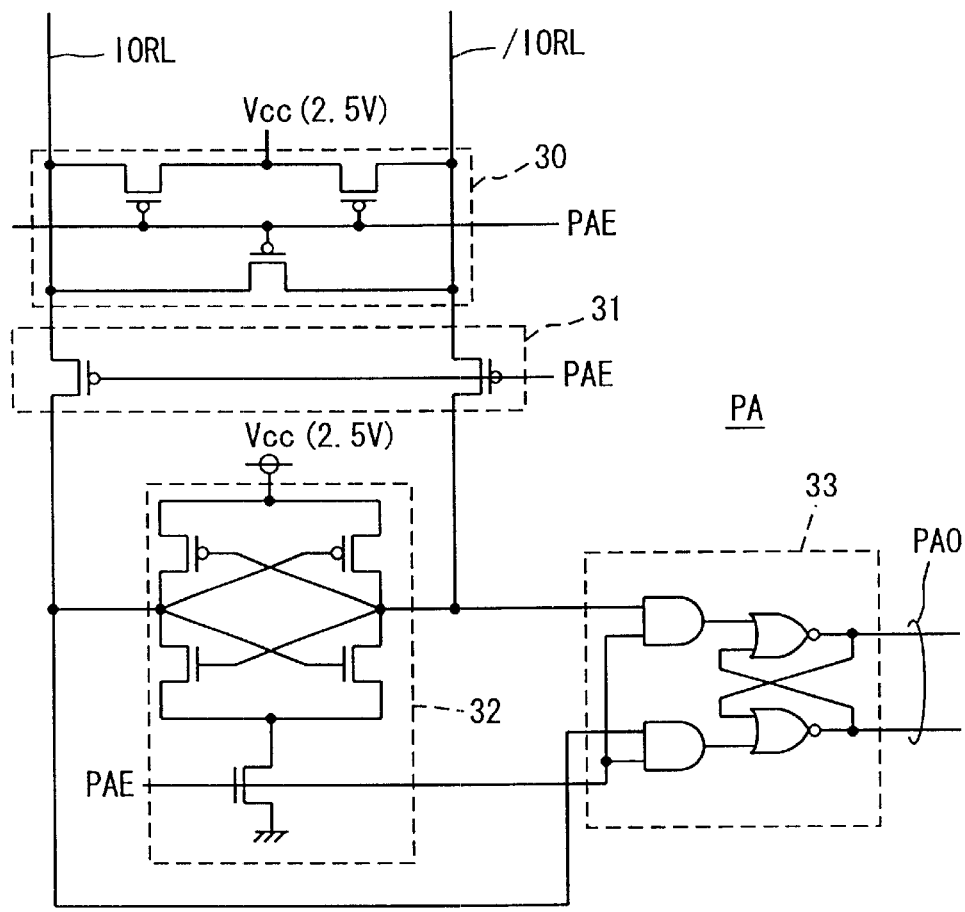
FIG. 31 is a schematic representation of an arrangement of a preamplifier in the case of the voltage distribution as shown in FIG. 30.

FIG. 31 is a diagram representing an arrangement of a preamplifier. In FIG. 31, a preamplifier PA includes a read data line equalizing/precharging circuit 30 activated when preamplifier activating signal PAE is deactivated, for precharging and equalizing read data lines IORL and /IORL to external power supply voltage Vcc level, a CMOS inverter latch circuit 32 activated in response to the activation of preamplifier activating signal PAE for differentially amplifying the provided data, a read data line isolating gate 31 rendered non-conductive in the activation of preamplifier activating signal PAE for disconnecting CMOS inverter latch circuit 32 and read data lines IORL and /IORL, and a flip-flop 33 for taking in an output signal of CMOS inverter latch circuit 32 in the activation of preamplifier activating signal PAE and for attaining the latching state during the deactivation of preamplifier activating signal PAE. Flip-flop 33 outputs output data PAO of a preamplifier circuit.

CMOS inverter latch circuit 32 operates using external power supply voltage Vcc (for example, 2.5 V) as one operation power supply voltage. With the use of read data line isolating gate 31, the load on a sense node can be alleviated during the sensing and amplifying operation of CMOS inverter latch circuit 32 so that the sensing and amplifying operation can be performed at a high-speed. The arrangement of CMOS inverter latch circuit 32 is the same as sense amplifier circuit SA, and the small potential difference provided from read data lines IORL and /IORL is amplified at a high speed. Flip-flop 33 is formed of an AND circuit operating as a pass gate and an NOR circuit forming a latch circuit, and during the activation of preamplifier activating signal PAE, passes an output signal of CMOS inverter latch circuit 32 via the AND circuit and latches by the NOR circuit. When preamplifier activating signal PAE is deactivated, data is latched by the NOR circuit.

As shown in FIG. 31, the operation power supply voltage of preamplifier PA is external power supply voltage Vcc, and the amplitudes of read data lines IORL and /IORL attain external power supply voltage Vcc level. By utilizing an external power supply voltage in a preamplifier, the power consumed during the preamplifier operation is reduced and the sense amplifier power supply is kept from being reduced. In addition, all operation power supply voltages in a data path can be set to external power supply voltage Vcc2 (Vcc (=2.5 V)).

As seen from the above, according to the second embodiment of the present invention, since a write gate is formed of a transfer gate receiving at its gate a data mask signal and a transfer gate receiving a write column select signal connected in series, the load for the write driver is alleviated and a high-speed data write becomes possible. Moreover, by utilizing a bi-state buffer as a write driver, the precharging period of the write data line is no longer required, and a shorter write cycle time is achieved.

Further, by utilizing external power supply voltage Vcc as a power supply voltage for a write driver, the malfunctioning of the sense amplifier circuit and of the write driver due to the lowered sense amplifier power supply voltage, can be prevented, so that data write can be performed accurately, and power consumption can be reduced.

Third Embodiment

Figure 32:
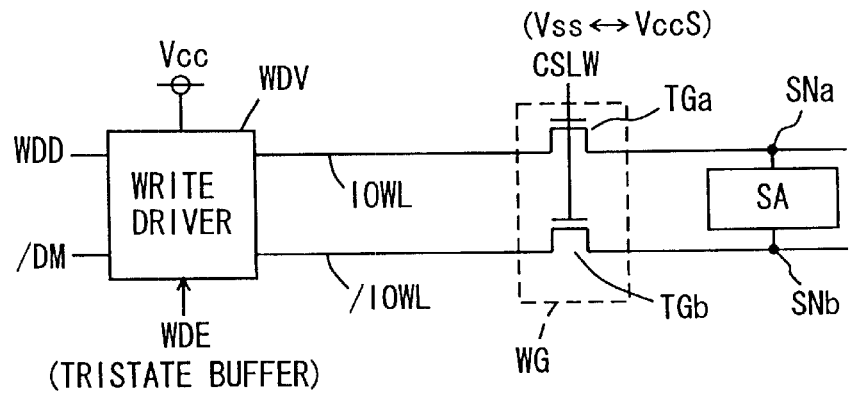
FIG. 32 is a schematic representation of an arrangement of a third embodiment of the present invention.

FIG. 32 is a schematic representation of an arrangement of the main portion of a third embodiment of the present invention. In the arrangement shown in FIG. 32, write driver WDV operates using external power supply voltage Vcc as one operation power supply voltage. Write driver WDV has the same arrangement as that shown in the above FIG. 9, and is formed of a tristate buffer.

Write gate WG includes transfer gates TGa and TGb receiving at their control gates a signal on write column select line CSLW. The signal on write column select line CSLW changes between ground voltage Vss and sense amplifier power supply voltage VccS. Sense amplifier circuit SA operates using as an operation power supply voltage, and drives one of sense nodes SNa and SNb to the level of sense amplifier power supply voltage VccS.

With the arrangement shown in FIG. 32, write driver WDV attains the output high impedance state during a mask write operation, and data lines IOWL and /IOWL maintain the state of being precharged and equalized to external power supply voltage Vcc. Even when external power supply voltage Vcc is set at a voltage of, for example, 1.2 V, that is lower than sense amplifier power supply voltage VccS (=2.0 V), the stored charge flows into the sense amplifier circuit from the parasitic capacitance of write data lines IOWL and /IOWL. At this time, the voltage levels of the write data lines, however, are the same, and sense amplifier circuit SA holds the data stably if the sense amplifying operation is completed. In addition, even before the completion of the sensing operation, the external power supply voltage is near the bit line precharge voltage level (1.0 V), so that inversion of sense amplifier data does not occur. During a data write, write data lines IOWL and /IOWL are driven according to write data WDD. When external power supply voltage Vcc is low, i. e. 1.2 V, if write column select signal CSLW is at the voltage level of 2.0 V of sense amplifier power supply voltage, the "H" level of external power supply voltage Vcc can be transmitted to sense amplifier circuit SA without the threshold voltage loss across transfer gates TGa and TGb. Thus, charge/discharge current of the write data lines as well as power consumption can be reduced.

Modification

Figure 33:
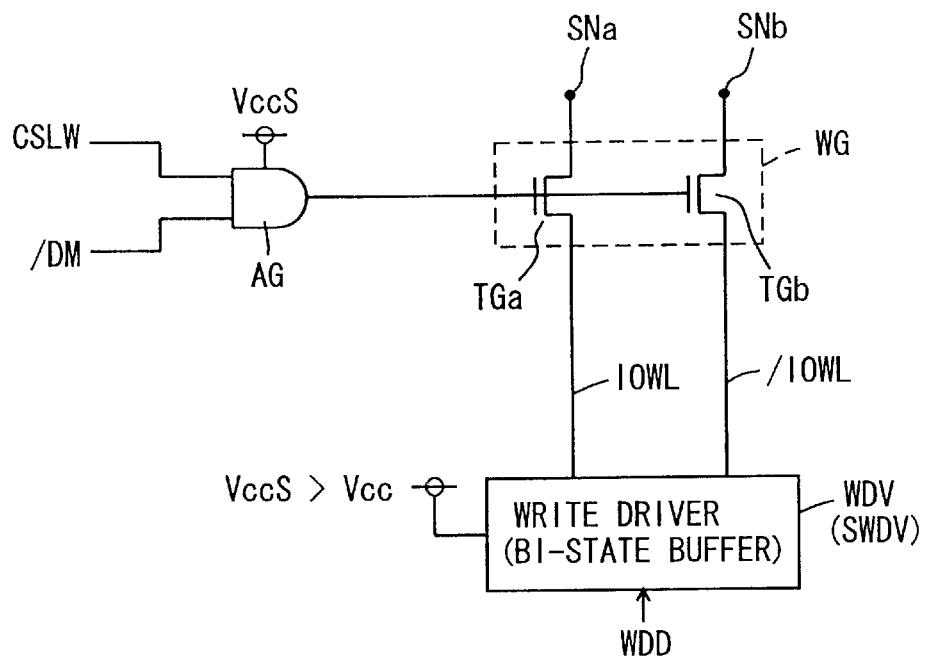
FIG. 33 is a schematic representation of an arrangement of a modification of a third embodiment according to the present invention.

FIG. 33 is a schematic representation of an arrangement of a modification of the third embodiment according to the present invention. In the arrangement shown in FIG. 33, an AND circuit AG for receiving write column select signal CSLW and data mask signal /DM is provided for write gate WG. AND circuit AG operates using sense amplifier power supply voltage VccS as one operation power supply voltage. Write gate WG includes transfer gates TGa and TGb for receiving at their gates an output signal of AND circuit AG.

Write driver WDV is a bi-state buffer, and normally drives write data lines IOWL and /IOWL according to write data WDD. During a data write, data mask signal /DM is at the "H" level, write column select signal CSLW is also at the "H" level, and the output signal of AND circuit AG attains the "H" level, and transfer gates TGa and TGb are made to conduct.

When write column select line CSLW is at the "L" level or when data mask signal /DM is at the "L" level, the output signal of AND circuit AG is at the "L" level, transfer gates TGa and TGb are in the non-conductive state, and write driver WDV is disconnected from the sense amplifier circuit (not shown). Therefore, as in the case described above, a voltage lower than sense amplifier power supply voltage VccS can be used as operation power supply voltage Vcc for the write driver to perform a data write operation. Thus, the time for precharging a write data line is no longer required. In addition, power consumption can be reduced due to the use of a lower external power supply voltage Vcc.

Further, AND circuit AG should be arranged such that it receives data mask signal /DM and write column select signal CSLW (a signal line and a signal on the signal line are indicated by the same reference characters). AND circuit AG is arranged in the free region where a sense amplifier band intersects a sub-word line decoders, for instance, so that the increase in the array area can be limited while a write column select signal at sense amplifier power supply voltage VccS can be transmitted to each write gate WG.

As seen from the above, according to the third embodiment of the present invention, since a column select signal is driven to the sense amplifier power supply voltage level, the power supply voltage of a write driver can be set at an external power supply voltage level lower than the sense amplifier power supply voltage, thereby significantly reducing power consumption.

Fourth Embodiment

Figure 34:
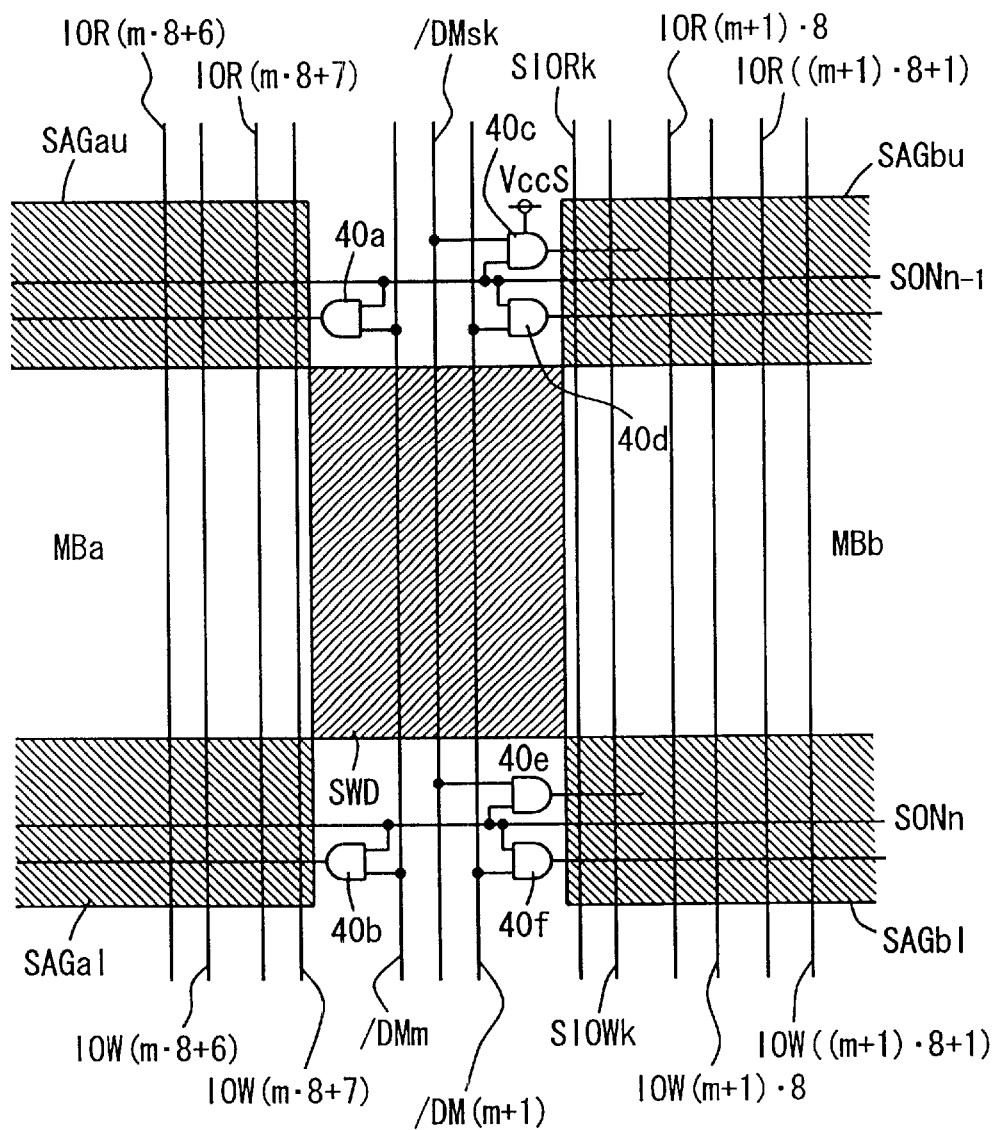
FIG. 34 is a schematic representation of an arrangement of a fourth embodiment of the present invention.

FIG. 34 is a schematic representation of an arrangement of the main portion of a semiconductor memory device according to a fourth embodiment of the present invention. In FIG. 34, two memory cell blocks MBa and MBb and a sub-word line driver group SWDG provided between the memory cell blocks are shown.

Sense amplifier groups SAGau and SAGal are disposed on opposite sides of memory cell block MBa in the column direction, and sense amplifier groups SAGbu and SAGbl are disposed on opposite sides of memory cell block MBb in the column direction. Sense amplifier activating signal SONn−1 is provided to sense amplifier circuits contained in sense amplifier groups SAGau and SAGbu. Sense amplifier activating signal SONn is provided to sense amplifier circuits contained in sense amplifier groups SAGal and SAGbl.

Read data line pairs IOR(m·8+6) and IOR(m·8+7) and write data line pairs IOW(m·8+6) and IOW(m·8+7) are disposed on memory cell block MBa. Here, m=0 to 15.

Signal lines for transmitting data mask signals /DMm and /DM(m+1) and a spare data mask signal /DMsk are provided over the region where sub-word line driver SWD is provided.

On memory cell block MBb, a spare read data line pair SIORk and a spare write data line pair SIOWk as well as write data line pairs IOW((m+1)·8)and IOW((m+1)·8+1), and read data line pairs IOR((m+1)·8) and IOR((m+1)·8+1) are provided.

An AND circuit for receiving the data mask signal and the sense amplifier activating signal to generate a local data mask signal is arranged in the portion where a sub-word line driver group SWDG disposing region intersects a sense amplifier group disposing region. Thus, an AND circuit 40a for receiving sense amplifier activating signal SONn−1 and data mask signal /DMm is provided for sense amplifier groups SAGau, and an AND circuit 40b for receiving sense amplifier activating signal SONn and data mask signal /DMm is provided for sense amplifier groups SAGal.

For sense amplifier groups SAGbu, an AND circuit 40c for receiving sense amplifier activating signal SONn−1 and spare data mask signal /DMsk as well as an AND circuit 40*d* for receiving sense amplifier activating signal SONn−1 and data mask signal /DM(m+1) is provided.

For sense amplifier group SAGbl, an AND circuit 40*e* for receiving spare data mask signal /DMsk and sense amplifier activating signal SONn as well as an AND circuit 40*f* for receiving sense amplifier activating signal SONn and data mask signal /DM(m+1) is provided.

Each of these AND circuits 40*a* to 40*f* receives sense amplifier power supply voltage VccS as one operation power supply voltage. Moreover, local data mask signals from these AND circuits 40*a* to 40*f* are provided to write gates (64 write gates) corresponding to 8-bit write data line pairs IOW arranged for the corresponding sense amplifier groups.

Signal lines for transmitting data mask signal /DM (representing data mask signals /DM0 to /DM15) extending in the column direction are provided in common to the memory cell blocks in a corresponding column block.

Sense amplifier activating signals SONn−1 and SONn are driven to the active state in the activation of a corresponding row block. In a column access, a column is accessed for data writing in the row block in the active state. For instance, when sense amplifier activating signal SONn−1 is in the inactive state, sense amplifier groups SAGau and SAGbu are inactive, and memory cell blocks MBa and MBb are in the non-selected state (precharged state). Therefore, column access is not performed for memory cell blocks MBa and MBb in this case. The active/inactive state of the data mask signal does not affect the write gates disposed in sense amplifier groups SAGau and SAGbu (since a write column select signal maintains the inactive state). Thus, disabling AND circuits 40*a*, 40*c,* and 40*d* by sense amplifier activating signal SONn−1 eliminates the need to drive a data mask signal for a non-selected row block so that the power consumed by the drive circuit that drives the data mask signal can be saved.

Figure 35:
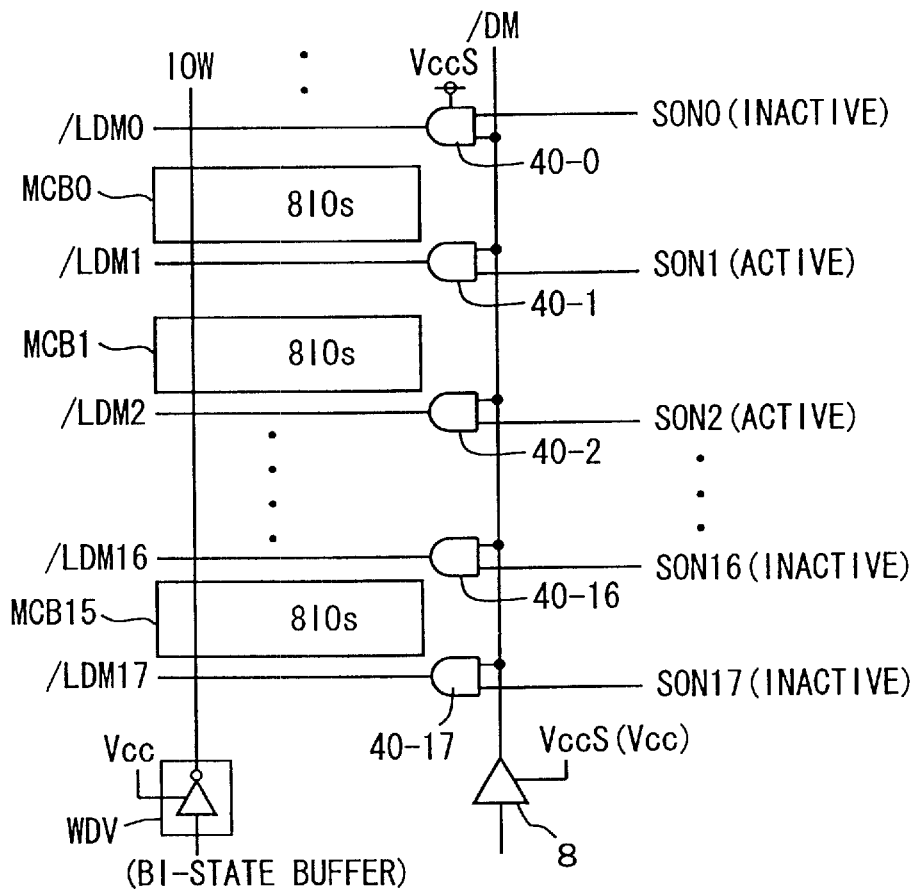
FIG. 35 is a schematic representation of an arrangement of a transmission path of a data mask signal in the fourth embodiment of the present invention.

FIG. 35 is a schematic representation of an arrangement of a portion related to one data mask signal /DM. In FIG. 35, 16 memory cell blocks MCB0 to MCB15 are disposed in alignment in the column direction. Data mask signal /DM from a DM latch 8 is provided in common to eight data write line pairs (8IOs) of these memory cell blocks MCB0 to MCB15. DM latch 8 operates using sense amplifier power supply voltage VccS as one operation power supply voltage. AND circuits 40-0 to 40-17 are provided corresponding to the respective memory cell blocks MCB0 to MCB15. Sense amplifier activating signals SON0 to SON17 are provided to the respective AND circuits 40-0 to 40-17. Each of AND circuits 40-0 to 40-17 generates a local data mask signal /LDMi for a corresponding memory cell block according to a corresponding sense amplifier activating signal SONi (i=0 to 17) and data mask signal /DM from DM latch 8.

Now, consider the operation in which a row block including a memory cell block MCB1 is in the selected state, and a column selection for memory cell block MCB1 is to be performed. In this case, sense amplifier activating signals SON1 and SON2 applied to the sense amplifier bands provided on either side of memory cell block MCB1 are in the active state, and the remaining sense amplifier activating signals SON0 and SON3 to SON17 are in the inactive state. (Here, only the one-page operation is considered.)

AND circuits 40-0, 40-3 to 40-17 are disabled, and local data mask signals /LDM0, ILDM3 to ILDM17 are all in the inactive state or at the "L" level, so that write gates are all in the non-conductive state. Local data mask signals /LDM1 and /LDM2 from AND circuits 40-1 and 40-2 are driven to the active state or the inactive state according to data mask signal /DM.

Thus, in the arrangement shown in FIG. 35, DM latch 8 is only required to drive a data mask signal line (global data mask line) existing in the column direction so that its load is alleviated.

Further, although AND circuits 40-0 to 40-17 respectively operate using sense amplifier power supply voltage VccS as one operation power supply voltage as shown in FIG. 34, two local data mask signals /LDM1 and /LDM2 are only charged/discharged for one row block, so that the consumed current of sense amplifier power supply voltage VccS can be reduced. Moreover, DM latch 8 is not required to drive data mask signal lines arranged for all row blocks but required to drive a global data mask line in the column direction only, so that the data mask signal can be set to the definite state at a high speed.

Furthermore, in a two-page mode operation, two row blocks are selected, and a sense amplifier activating signal for the two row blocks is driven to the active state. Although the column select operation is performed for one row block, the data mask signal, therefore, is required to drive local data mask lines for these two activated row blocks. Here, the charge/discharge current, however, is lower in comparison with the arrangement in which a data mask signal is driven for all row blocks, and consequently, the consumed current of the sense amplifier power supply voltage is reduced.

In the arrangement shown in FIG. 35, write driver WDV is formed by a bi-state buffer that receives external power supply voltage Vcc as one operation power supply voltage. External power supply voltage Vcc is utilized as the operation power supply voltage for DM latch 8 (shown in parentheses in FIG. 35) and sense amplifier power supply voltage VccS is provided as the operation power supply voltage to AND circuits 40-0 to 40-19, thereby reducing the consumed current of sense amplifier power supply voltage VccS. In this arrangement, the provision of a level converting function to AND circuits 40-0 to 40-19 can cope with the situation where the voltage level of external power supply voltage Vcc is lower than sense amplifier power supply voltage VccS.

Data mask signal /DM designates a write mask operation that allows a data write when at the "H" level and inhibits the data write when at the "L" level. In the arrangement in which the data mask signal inhibits the data write at the "H" level, however, NOR gates are used instead of AND circuits 40-0 to 40-17, and a sense amplifier activating signal SOP for activating a P sense amplifier is used as a sense amplifier activating signal. Consequently, even when a data mask signal is a positive logic signal, a data mask signal transmission line can be divided into a global mask data line and a local data mask line. Thus, in the similar manner, the data mask signal can be driven to the definite state, and in conjunction with the arrangement utilizing a bi-state buffer as a write driver, the write operation can be performed at a high speed and with low current consumption.

Fifth Embodiment

In an arrangement in which the write data is masked for each eight IO data line pairs as shown in FIG. 19, a write mask gate is connected in series to a column select gate as shown in FIG. 20 et. seq. so that the write data can be masked accurately. Moreover, a write driver can be implemented as a bi-state driver, and there is no need for a precharging operation of an internal write data line. Application of this configuration provided with such a write mask gate to different data bit widths is now considered.

Figure 36:
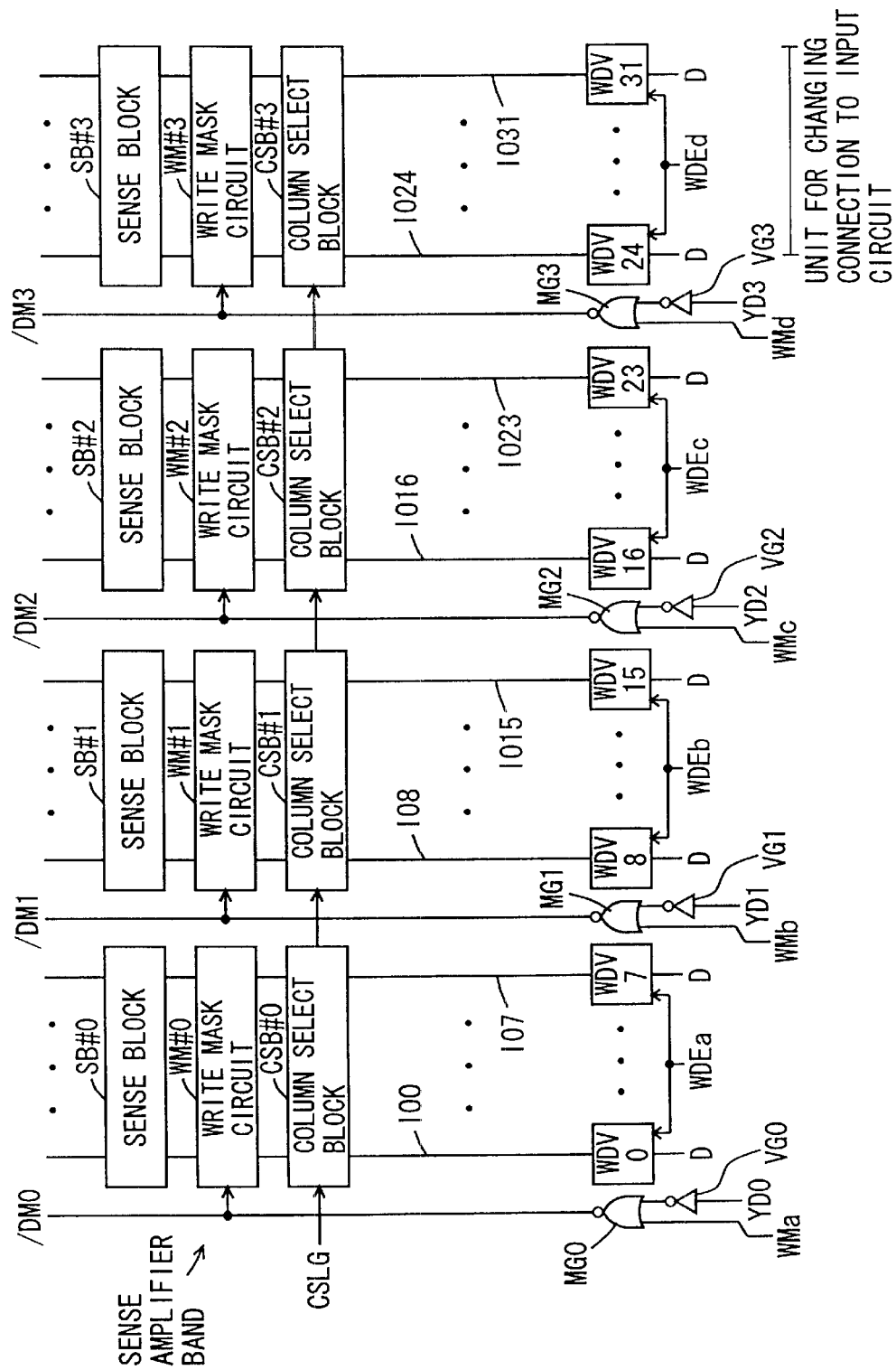
FIG. 36 is a schematic representation of an arrangement of a main portion of a semiconductor memory device according to a fifth embodiment of the present invention.

FIG. 36 is a schematic representation of an arrangement of a main portion of a semiconductor memory device (DRAM macro) according to the fifth embodiment of the present invention. For simplicity, FIG. 36 does not show a spare circuit and a latch circuit in a data path. An arrangement of a portion corresponding to IO data line pairs IO0 to IO31 of 32 bits is shown in FIG. 36.

As shown in FIG. 36, sense blocks SB#0 to SB#3 each having a prescribed number of sense amplifier circuits are disposed in a sense amplifier band. In each of sense blocks SB#0 to SB#3, eight sense amplifier circuits are arranged for each IO data line pair so that the total of sixty-four sense amplifier circuits are provided. Eight sense amplifier circuits form one sense amplifier unit, as will be described below.

Column select blocks CSB#0 to CSB#3 for selecting sense amplifier circuits contained in the corresponding sense blocks SB#0 to SB#3 in response to a column select signal CSLG on a column select line group are provided corresponding to sense blocks SB#0 to SB#3. Each of column select blocks CSB#0 to CSB#3 selects eight sense amplifier circuits from a corresponding one of sense blocks SB#0 to SB#3 according to column select signal CSLG on the column select line group and couples the eight sense amplifier circuits to the corresponding 8-bit IO data line pairs.

Write mask circuits WM#0 to WM#3 for inhibiting the connection between the corresponding IO data line pairs and sense blocks in response to the respective write mask instruction signals /DM0 to /DM3 are disposed between sense blocks SB#0 to SB#3 and column select blocks CSB#0 to CSB#3. Each of write mask circuits WM#0 to WM#3 inhibits the data write operation with eight IO data line pairs being a unit, as in the previous first embodiment.

Write drivers WDV0 to WDV31 for generating internal write data according to received data D for transmission to the corresponding IO data line pairs when activated are provided corresponding to IO data line pairs IO0 to IO31. IO data line pairs IO0 to IO31 are internal data line pairs for transmitting both write data and read data. For simplicity, no preamplifier circuit is shown in the figure.

Write drivers WDV0 to WDV31 are divided into write driver blocks corresponding to write mask circuits WM#0 to WM#3, and activation and inactivation are controlled on a block basis. Write drivers WDV0 to WDV7 are activated when a write driver enable signal WDEa is activated, and write drivers WDV8 to WDV15 are activated when a write driver enable signal WDEb is activated. Write drivers WDV16 to WDV23 are activated when a write driver enable signal WDEc is activated, and write drivers WDV24 to WDV31 are activated when a write driver enable signal WDEd is activated. Write driver enable signals WDEa to WDEd are generated based on a data line selecting address according to the input/output data bit width.

Inverter circuits VG0 to VG3 for receiving internal data line selecting signals YD0 to YD3, and NOR (mask gate) circuits MG0 to MG3 for receiving write mask instructions WMa to WMd and output signals from inverter circuits VG0 to VG3 to generate write mask instruction signals /DM0 to /DM3 respectively are provided for the respective write mask circuits WM#0 to WM#3. Data line selecting signals YD0 to YD3 are generated according to a column address signal corresponding to the write data bit width. Moreover, the correspondence between write mask instruction applied from an outside and internal mask instructions DMa to DMd is changed according to the write data bit width.

When the input data bit width is changed, the connections between these write drivers WDV0 to WDV31 and data input circuits are changed individually per write driver group corresponding to each of write mask circuits WM#0 to WM#3. Internal data line selecting signals YD0 to YD3 select IO data line groups. When corresponding IO data line pair groups are in the non-selected state, these internal data line selecting signals YD0 to YD3 attain the logic low or "L" level of the non-selected state. Responsively, output signals from NOR circuits MG0 to MG3 attain the "L" level, and write mask instruction signals /DM0 to /DM3 attain the "L" level of the active state so that write mask circuits WM#0 to WM#3 enter the write mask state. Consequently, the connection of a non-selected IO data line pair to a sense block is inhibited so that transmission of the precharge voltage of the IO data lines to sense blocks SB#0 to SB#3 is prevented, and the write data can be accurately written into a selected memory cell even when the input data bit width is changed.

Figure 37:
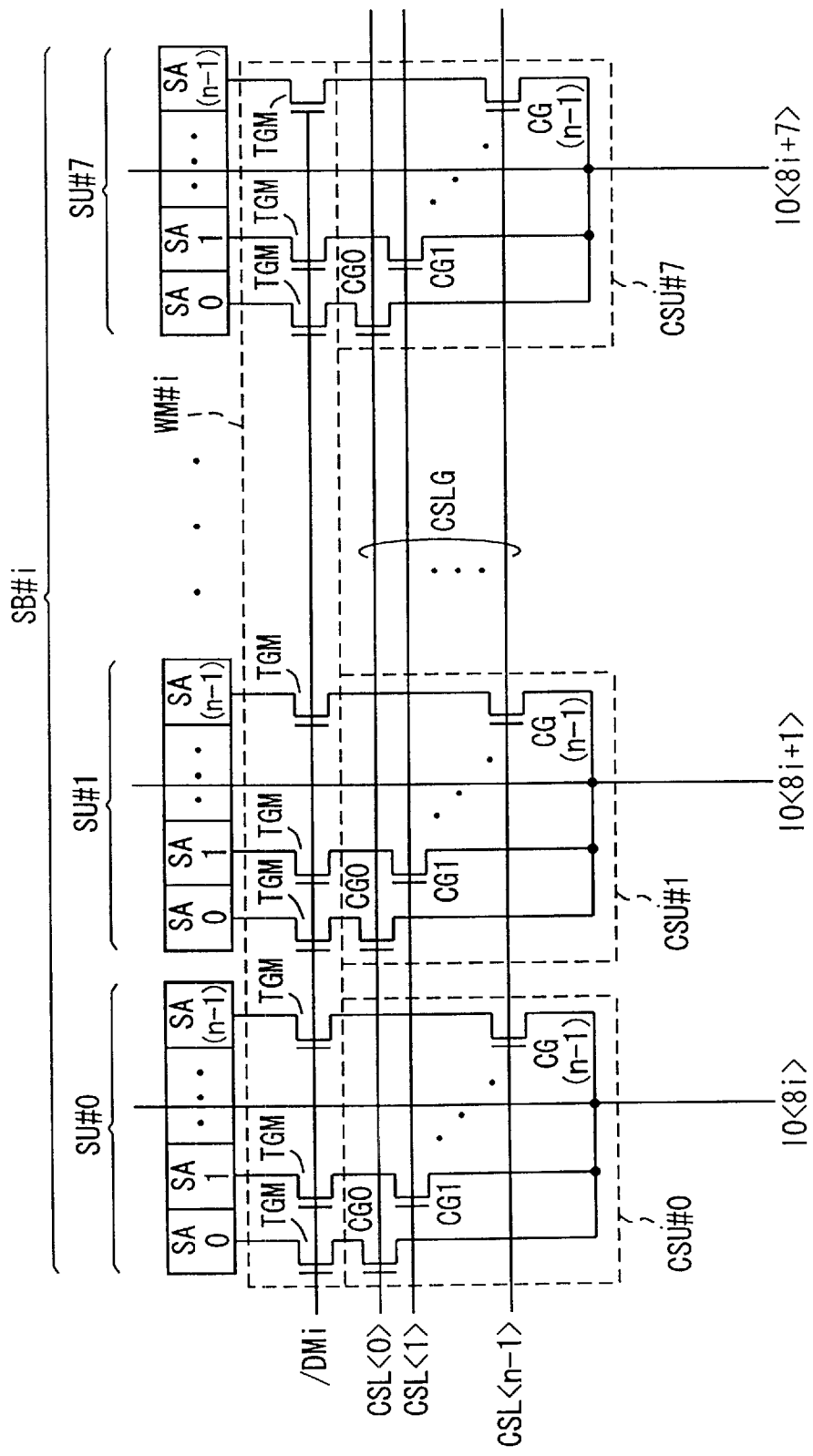
FIG. 37 is a schematic representation of arrangements of a sense block, a write mask circuit, and a column select block shown in FIG. 36.

FIG. 37 is a schematic representation of an arrangement of a portion related to one sense block SB#i. As shown in FIG. 37, sense block SB#i includes sense amplifier units SU#0 to SU#7 provided corresponding to 8-bit IO data line pairs IO<8$i$> to IO<8$i$+7>. Each of sense amplifier units SU#0 to SU#7 includes n sense amplifier circuits SA0 to SA(n−1). A write mask circuit WM#i provided corresponding to sense block SB#i includes write mask gates TGM provided corresponding to sense amplifier circuits SA0 to SA(n−1) contained in each of sense amplifier units SU#0 to SU#7. A write mask gate TGM is rendered non-conductive when a write mask instruction signal /DMi is activated (or is at the "L" level), and disconnects sense block SB#i from IO data line pairs IO<8$i$> to IO<8$i$+7> regardless of the state of a column select signal CSLG.

Column select block CSB#i includes column select units CSU#0 to CSU#7 provided corresponding to sense amplifier units SU#0 to SU#7. Each of column select units CSU#0 to CSU7 includes column select gates CG0 to CG(n−1) provided corresponding to sense amplifier circuits SA0 to SA(n−1) contained in a corresponding sense amplifier unit, for connecting the corresponding sense amplifier circuits to the corresponding IO data line pairs in response to selected column designating signals CSL<0> to CSL<n−1>. These selected column designating signals CSL<0> to CSL<n−1> form a column select signal group CSLG and are provided in common to sense blocks contained in a sense amplifier band. On the other hand, write mask instruction signal /DMi is provided only to a write mask circuit WM#i provided corresponding to sense block SB#i, and the mask control of a data write operation on a sense block basis is performed.

Figure 38:
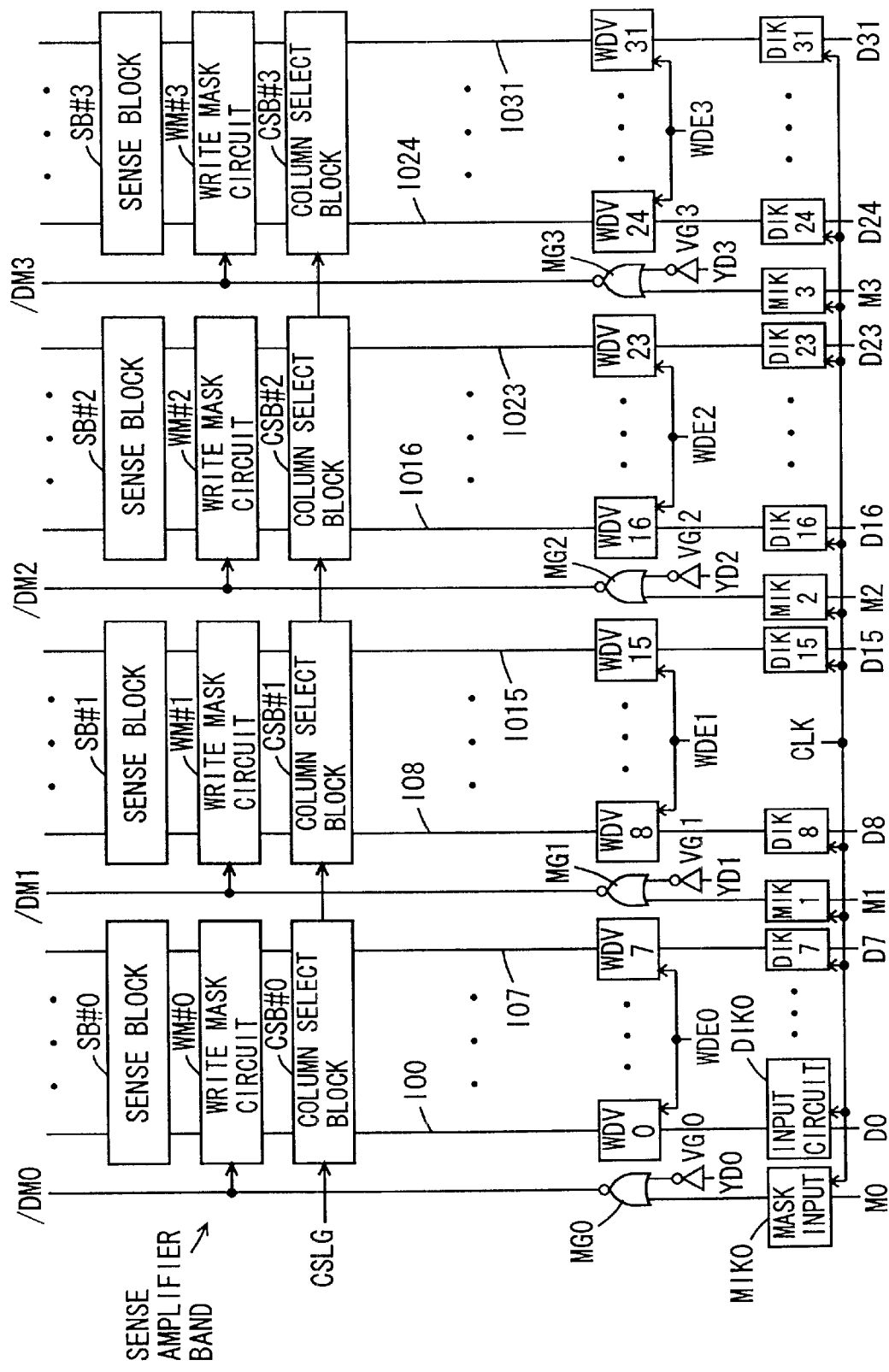
FIG. 38 is a schematic representation of an arrangement of a data write portion of the fifth embodiment of the present invention.

FIG. 38 is a schematic representation of an arrangement in which data are written in parallel to all of IO data line pairs IO0 to IO31. As shown in FIG. 38, data input circuits DIK0 to DIK31 are provided corresponding to write drivers WDV0 to WDV31. Mask input circuits MIK0 to MIK3 are provided corresponding to mask gate (NOR) circuits MG0 to MG3. Input circuits DIK0 to DIK31 and input circuits MIK0 to MIK3 take in data D0 to D31 and data mask instruction signals M0 to M3 in synchronization with a clock signal CLK.

A write driver enable signal WDE0 is applied to write drivers WDV0 to WDV7, and a write driver enable signal WDE1 is applied to write drivers WDV8 to WDV15. A write driver enable signal WDE2 is applied to write drivers WDV16 to WDV23, and a write driver enable signal WDE3 is applied to write drivers WDV24 to WDV31. In the arrangement shown in FIG. 38, IO data line pairs IO0 to IO31 are simultaneously selected. Consequently, internal data line selecting signal YD0 to YD3 all attain the selected state, and output signals from inverter circuits VG0 to VG3 attain the "L" level. Mask gate circuit MG0 to MG3 generate write mask instruction signals /DM0 to /DM3 according to data mask instruction signals M0 to M3 received from mask input circuits MIK0 to MIK3. Thus, in the configuration shown in FIG. 38, corresponding write mask circuits WM#0 to WM#3 are in the conductive state when data mask instruction signals /DM0 to /DM3 are in the non-selected state so that IO data line pairs IO0 to IO31 are connected to sense blocks SB# to SB#3 via the respective column select blocks CSB#0 to CSB#3.

As will be described later, write driver enable signals WDE0 to WDE3 are all driven to the active state according to a write driver enable signal WDE, and write drivers WDV0 to WDV31 are activated at the same time.

Figure 39:
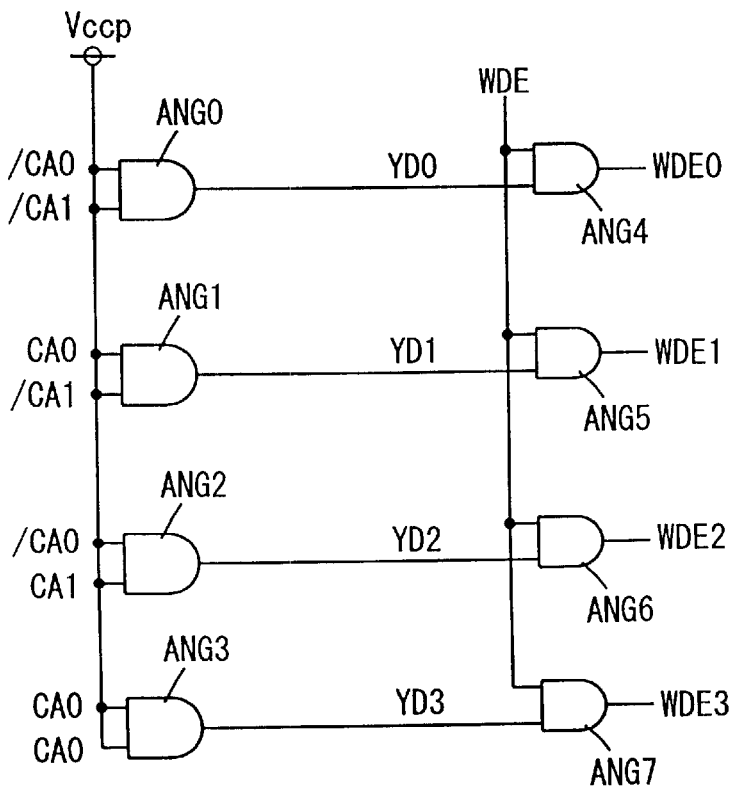
FIG. 39 is a schematic representation of an arrangement of a write driver enable signal generating portion shown in FIG. 38.

FIG. 39 is a schematic representation of an arrangement of a write driver enable signal generating portion. As shown in FIG. 39, AND gates ANG0 to ANG3 each receiving a peripheral power-supply voltage VccP at both inputs, to generate an IO data line pair selecting signal are provided. AND gate ANG0 corresponds to column address bits /CA0 and /CA1 and generates an internal data line selecting signal YD0. AND gate ANG1 corresponds to column address bits CA0 and /CA1 and generates an internal data line selecting signal YD1. AND gate ANG2 corresponds to column address bits /CA0 and CA1 and generates an internal data line selecting signal YD2. AND gate ANG3 corresponds to column address bits CA0 and CA1 and generates an internal data line selecting signal YD3.

Write driver enable signals WDE0 to WDE3 are generated by AND gates ANG4 to ANG7 respectively receiving internal data line selecting signals YD0 to YD3 output from AND gates ANG0 to ANG3 and a write driver enable signal WDE.

In a 32-bit arrangement, data line selecting signals YD0 to YD3 from AND gates ANG0 to ANG3 all attain the selected state of the logic high or "H" level, and column address bits CA0 and CA1 are degenerated. Consequently, write driver enable signals WDE0 to WDE3 are driven to the active state according to the main write driver enable signal WDE.

Figure 40:
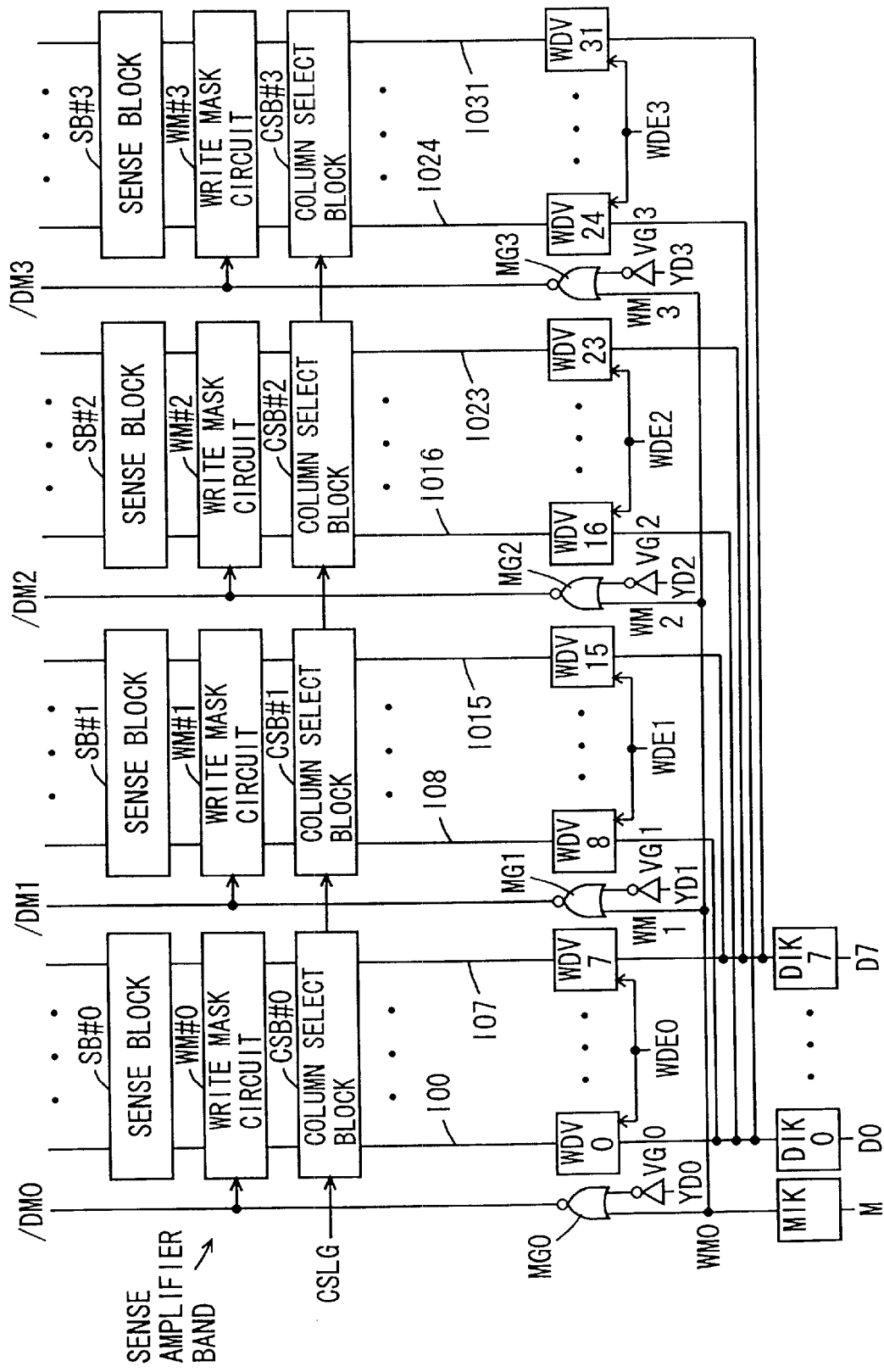
FIG. 40 is a schematic representation of another arrangement of the data write portion of the fifth embodiment of the present invention.

FIG. 40 is a schematic representation of an arrangement where the data bit width is reduced to one-fourth of its original size. As shown in FIG. 40, data input circuits DIK0 to DIK7 are provided corresponding for write data D0 to D7 of 8 bits, and a mask input circuit MIK is provided for receiving a mask instruction signal M. Data input circuits DIK0 to DIK7 are coupled in parallel to write drivers WDV0 to WDV7, and are connected in parallel to write drivers WDV8 to WDV15, respectively. Moreover, data input circuits DIK0 to DIK7 are coupled to write drivers WDV16 to WDV23 respectively, and are further coupled to write drivers WDV24 to WDV31 respectively.

Figure 41:
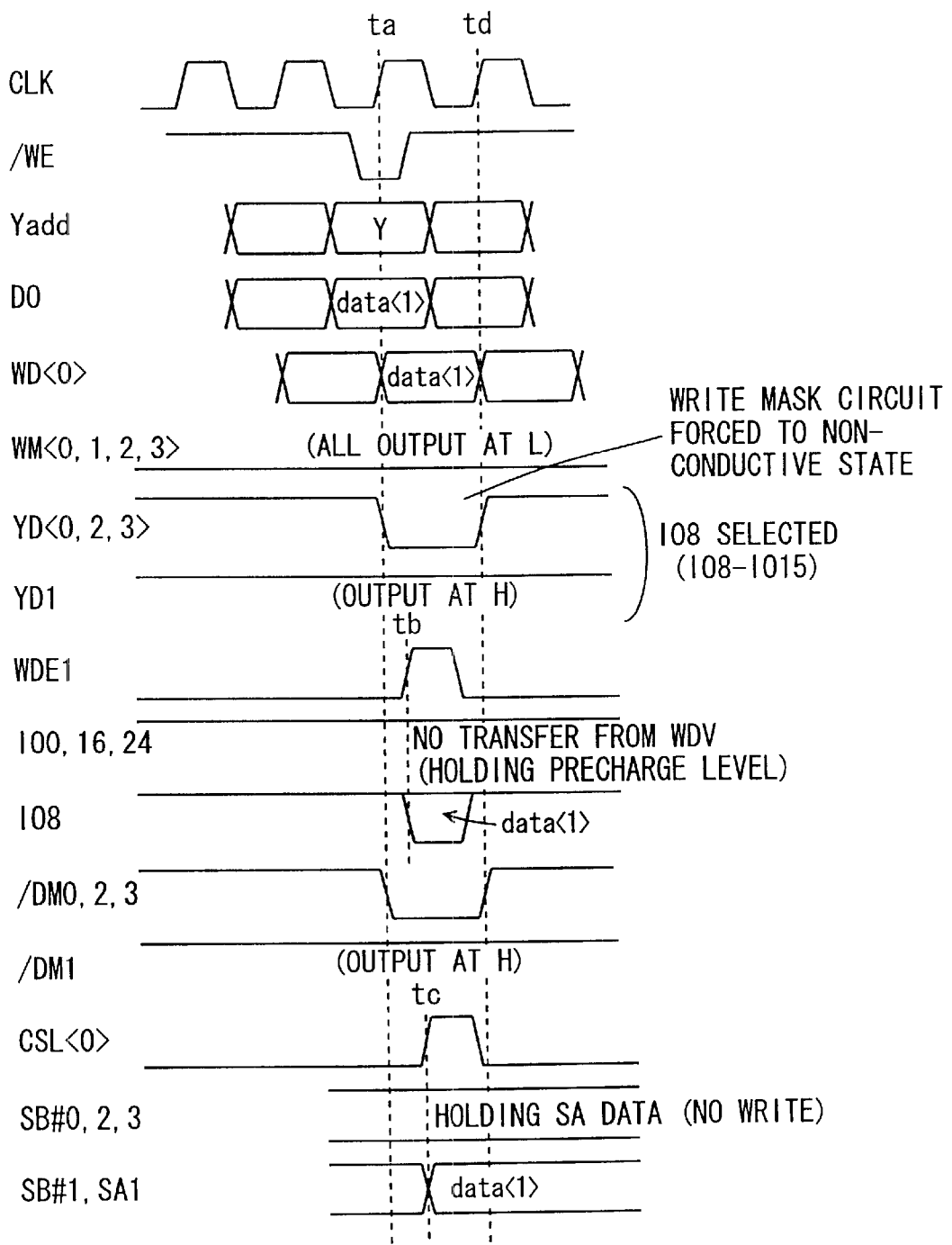
FIG. 41 is a timing chart representing a data write operation of a semiconductor memory device shown in FIG. 40.

Thus, data input circuit DIK0, for instance, is coupled to four write drivers: write drivers WDV0, WDV8, WDV16, and WDV24. One group of IO data line pairs is selected according to internal data line selecting signals YD0 to YD3 and the data write operation is performed. The arrangements of other parts are the same as those shown in FIG. 38 so that the same reference characters are allocated to the corresponding parts whose descriptions are not repeated. Now, an operation of a write circuit shown in FIG. 40 will be described with reference to the timing chart shown in FIG. 41.

At the leading edge of a clock signal CLK at time ta, a write command is supplied (a write enable signal /WE is set to the active state of the "L" level), and the current column address signal Yadd is taken in, and internal data line selecting signals YD0 to YD3 are generated. Now, let us consider a case in which the group of IO data line pairs IO8 to IO15 is selected. In this case, internal data line selecting signal YD1 maintains the "H" level, while data line selecting signals YD0, YD2, and YD3 are rendered inactive. At this time, data input circuits DIK0 to DIK7 take in the received data in response to the rise of clock signal CLK and generates internal write data WD. The operation in which write data WD<0> is generated from data data <1> provided to an input circuit DIK0 will be discussed with reference to FIG. 41.

Mask instruction signal M is set at the "L" level, and an internal mask instruction signal WM<0;3> from mask input circuit MIK is at the "L" level. On the other hand, mask gate circuits MG0, MG2, and MG3 set write mask instruction signals /DM0, /DM2, and /DM3 all to the active state of the "L" level in response to the fall of internal data line selecting signals YD0, YD2, and YD3. Thus, write mask circuits WM#0, WM#2 and VVM#3 are all rendered non-conductive, and sense blocks SB#0, SB#2 and SB#3 are disconnected from corresponding IO data line-pairs IO0 to 1O7 and IO16 to IO31.

On the other hand, in mask gate circuit MG1, internal data line selecting signal YD1 is at the "H" level and internal mask instruction signal WM1 is at the "L" level. Write data mask instruction signal /DM1 maintains the "H" level, and mask write circuit WM#1 maintains the conductive state.

At time tb, write driver enable signal WDE is activated, and write driver enable signal WDE1 for write drivers WDV8 to WDV15 is activated according to data line selecting signal YD1, and write drivers WDV8 to WDV15 drive respective IO data line pairs IO8 to IO15 according to data provided from data input circuits DIK0 to DIK7. Write driver WDV8 receives the write data from data input circuit DIK0 and drives IO data line pair IO8 according to write data data <1>. On the other hand, write drivers WDV0, WDV16, and WDV24 are in the inactive state, and IO data line pairs IO0, IO16, and I024 maintain the precharged level (power-supply voltage VccP level).

At time tc, a selected column designating signal CSL<0> is driven to the active state, and column select gate CG0 is rendered conductive for each of sense amplifier units SU#0 to SU#7 in each of column select blocks CSB#0 to CSB#3. Write mask circuits WM#0, WM#2, and WM#3 are in the non-conductive state, while write mask circuit WM#1 is in the conductive state. Thus, when column select gate CG0 is rendered conductive in column select block CSB#1 according to selected column designating signal CSL<0>, data on IO data line pairs IO8 to IO15 are transmitted onto the corresponding sense amplifier circuits. In sense blocks SB#0, SB#2, and SB#3, the respective data held in sense amplifier circuits are maintained by write mask circuits WM#0, WM#2, and WM#3.

Therefore, by setting the connections between data input circuit and write driver in the unit of each of write mask circuits WM#0 to WM#3, write mask circuit for a non-selected write driver block is set to the non-conductive state so that the connection of a precharged IO data line pair to a sense amplifier circuit can be prevented, and thus, change in data held by a sense amplifier circuit can be prevented.

At time td, the write operation is completed. Internal data line selecting signals YD0, YD2, and YD3 return to the "H" level, write mask instruction signals /DM0, /DM2, and /DM3 return to the "H" level, and selected column designating signal CSL<0> returns to the "L" level.

Figure 42:
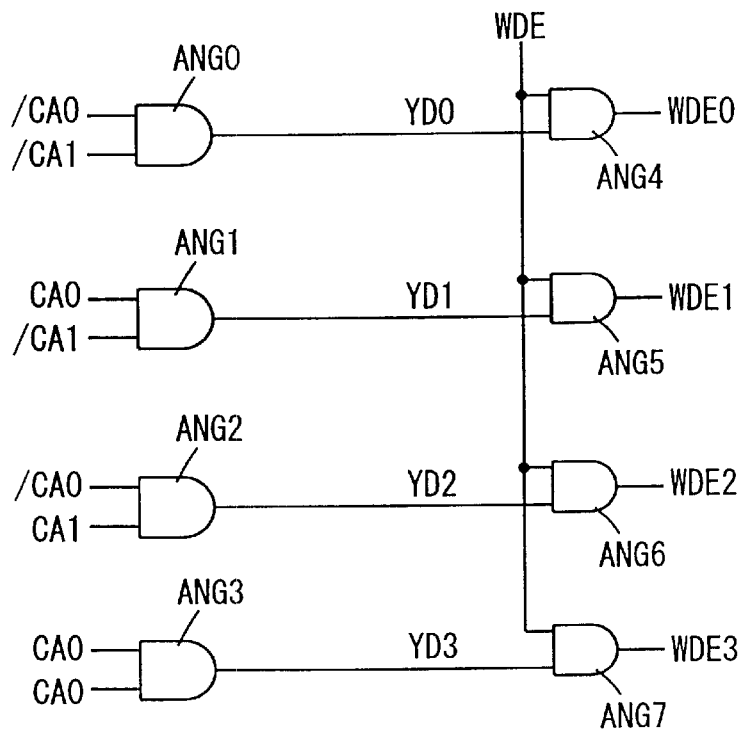
FIG. 42 is a schematic representation of an arrangement of a write driver enable signal generating portion shown in FIG. 40.

FIG. 42 is a diagram showing an arrangement of a write driver enable signal generating portion for the arrangement shown in FIG. 40. In the write driver enable signal generating portion shown in FIG. 42, corresponding column address bits are applied in place of a peripheral power-supply voltage VccP, to both inputs of each of the AND gates ANG0 to ANG3. The arrangements of other parts is the same as those shown in FIG. 39 and the corresponding parts are denoted by the same reference characters, and their detailed descriptions will not be repeated. In the arrangement shown in FIG. 42, AND gates ANG0 to ANG3 each operate as a decoder, and IO data line pair selecting signal YD0 to YD3 are generated according to column address bits CA0 and CA1. Only the write driver enable signals for a selected IO data line pair group is activated.

Figure 43:
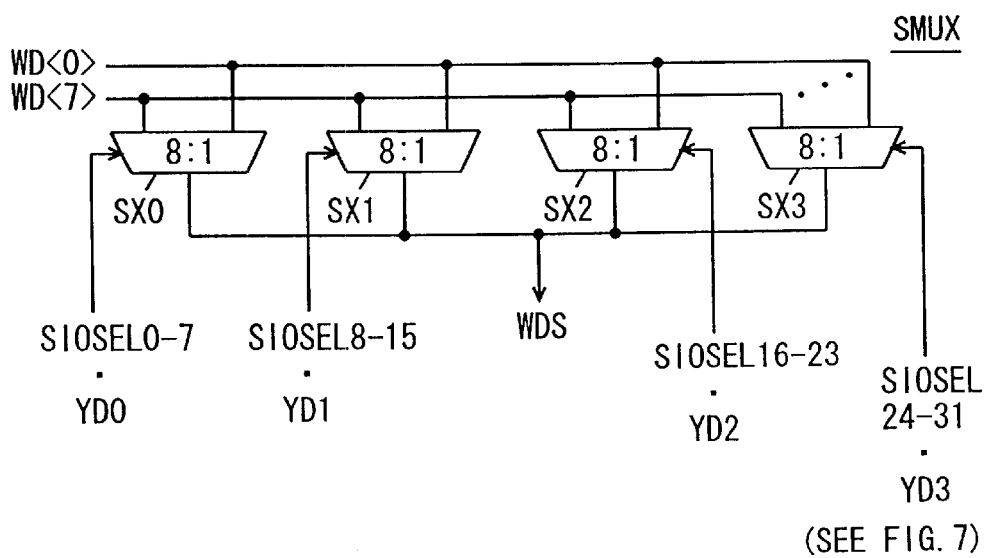
FIG. 43 is a schematic representation of an arrangement of a spare multiplexer for the arrangement shown in FIG. 40.

FIG. 43 is a schematic representation of an arrangement of a spare multiplexer SMUX shown in FIG. 7. In FIG. 43, the 32-bit data is reduced to the 8-bit data, and correspondingly spare multiplexer SMUX includes four switching circuits SX0 to SX3. Internal write data WD<0> to WD<7> of 8 bits are supplied to each of these switching circuits SX0 to SX3. Switching circuit SX0 performs the selecting operation according to AND-ed signals of each of spare data line selecting signals SIOSEL0 to SIOSEL7 and data line selecting signal YD0. Switching circuit SX1 performs the selecting operation according to AND-ed signals of each of spare data line selecting signals SIOSEL8 to SIOSEL15 and internal data line selecting signal YD1. Switching circuit SX2 performs the selecting operation according to AND-ed signals of each of spare data line selecting signals SIOSEL16 to SIOSEL23 and internal data line selecting signal YD2. Switching circuit SX3 performs the selecting operation according to AND-ed signals of each of spare data line selecting signals SIOSEL24 to SIOSEL31 and internal data line selecting signal YD3.

Thus, in the arrangement shown in FIG. 43, a selected IO data line pair group is designated by an internal data line selecting signal. Each of these spare data line selecting signals SIOSEL0 to SIOSEL31 is information including column address bits CA0 and CA1. When IO data line pairs selected by internal data line selecting signals YD0 to YD3 contain a defective IO data line pair, the switching of IO data line pairs is performed according to switching circuits SX0 to SX3. When no defective IO data line exist in the group of IO data line pairs selected by internal data line selecting signals YD0 to YD3, an output signal from switching circuit SX attains the high impedance state. In this case, spare write data WDS from spare multiplexer SMUX should be set to the logic state of setting the corresponding spare write driver to the output high impedance state. As shown in FIG. 10, a spare enable signal SPEN is applied to a write driver, and the write driver attains the output high impedance state when the spare is not used.

Figure 44:
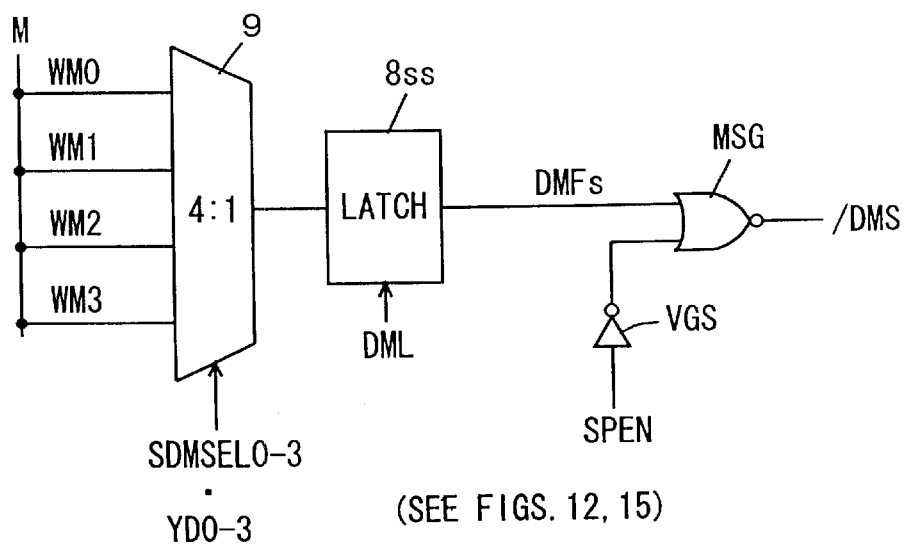
FIG. 44 is a schematic representation of an arrangement of a portion for generating a spare data mask for the arrangement shown in FIG. 40.

FIG. 44 is a diagram showing an arrangement of a circuit for generating a spare data mask instruction signal. The arrangement shown in FIG. 44 corresponds to the arrangements shown in FIGS. 12 and 15. Referring to FIG. 44, the spare data mask instruction signal generating portion includes a 4:1 selecting circuit 9 for selecting internal mask instruction signals WM0 to WM3 of 4 bits generated from the mask instruction signal M according to AND-ed signals of spare data mask selecting signals SDMSEL0 to SDMSEL3 and respective internal data line selecting signals YD0 to YD3, a latch circuit 8ss for latching an output signal of 4:1 selecting circuit 9 according to a control signal DML, an inverter circuit VGS for inverting spare enable signal SPEN, and a spare mask gate circuit MSG for receiving a write data mask instruction signal DMFs from latch circuit 8ss and an output signal from inverter circuit VGS to generate a spare data mask instruction signal /DMS. Spare data mask instruction signal /DMS from spare mask gate circuit MSG is applied to a write mask circuit including a write mask gate provided in a spare circuit.

In this case, although there is a time when an output signal from selecting circuit 9 enters the high impedance state, spare enable signal SPEN at that time is inactive, and spare data mask instruction signal /DMS is fixed at the "L" level so that a data write to a spare circuit is inhibited. When an IO data line pair group including a defective IO data line pair is selected, selecting circuit 9 selects one of internal mask signals WM0 to WM3. At this time, spare enable signal SPEN attains the "H" level, and spare data mask instruction signal /DMS from spare mask gate circuit MSG is set to a state corresponding to the state of write data mask instruction signal DMFs from latch circuit 8ss. Thus, even when the data bit width is reduced, spare determination can be performed to effect the defective bit repair with accuracy.

Moreover, spare data mask selecting signals SDMSEL0 to SDMSEL3 may simply be applied to 4:1 selecting circuit 9. Whether data line selecting signals YD0 to YD3 designate defective IO data lines or not is determined according to spare enable signal SPEN (a spare determination circuit, performs the determination with column address bits CA0 and CA1 being effective).

One write data mask instruction signal /DMm masks 8-bit IO data line pairs altogether. For instance, an IO data line pair connected to a data input node D0 is selected from IO data line pairs IO0, IO8, IO16, and IO24. In other words, the IO data line pair connected to a data input node Dn is selected from IO data line pairs IO (n+m·8), where n indicates an input data bit number, such as 0, 1, 2, . . . or Nmax, and m indicates a number for a write mask instruction signal, such as 0, 1, 2, . . . or Mmax.

Figure 45:
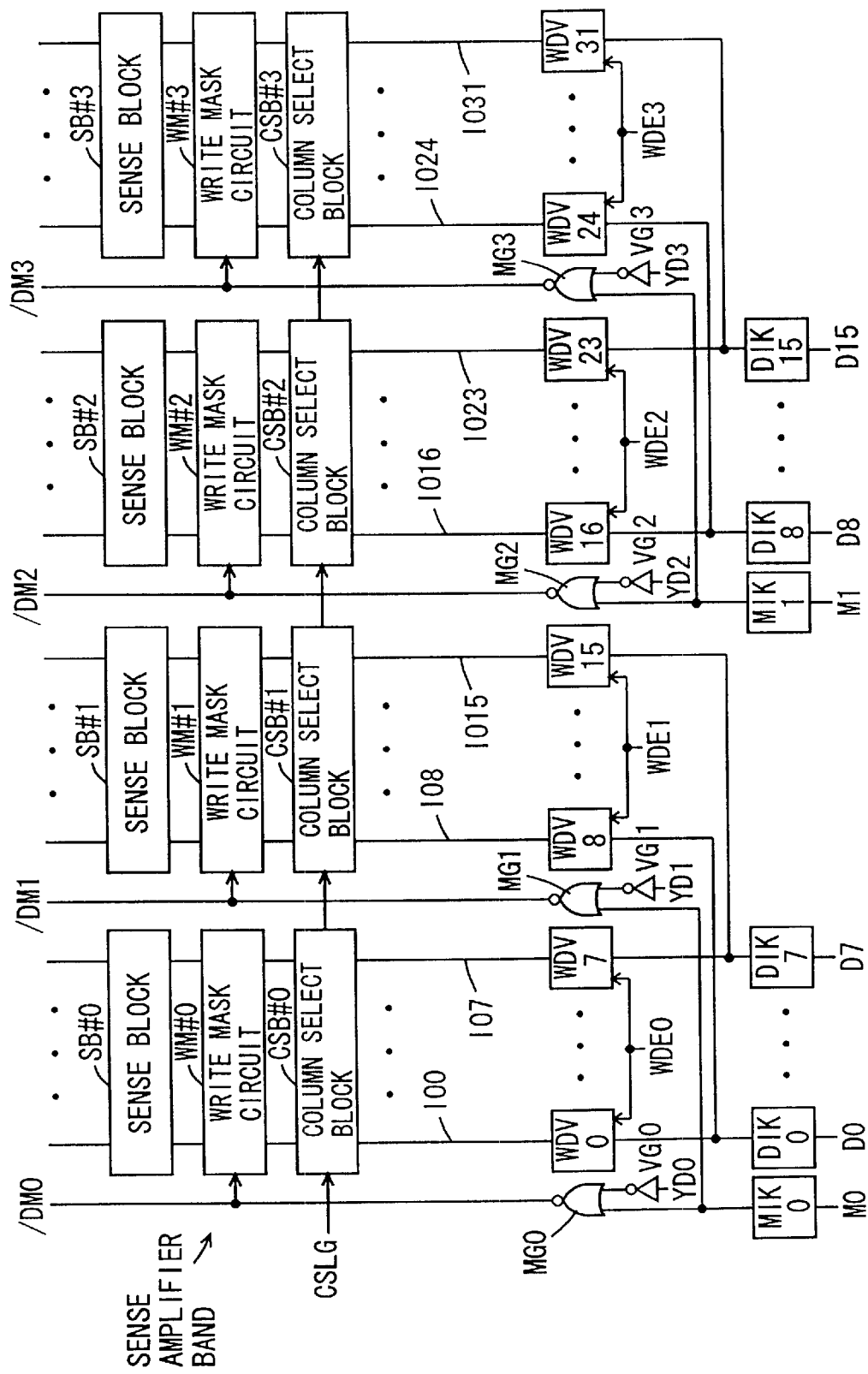
FIG. 45 is a schematic representation of another arrangement of a data write circuit portion of the fifth embodiment of the present invention.

FIG. 45 is a schematic representation of an arrangement of a data write portion where the data bits are reduced from 32 bits to 16 bits, are the original size is halved. As shown in FIG. 45, data input circuits DIK0 to DIK15 are provided corresponding for input data D0 to D15 of 6 bits. A mask input circuit MIK0 receiving a mask instruction signal M0 is provided for input data D0 to D7 of 8 bits. Moreover, a mask input circuit MIK1 receiving a mask instruction signal M1 that instructs a data mask is provided for input data D8 to D15 of 8 bits.

Data input circuits DIK0 to DIK7 are coupled respectively to write drivers WDV0 to WDV7 and to write drivers WDV8 to WDV15. Data input circuits DIK8 to DIK15 are coupled respectively to write drivers WDV16 to WDV23 and further to write drivers WDV24 to WDV31.

An internal mask instruction signal from mask input circuit MIK0 is applied in common to mask gate circuits MG0 and MG1, and an internal write mask instruction signal from mask input circuit MIK1 is applied in common to mask gate circuits MG2 and MG3. The arrangements of other parts are the same as those shown in FIG. 38, and the same reference characters denote the corresponding parts and their detailed descriptions will not be repeated.

In the arrangement shown in FIG. 45, either the group of write drivers WDV0 to WDV7 or the group of write drivers WDV8 to WDV15 is activated, and at the same time, either the group of write drivers WDV16 to WDV23 or the group of write drivers WDV24 to WDV31 is activated. In other words, internal data line selecting signals YD0 and YD2 are activated at the same time, or internal data line selecting signals YD1 and YD3 are activated at the same time. As for a non-selected write driver group, a write mask circuit is rendered non-conductive by a corresponding mask gate circuit so that the inverting of latch data of a sense amplifier circuit can be reliably prevented even when an IO data line pair is precharged to a power-supply voltage Vcc level.

Figure 46:
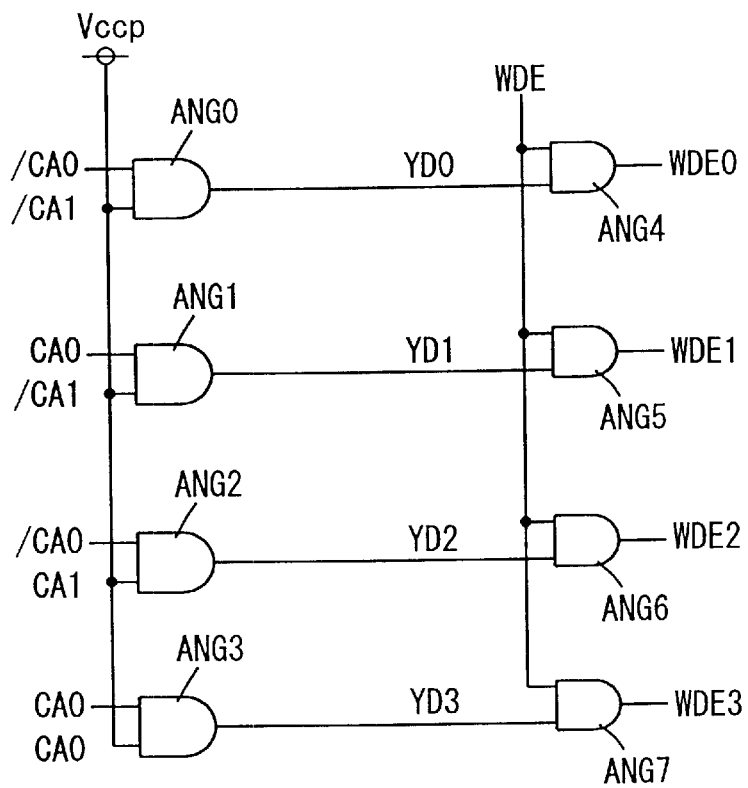
FIG. 46 is a schematic representation of an arrangement of a write driver enable signal generating portion shown in FIG. 45.

FIG. 46 is a diagram schematically illustrating the arrangement of a portion for write driver enable signals and internal data line selecting signals for the arrangement shown in FIG. 45. In the arrangement shown in FIG. 46, a peripheral power-supply voltage VccP is applied, in place of column address bits /CA1 and CA1, in each of AND gates ANG0 to ANG3. In addition, a column address bit CA0 or /CA0 is applied to a first input of each of these AND gates ANG0 to ANG3. Thus, column address bit CA1 is degenerated, and a group of internal data line pairs is designated according to column address bit CA0.

When column address bit CA0 is at the "H" level, internal data line selecting signals YD1 and YD3 are driven to the active state, and internal data line selecting signals YD0 and YD2 maintain the inactive state. On the other hand, when column address bit CA0 is at the "L" level, internal data line selecting signals YD0 and YD2 are driven to the active state, and internal data line selecting signals YD1 and YD3 maintain the non-selected state.

AND gates ANG4 to ANG7 receive internal data line selecting signals YD0 to YD3 at their respective first inputs, and a write driver enable signal WDE at their respective second inputs. Therefore, write driver enable signals WDE0 to WDE3 can be selectively activated according to the respective internal data line selecting signals YD0 to YD3.

When a write driver group is inactive, a corresponding write mask circuit is set to the non-conductive state so that the connection between a non-selected sense amplifier circuit and an IO data line pair can be inhibited even when a column select circuit is rendered conductive according to a column select signal group CSLG.

Figure 47:
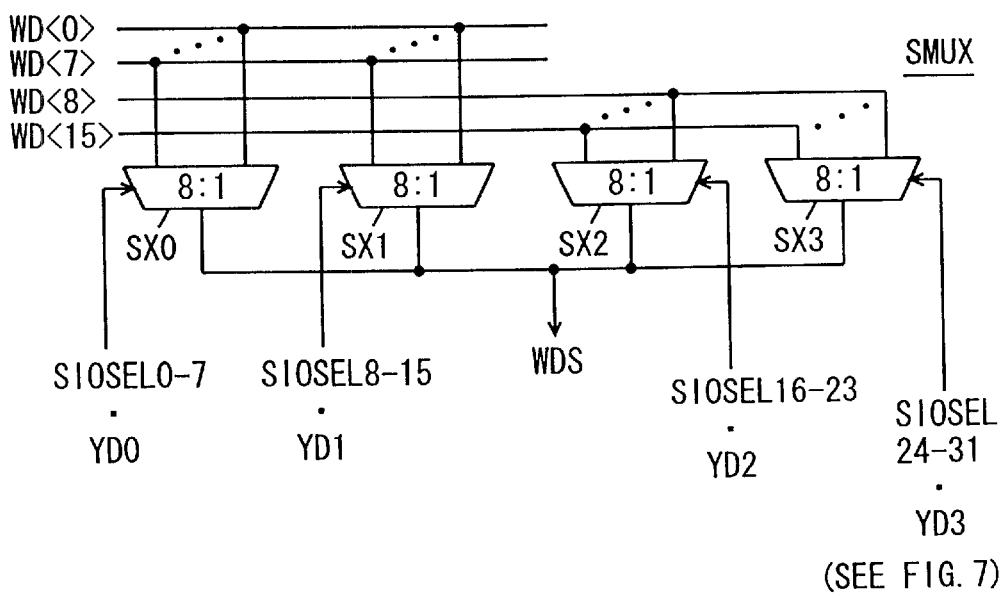
FIG. 47 is a schematic representation of an arrangement of a spare switching circuit for a write circuit shown in FIG. 45.

Furthermore, in the arrangement of the write circuitry shown in FIG. 45, a spare determination circuit may be configured utilizing the arrangements shown in FIGS. 43 and 44. Thus, as shown in FIG. 47, 8-bit internal write data (write data from an input buffers) WD<0> to WD<7> are applied to each of 8:1 switching circuits SX0 and SX1. On the other hand, 8-bit internal write data bits WD<8> to WD<15> are provided to each of 8:1 switching circuits SX2 and SX3. Control signals for controlling the operations of switching circuits SX0 to SX3 can be generated by combinations of spare data line selecting signals SIOSEL0 to SIOSEL31 and internal data line selecting signals YD0 to YD3.

Figure 48:
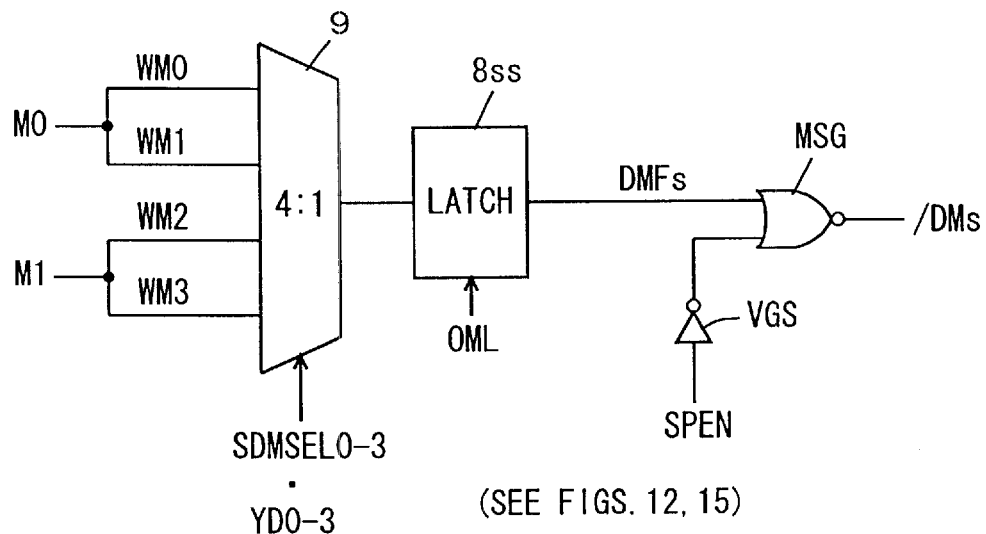
FIG. 48 is a schematic representation of an arrangement of a spare data mask instruction signal generating portion for the arrangement shown in FIG. 45.

FIG. 48 is a schematic representation of an arrangement of a spare data mask instruction signal generating portion. Referring to FIG. 48, internal mask instruction signals WM0 and WM1 are generated from a mask instruction signal M0, and internal mask instruction signals WM2 and WM3 are generated from a mask instruction signal M1. As in the arrangement previously shown in FIG. 44, 4:1 selecting circuit 9 performs a selecting operation according to a signal generated by a logical products of spare data mask selecting signals SDMSEL0 to SDMSEL3 and internal data line selecting signals YD0 to YD3. Therefore, the inversion of data of a spare memory cell in a spare circuit can be precisely prevented when the spare is not being used.

As described above, according to the fifth embodiment of the present invention, since the connections between internal IO data line pairs and data input nodes are switched in a unite of write mask circuits controlled by a data write mask, non-selected IO data line pairs can be forced into the masked state, thereby facilitating the implementation of a semiconductor memory device that has a write masking function and that allows the number of input data bits to be changed.

Sixth Embodiment

Figure 49:
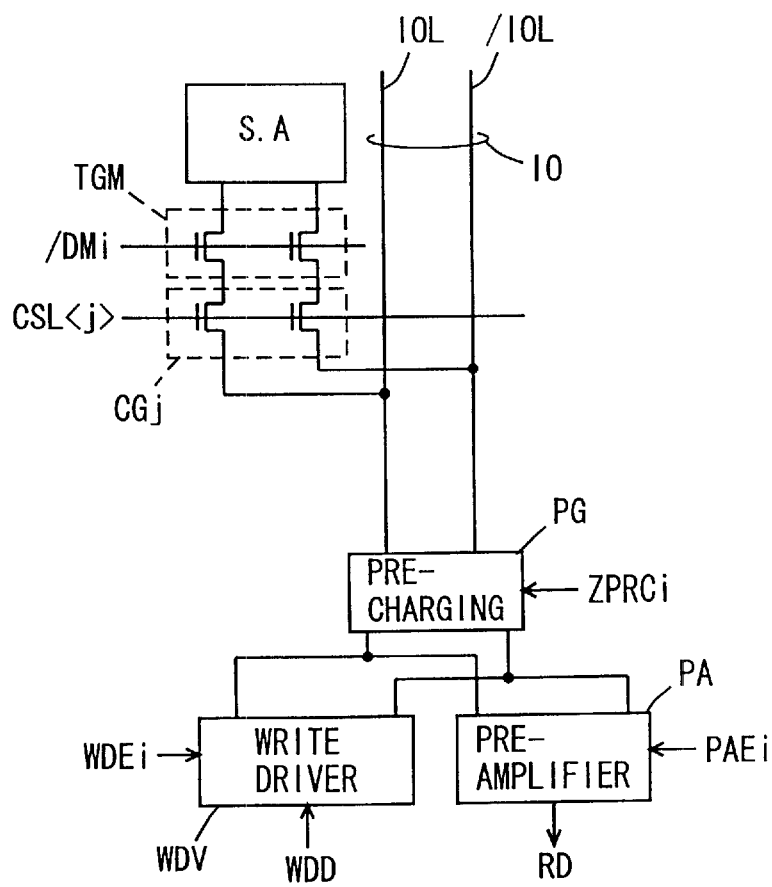
FIG. 49 is a schematic representation of an arrangement of a main portion of a semiconductor memory device according to a sixth embodiment of the present invention.

FIG. 49 is a schematic representation of an arrangement of a portion related to one IO data line pair. One sense amplifier circuit S. A is representatively shown in FIG. 49. For one IO data line pair IO, n sense amplifier circuits S. A are provided. A sense amplifier circuit S. A is coupled to an internal IO data line pair IO through a write mask gate TGM for receiving a data mask instruction signal /DMi at a gate and through a column select gate CGj connect in series to write mask gate TGM receiving a selected column designating signal CSL<j> at a gate threof. Internal IO data line pair IO includes complementary IO data lines IOL and /IOL.

IO data line pair IO is provided with a precharging circuit PG activated in response to a precharge instruction signal ZPRCi for precharging IO data lines IOL and /IOL to a power-supply voltage level, and a write driver WDV and a preamplifier PA coupled in parallel to precharging circuit PG. Write driver WDV is activated when a write driver enable signal WDEi is activated, and drives IO data lines IOL and /IOL according to internal write data WDD. Preamplifier PA is activated when a preamplifier enable signal PAEi is activated, and amplifies the data read out on IO data lines IOL and /IOL to generate internal read data RD.

In the previously-mentioned arrangement shown in FIGS. 9, 10, and 31, a preamplifier circuit and a write driver circuit each include a precharging circuit. In the arrangement shown in FIG. 49, precharging circuit PG is provided in common to write driver WDV and preamplifier PA. Thus, the configuration of a data input/output circuits can be changed according to the data bit width as in the above-described fifth embodiment, by connecting write driver WDV and preamplifier PA to the data input/output circuit in a unit of IO data line pair controlled by the data mask instruction signal /DMi.

Moreover, when preamplifier PA is in the non-selected state, precharging circuit PG is in the active state. However, write mask gate TGM is rendered non-conductive so that the inversion of the latch data stored in sense amplifier circuit S. A can be prevented during a data read operation as well.

Figure 50:
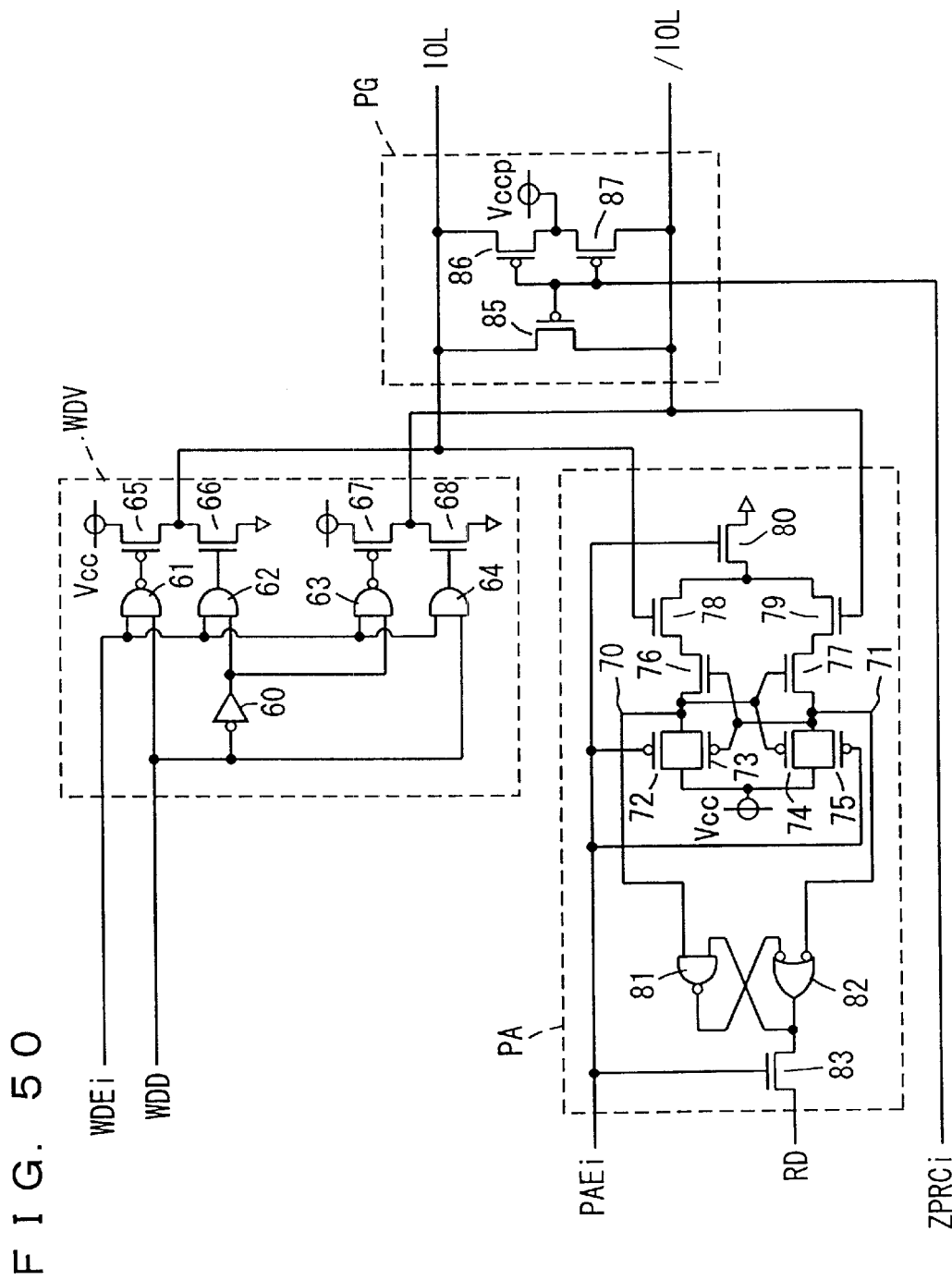
FIG. 50 is a diagram showing an example of arrangements of a precharging circuit, a write driver, and a preamplifier shown in FIG. 49.

FIG. 50 is a diagram showing specific arrangements of a write driver circuit, a preamplifier circuit, and a precharging circuit shown in FIG. 49. Referring to FIG. 50, write driver WDV includes an inverter 60 for inverting internal write data WDD, an NAND circuit 61 receiving internal write data WDD and a write driver enable signal WDEi, an AND circuit 62 receiving write driver enable signal WDEi and an output signal from inverter 60, a P-channel MOS transistor 65 for driving an IO data line IOL to a power-supply voltage Vcc (peripheral power-supply voltage Vccp) level according to an output signal from NAND circuit 61, an N-channel MOS transistor 66 for driving IO data line IOL to a ground voltage level according to an output signal from AND gate 62, an NAND circuit 63 receiving write driver enable signal WDEi and an output signal from inverter 60, an AND circuit 64 receiving write driver enable signal WDEi and internal write data WDD, P-channel MOS transistor 67 for driving a complementary IO data line /IOL to a power-supply voltage Vcc (peripheral power-supply voltage Vccp) level according to an output signal from NAND circuit 63, and an N-channel MOS transistor 68 for driving complementary IO data line /IOL to the ground voltage level according to an output signal from AND gate 64.

When write driver enable signal WDEi is at the "L" level of the inactive state, output signals from NAND gates 61 and 63 attain the "H" level and output signal from AND circuits 62 and 64 attain the "L" level. Consequently, MOS transistors 65 to 68 all enter the off state, and write driver WDV enters the output high impedance state.

When write driver enable signal WDEi is driven to the active state of the "H" level, NAND gates 61 and 63 each operate as an inverter buffer, and AND gates 62 and 64 each operate as buffer in write driver WDV. Thus, when internal write data WDD is at the "H" level, for instance, MOS transistors 65 and 68 attain the on state, and MOS transistors 66 and 67 attain the off state, and IO data lines IOL and /IOL are set to the "H" level and the "L" level respectively.

Precharging circuit PG includes a P-channel MOS transistor 85 rendered conductive, when precharge instruction signal ZPRCi is activated, for short-circuiting IO data lines IOL and /IOL, and P-channel MOS transistors 86 and 87 rendered conductive, when precharge instruction signal ZPRCi is activated, for transmitting a power-supply voltage Vcc (Vccp) to IO data lines IOL and /IOL. When precharge instruction signal ZPRCi attains the active state of the "L" level, IO data lines IOL and /IOL are precharged to a power-supply voltage Vcc (Vccp) level. When precharge instruction signal ZPRCi attains the "H" level, MOS transistors 85 to 87 all attain the off state in precharging circuit PG, and IO data lines IOL and /IOL enter the electrically floating state.

Preamplifier PA includes a P-channel MOS transistor 72 rendered conductive, when a preamplifier enable signal PAEi is inactive, for precharging a node 70 to a power-supply voltage Vcc (Vccp) level, a P-channel MOS transistor 75 rendered conductive when preamplifier enable signal PAEi is inactive for precharging a node 71 to the power-supply voltage Vcc level, a P-channel MOS transistor 73 rendered conductive, when the voltage level of node 71 is at the "L" level, for charging node 70, a P-channel MOS transistor 74 rendered conductive, when the voltage of node 70 is at the "L" level, for charging node 71, an N-channel MOS transistor 76 connected in series with MOS transistors 72 and 73 and rendered conductive according to the voltage level of node 71, an N-channel MOS transistor 77 connected in series with MOS transistors 74 and 75 and rendered conductive according to the voltage level of node 70, an N-channel MOS transistor 78 connected in series with MOS transistor 76 and rendered conductive according to the voltage level of an IO data line IOL, an N-channel MOS transistor 79 connected in series with MOS transistor 77 and rendered conductive according to the voltage level of a complementary IO data line /IOL, and an N-channel MOS transistor 80 coupled in common to MOS transistors 78 and 79 and rendered conductive when preamplifier enable signal PAEi is activated, for driving a source node common to MOS transistors 78 and 79 to a ground voltage level.

MOS transistors 73, 74, 76, and 77 form a so-called "cross-coupled" sense amplifier circuit, and MOS transistors 78 and 79 form a differential stage for differentially amplifying the voltages of IO data lines IOL and /IOL.

Preamplifier PA further includes NAND circuits 81 and 82 forming a flip-flop for latching the voltage levels of nodes 70 and 71, and a transfer gate 83 for allowing an output signal from NAND circuit 82 to pass through to provide read data RD in response to preamplifier enable signal PAEi. NAND circuit 81 receives a signal on node 70 and an output signal from NAND circuit 82. NAND circuit 82 receives an output signal from NAND circuit 81 and a signal on node 71 to generate and latch internal read data RD.

In preamplifier PA, MOS transistor 80 is in the off state when preamplifier enable signal PAEi is at the "L" level of the inactive state. MOS transistors 72 and 75 attain the on state, and nodes 70 and 71 are precharged to a power-supply voltage Vcc (Vccp) level. Moreover, MOS transistor 83 attains the off state, and preamplifier PA enters the output high impedance state.

When preamplifier enable signal PAEi attains the "H" level of the active state, MOS transistors 72 and 75 attain the off state, and MOS transistor 80 attains the on state, and the voltages on IO data lines IOL and /IOL are amplified. At the beginning of the amplifying operation, nodes 70 and 71 are precharged to the power-supply voltage level, and MOS transistors 76 and 77 are in the on state. Therefore, when the conductance of MOS transistors 78 and 79 change according to the voltage of IO data lines IOL and /IOL, one of the voltage levels of nodes 70 and 71 is lowered. Here, consider a case in which the voltage level of IO data line /IOL is at the "L" level. In this case, the conductance of MOS transistor 78 is greater than the conductance of MOS transistor 79 so that node 70 is discharged at a high speed. Due to the lowering in the voltage level at node 70, the conductance of MOS transistor 74 increases, and node 71 recovers to the precharged power-supply voltage Vcc level. MOS transistor 73 attains the off state, and MOS transistor 76 attains the on state. Node 70 is finally discharged to the ground voltage level. When the voltage level of nodes 70 and 71 exceed the input logic threshold voltages of NAND circuits 81 and 82, read data RD from the flip-flop is set to the state corresponding to the internal read data. Since the voltage level of node 70 is the "L" level, and the voltage level of node 71 is the "H" level, internal read data RD output from NAND circuit 82 via MOS transistor 83 is a signal of "L" level.

Precharge instruction signal ZPRCi, write driver enable signal WDEi, and preamplifier enable signal PAEi are all generated according to an internal data line selecting signal YDi. Thus, in the arrangement shown in FIG. 50, a group of non-selected IO data line pairs maintains the precharged state. In this state, a data mask instruction signal is forced to the active state for the non-selected IO line pair group, and write mask gate TGM is rendered non-conductive so that reading of data is inhibited. Thus, IO data lines IOL and /IOL can stably maintain the precharged voltage levels. Moreover, even when preamplifiers are coupled in parallel, a non-selected preamplifier is in the output high impedance state so that data collision does not occur.

Seventh Embodiment

Figure 51:
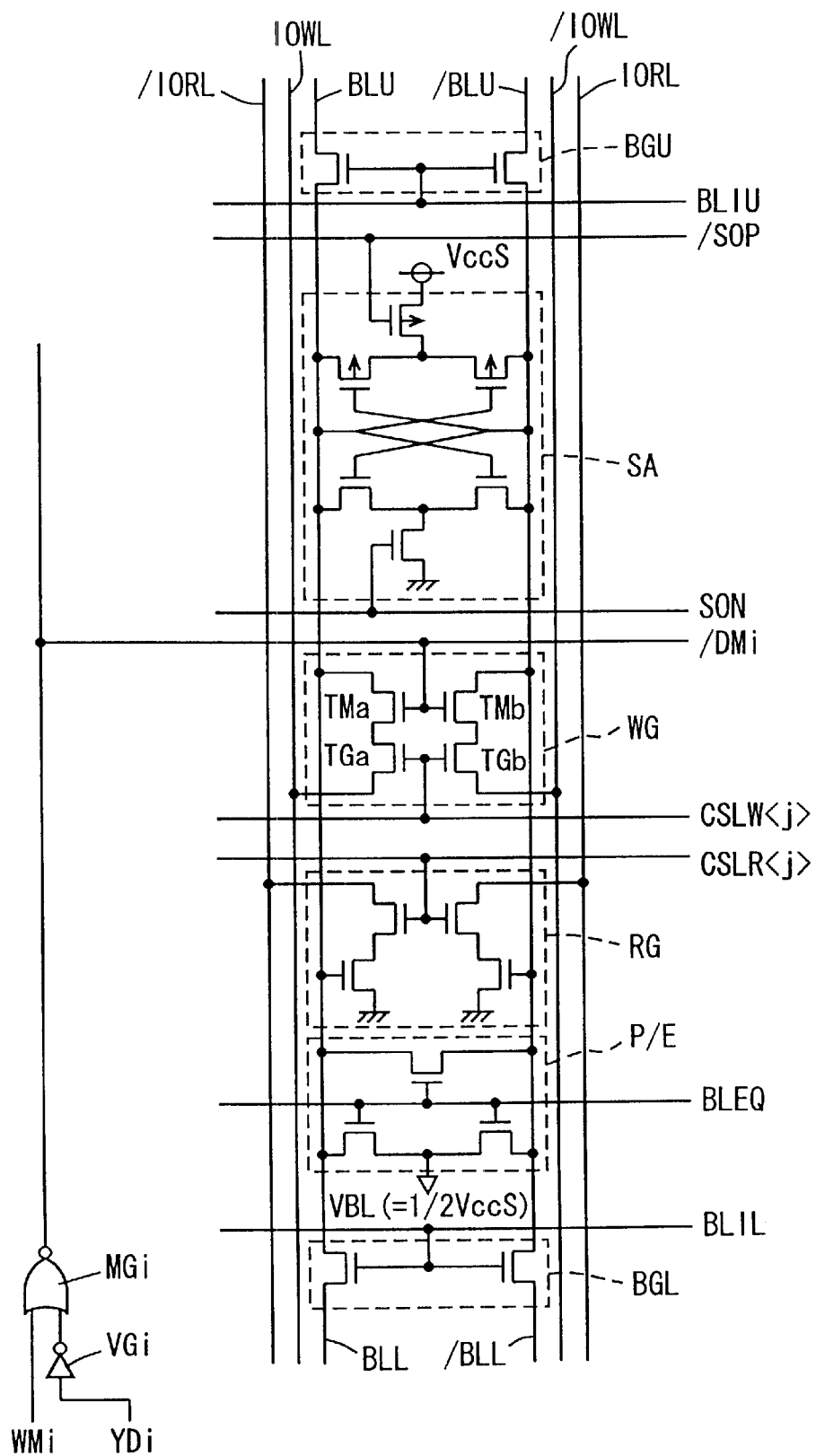
FIG. 51 is a diagram showing the arrangements of a sense amplifier circuit and a peripheral portion of a semiconductor memory device according to a seventh embodiment of the present invention.

As previously described in relation to the first embodiment, etc., the internal data line pairs may be divided into write data line pairs IOW for transmitting write data and read data line pairs IOR for transmitting read data, so as to allow an immediate reading of data without considering the precharging period of an IO data line pair required after the completion of a data write operation. An arrangement in which a write mask gate is provided to the arrangement having read data line pairs and write data line pairs separately provided is shown previously in FIG. 20. In the arrangement shown in FIG. 20, write data mask instruction signal /DM is combined with internal data line selecting signal YD. In other words, as shown in FIG. 51, write mask instruction signal /DMi is generated using an inverter VGi that receives internal data line selecting signal YDi and a mask gate circuit MGi that receives an output signal from inverter VGi and an internal write mask instruction signal WMi. In addition, in the arrangement shown in FIG. 51, the arrangement of a bit line peripheral circuit is the same as that shown in FIG. 20 so that the corresponding parts are denoted by the sense characters and have the detailed description thereof not be repeated. However, in the arrangement of FIG. 51, a selected column designating signal CSLW<j> for a write operation and a selected column designating select signal CSLR<j> for a read operation only are used as selected column designating signals. Even with the arrangement in which write data line pair IOW and read data line pair IOR are separately provided, a semiconductor memory device having a write masking function and being capable of flexibly accommodating the change in number of data bits can be implemented by connecting a write column select gate in series with a write mask gate and by controlling the write mask gate by internal data line selecting signal YDi.

Figure 52:
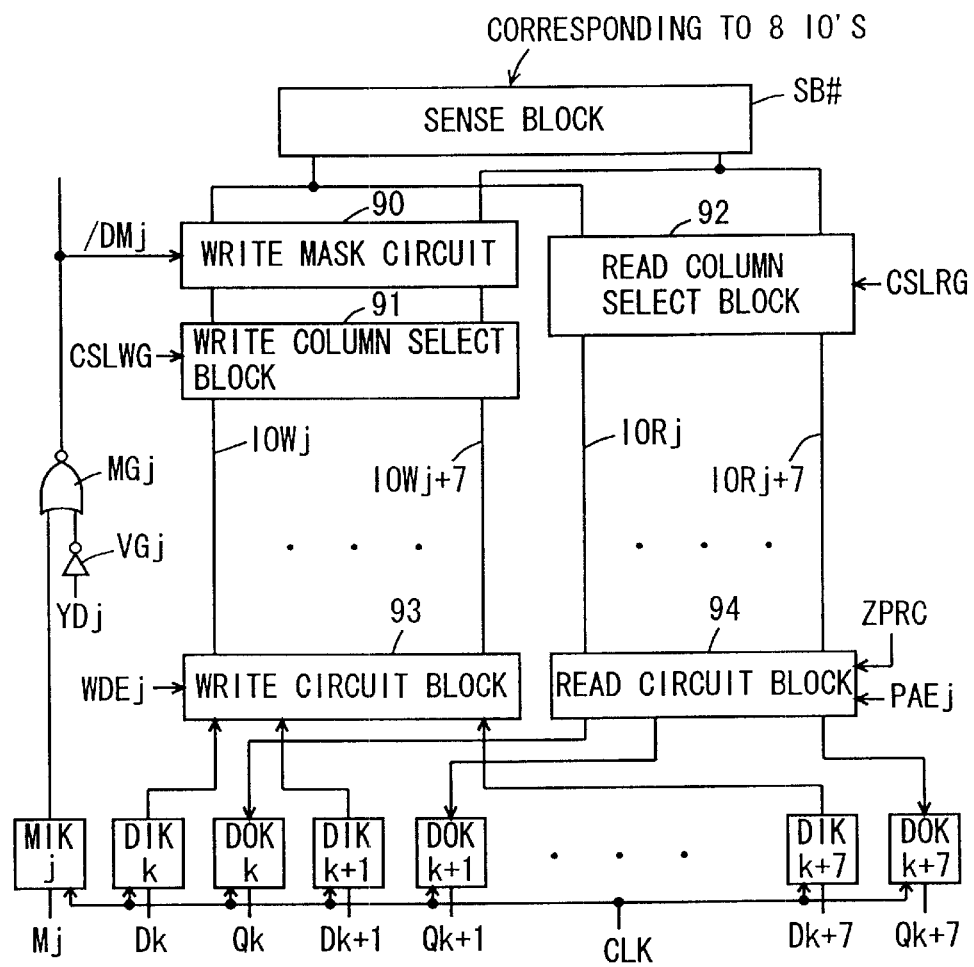
FIG. 52 is a schematic representation of an arrangement of a portion related to one sense block in the semiconductor memory device shown in FIG. 51.

FIG. 52 is a schematic representation of an arrangement of a portion related to one sense block in the seventh embodiment of the present invention. A sense block SB# corresponds to eight I/O's, i.e. eight write data line pairs IOW and eight read data line pairs IOR are provided corresponding to sense block SB#.

For sense block SB# and write data line pairs IOWj to IOWj+7, there are provided a write column select block 91 for selecting a sense amplifier circuit in sense block SB# in response to a write column select signal CSLWG, and a write mask circuit 90 for inhibiting the connection between sense block SB# and write column select block 91 according to write mask instruction signal /DMj.

A read column select block 92 for coupling a sense circuit contained in sense block SB# to read data line pairs IORj to IORj+7 according to a read column select signal CSLRG is provided between read data line pairs IORj to IORj+7 and sense block SB#. Specifically, read column select block 92 includes, corresponding to each sense amplifier circuit, a read gate RG rendered active in response to a selected column designating signal CSLR<j> for differentially driving a read data line pair according to the latch data of a sense amplifier, as shown in FIG. 51.

A write circuit block 93 rendered active in response to write driver enable signal WDEj is provided corresponding to write column select block 91. A read circuit block 94 for precharging read data line pairs IORj to IORj+7 and for performing a data read operation according to preamplifier enable signal PAEj and precharge instruction signal ZPRC is provided for read data line pairs IORj to IORj+7.

Data input circuits DIKk to DIKk+7 for receiving the respective write data bits Dk to Dk+7 are provided corresponding to write circuit block 93, and output circuits DOKk to DOKk+7 for generating read data Qk to Qk+7 respectively are provided corresponding to read circuit block 94. Write circuit block 93 includes 8-bit write drivers, and read circuit block 94 includes 8-bit preamplifiers.

Further, for write mask circuit 90, a mask input circuit MIKj that receives a write instruction signal Mj from outside for generating write mask instruction signal /DMj is provided. An output signal from mask input circuit MIKj is applied to a second input of a mask gate circuit MGj which in turn receives at a first input an inverted internal data line selecting signal output from inverter VGj. Write mask instruction signal /DMj is generated from mask gate circuit MGj formed by this NOR circuit.

As shown in FIG. 52, the connection of data input/output circuits is controlled individually per sense block that is a unit for a data mask. Write circuit block 93 and read circuit block 94 are connected to different data input circuit and data output circuit depending on the data bit width. When the write circuit block 93 is in the non-selected state, write mask circuit 90 prevents the inversion of the data held by the sense amplifier circuit during a data write operation. Read circuit block 94 performs the amplification of data on the corresponding read data line pairs IORj to IORj+7 when preamplifier enable signal PAEj is rendered active. Precharge instruction signal ZPRC is applied in common to read circuit blocks regardless of the selected read data line pair.

In a data read operation, the precharging operation is stopped regardless of whether read circuit block 94 is selected or unselected. During a data read operation, a read gate contained in read column select block 92 is activated according to a selected column designating signal and the read data line pair is discharged according to the latch data of a sense amplifier. The charging current from a precharging circuit is prevented from flowing into the read data line pair, and an increase in the consumed current can be prevented.

Figure 53:
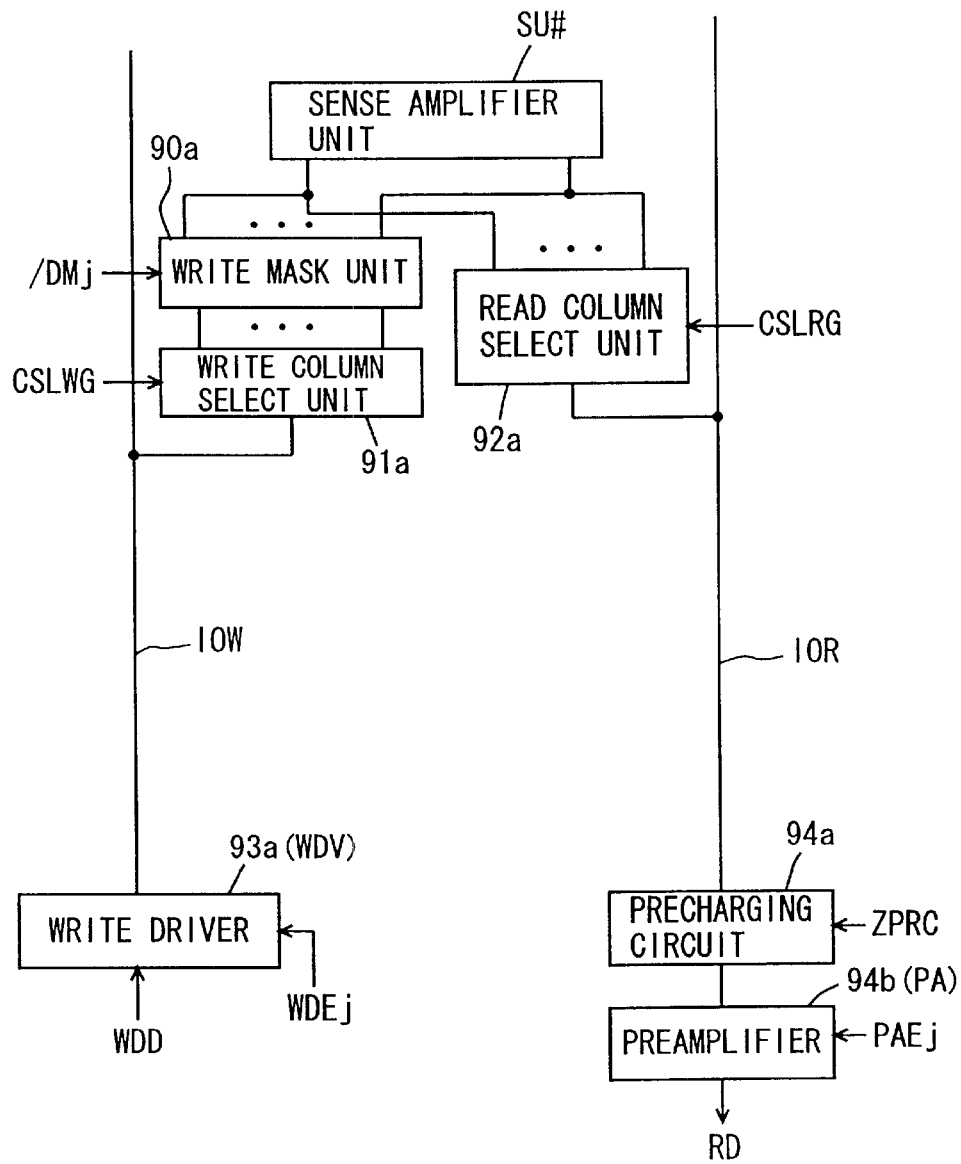
FIG. 53 is a schematic representation of an arrangement of a portion related to a sense amplifier unit contained in the sense block shown in FIG. 52.

FIG. 53 is a schematic representation of an arrangement of a portion related to one sense amplifier unit SU#. For sense amplifier unit SU# one write data line pair IOW and one read data line pair IOR are provided. Thus, eight sense amplifier units SU# are provided in sense block SB# shown in FIG. 52.

A write mask unit 90a selectively rendered conductive or non-conductive in response to write mask instruction signal /DMj and a write column select unit 91a for selecting a sense amplifier circuit contained in sense amplifier unit SU# in response to write column select signal CSLWG are connected in series between sense amplifier unit SU# and a write data line pair IOW. Write mask unit 90a includes a write mask gate provided corresponding to each sense amplifier circuit contained in sense amplifier unit SU#, and write column select unit 91a includes a write column select gate provided corresponding to each sense amplifier circuit in the unit SU#.

A read column select unit 92a for driving a read data line pair IOR according to latch data of a sense amplifier circuit selected in response to read column select signal CSLRG is provided between sense amplifier unit SU# and read data line pair IOR. Read column select unit 92a includes a read gate provided corresponding to each sense amplifier circuit contained in sense amplifier unit SU#.

A write driver 93a is provided corresponding to a write data line pair IOW. A precharging circuit 94a for precharging read data line pair IOR to a power-supply voltage level in response to a complementary precharge instruction signal ZPRC and a preamplifier 94b for amplifying the data on read data line pair IOR during the activation of preamplifier enable signal PAEj are provided to a read data line pair IOR.

When write driver 93a is inactive, write mask instruction signal /DMj is rendered active in response to data line selecting signal YDj not shown, and write mask unit 90a is rendered non-conductive. Thus, regardless of which sense amplifier circuit is selected in sense amplifier unit SU#, all sense amplifier circuits contained in sense amplifier unit SU# are disconnected from write column select unit 91a.

In a data read operation, read column select unit 92a amplifies the data held by a selected sense amplifier circuit and transmits the amplified data to read data line pair IOR in accordance with read column select signal CSLRG regardless of provision of write mask unit 90a.

Figure 54:
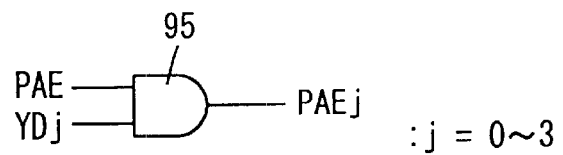
FIG. 54 is a diagram showing an example of an arrangement of a portion for generating a preamplifier enable signal shown in FIG. 53.

FIG. 54 is a diagram showing an example of an arrangement of a preamplifier enable signal generating portion. In FIG. 54, preamplifier enable signal PAEj is generated from an AND circuit 95 that receives a main preamplifier enable signal PAE and internal data line selecting signal YDj. When preamplifier activating signal PAEj is inactive, preamplifier 94b enters the output high impedance state in the same way as preamplifier PA of FIG. 50 does. As shown in FIG. 53, a precharging circuit is not provided to write driver 93a. The arrangements of precharging circuit 94a and preamplifier 94b are the same as those shown previously in FIG. 50. For a non-selected write data line pair, a sense amplifier circuit and the write data line pair are disconnected from one another by a write mask gate. Thus, the write data line pair does not need to be precharged to a power-supply voltage Vcc level as the write driver previously described in relation to FIG. 24 et. seq., and write driver 93a can be formed by a two-value-driving bi-state buffer.

Figure 55:
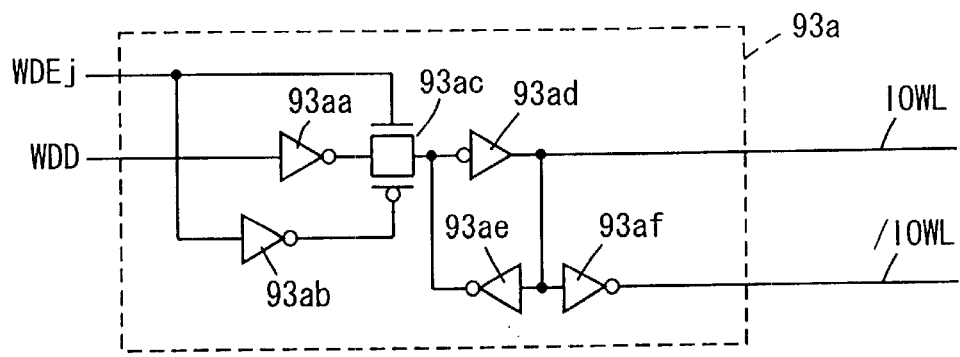
FIG. 55 is a diagram showing an example of a write driver of the seventh embodiment of the present invention.

FIG. 55 is a diagram showing an example of an arrangement of write driver 93a shown in FIG. 53. Referring FIG. 55, write driver 93a includes an inverter 93ab for inverting write driver enable signal WDEj, an inverter 93aa for inverting internal write data WDD, a transmission gate 93ac for allowing an output signal from inverter 93aa to pass through according to write driver enable signal WDEj and an output signal from inverter 93a b, an inverter 93ad for inverting data received via transmission gate 93ac to transmit the inverted data to write data line IOWL, an inverter 93ae for inverting an output signal from inverter 93ad to transmit the inverted output signal to an output of inverter 93ad, and an inverter 93af for inverting the output signal from inverter 93ad to transmit the inverted output signal to write data line /IOWL.

Inverters 93ad and 93ae form a latch circuit. In the arrangement of write driver 93a shown in FIG. 55, when write driver enable signal WDEj attains the "H" level of the active state, transmission gate 93ac is rendered conductive, and complementary internal write data from inverter 93aa is transmitted to inverter 93ad. Then, internal write data lines IOWL and /IOWL are driven according to the write data. When write driver enable signal WDEj attains the inactive state, transmission gate 93ac is rendered non-conductive, and write driver 93a enters the latching state. Thus, on write data lines IOWL and /IOWL, the write data is latched until next new data is applied so that the precharging operation becomes unnecessary, and the consumed power required for precharging can be saved. Moreover, write driver 93a is a latch-type drive circuit so that the timing margin between the activation period of write driver enable signal WDEj and the activation period of a write column select signal can be expanded, and the timing design for a data write operation can easily be made.

Further, when the same data is successively written, the voltage level of an output signal from write driver 93a does not change, and the consumed current can be reduced when the same data is successively written.

Figure 56:
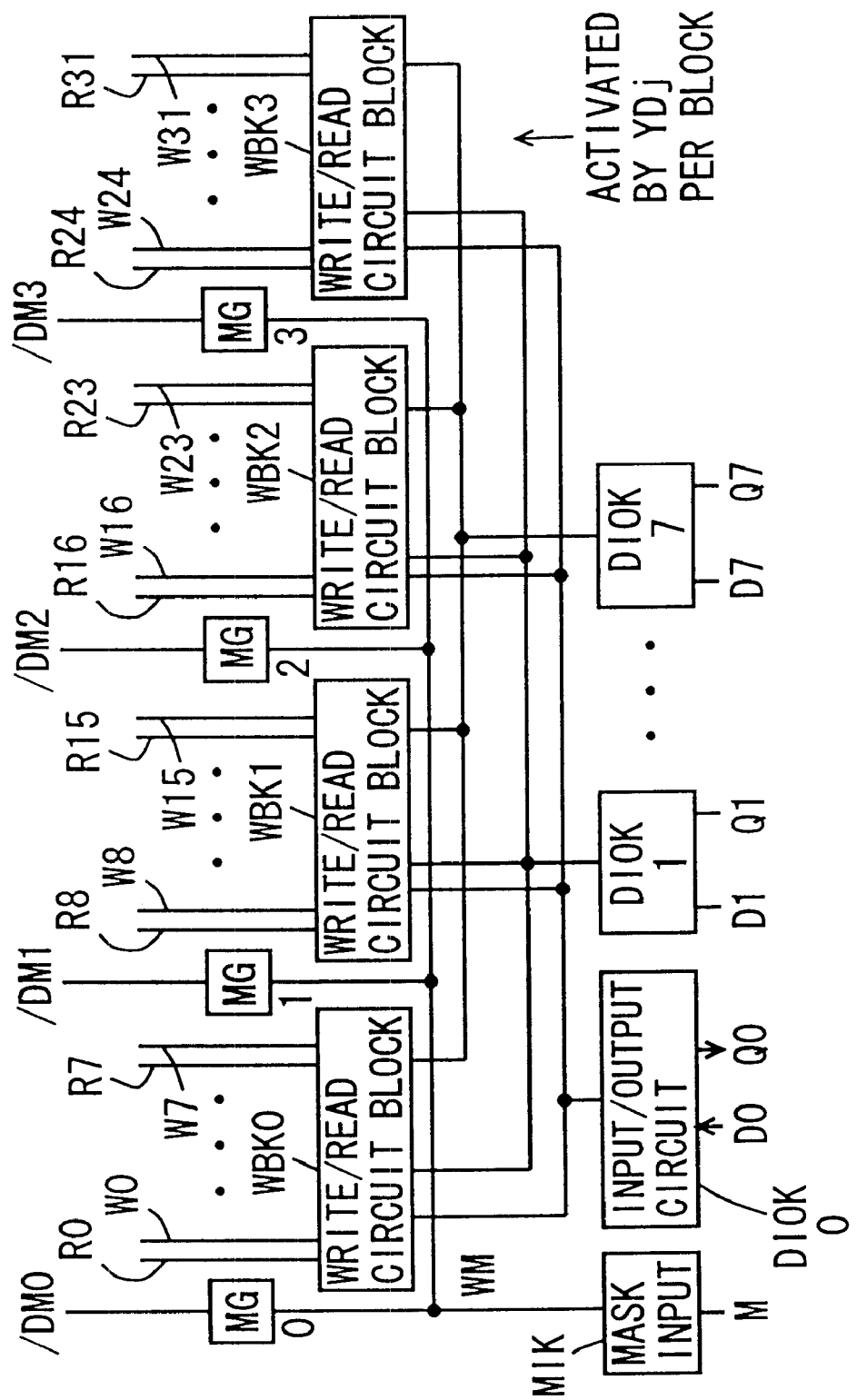
FIG. 56 is a schematic diagram showing the connections of a write/read circuit portion of the seventh embodiment of the present invention.
Figure 58:
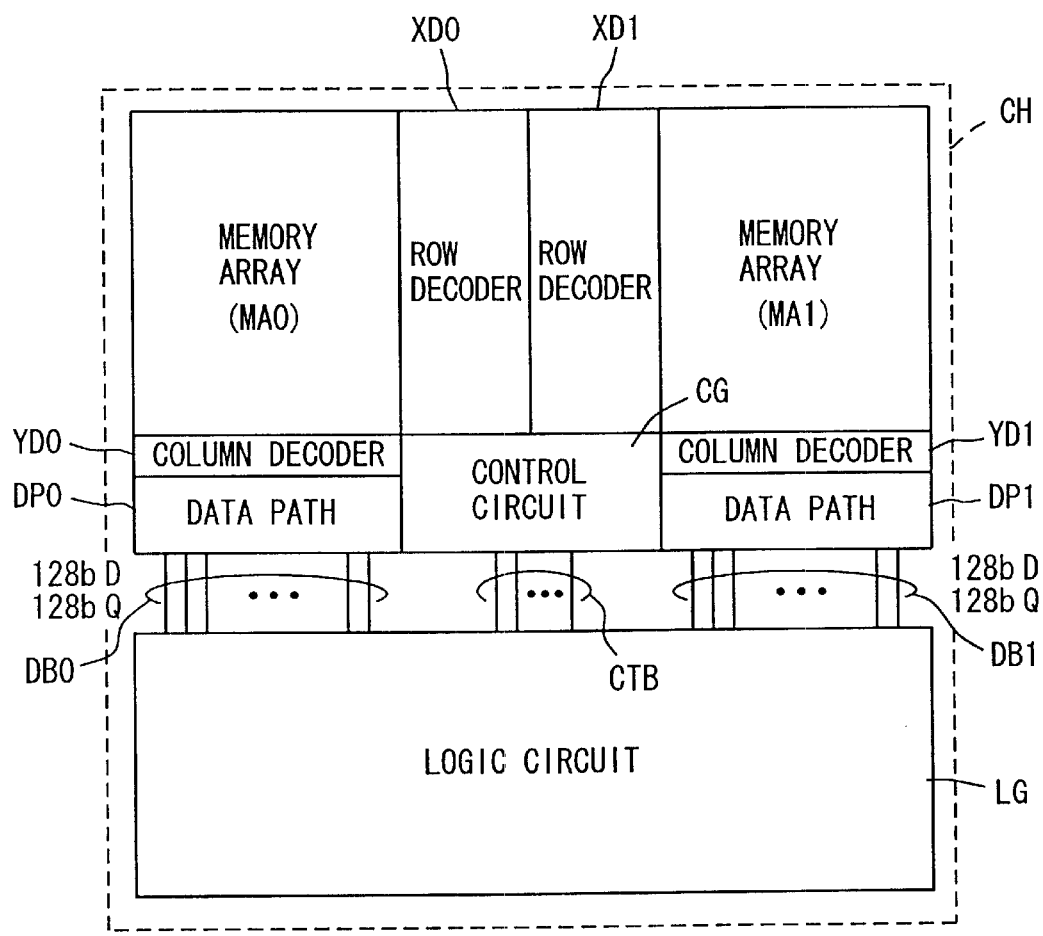
FIG. 58 is a schematic representation of an overall arrangement of a conventional DRAM built-in system LSI.
Figure 59:
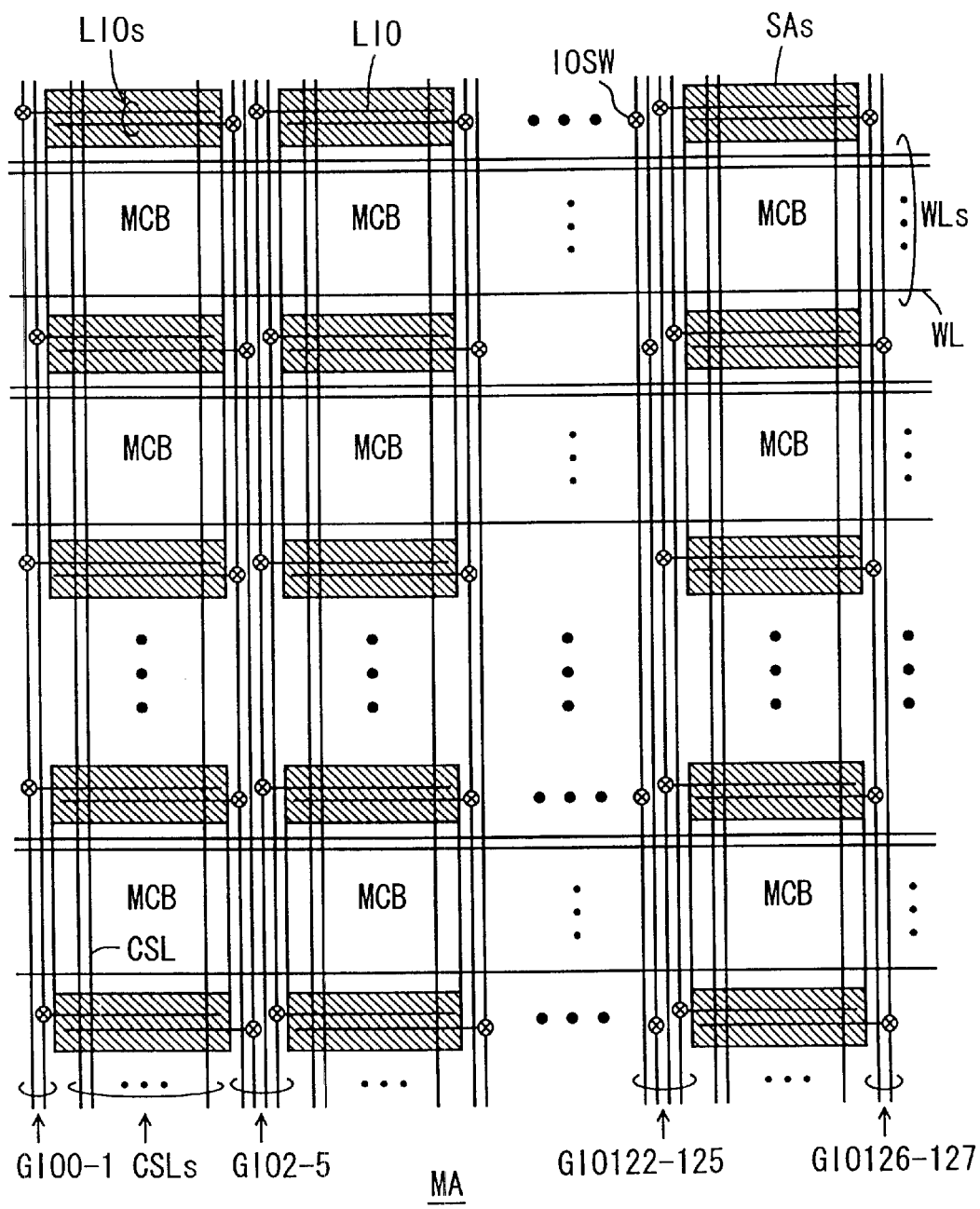
FIG. 59 is a schematic representation of an arrangement of an array portion of a conventional DRAM macro.
Figure 60:
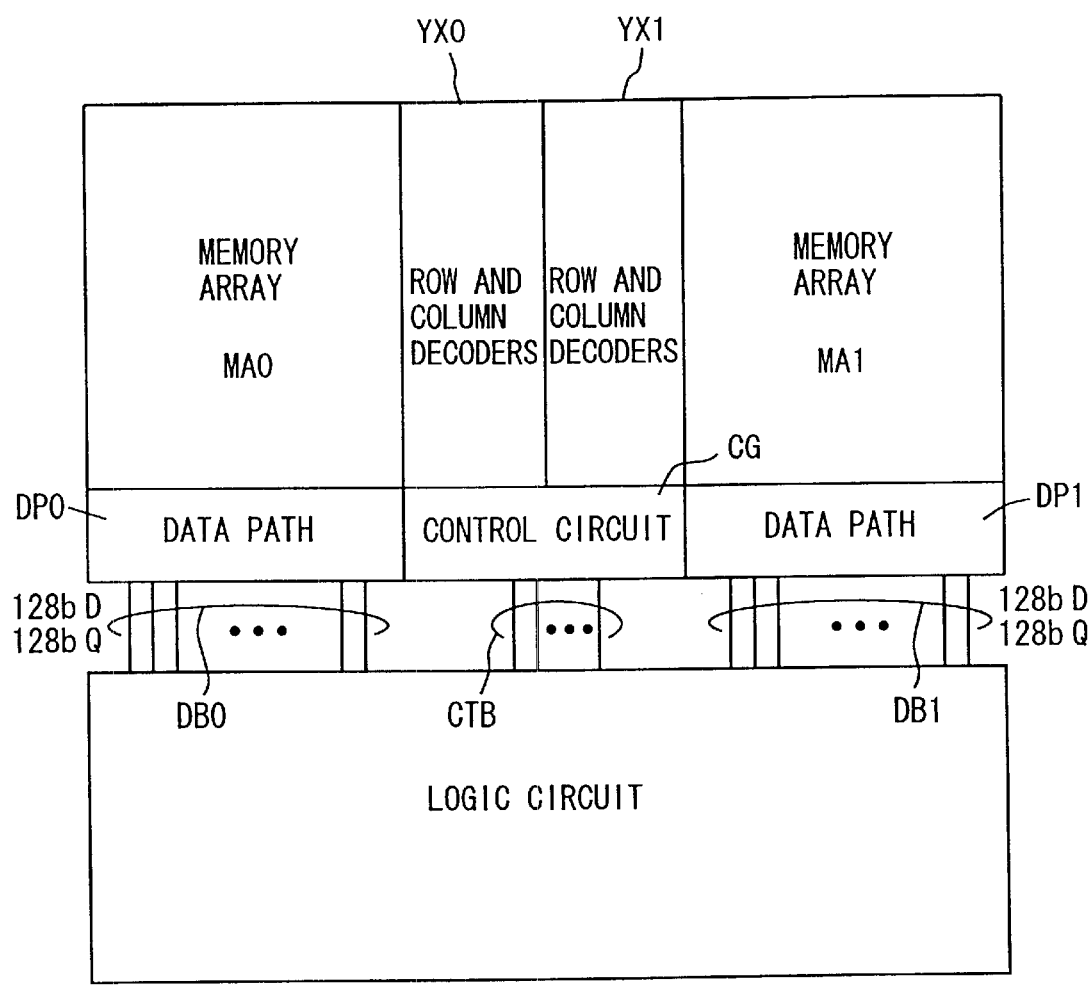
FIG. 60 is a schematic representation of another arrangement of a conventional DRAM built-in system LSI.
Figure 61:
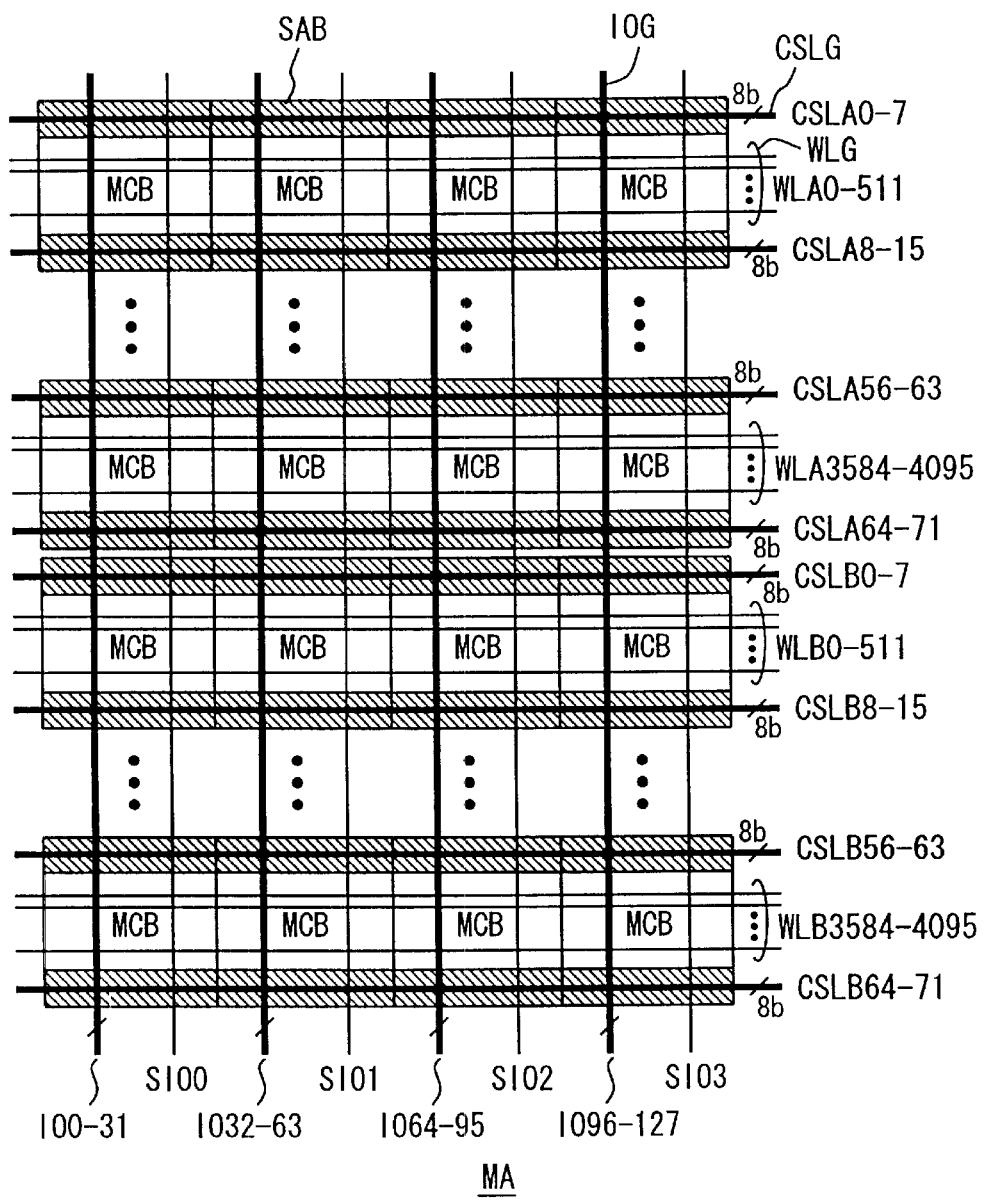
FIG. 61 is a schematic representation of an arrangement of an array portion of a DRAM macro shown in FIG. 60.
Figure 62:
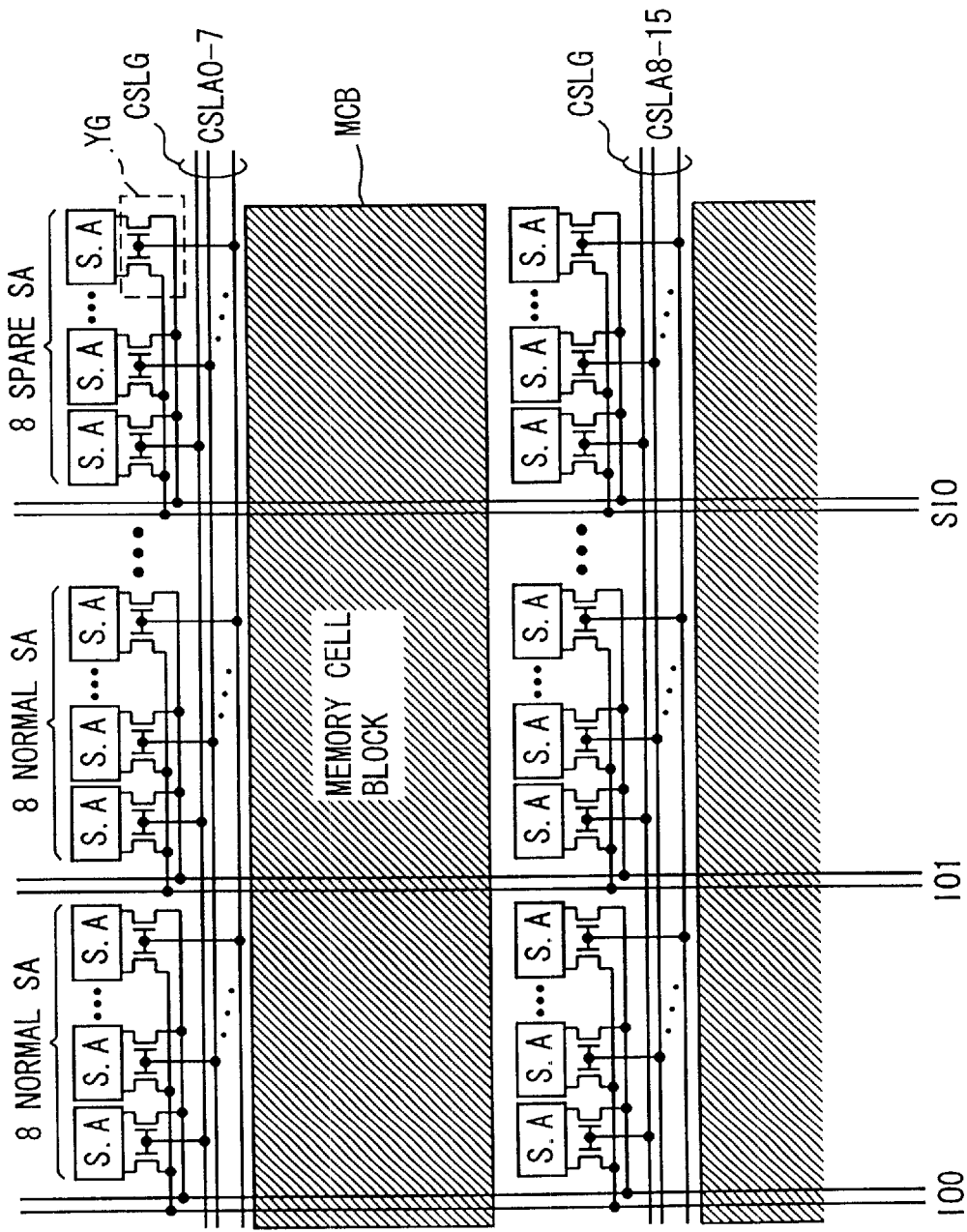
FIG. 62 is a schematic representation of an arrangement of a sense amplifier band of a memory array portion shown in FIG. 61.
Figure 63:
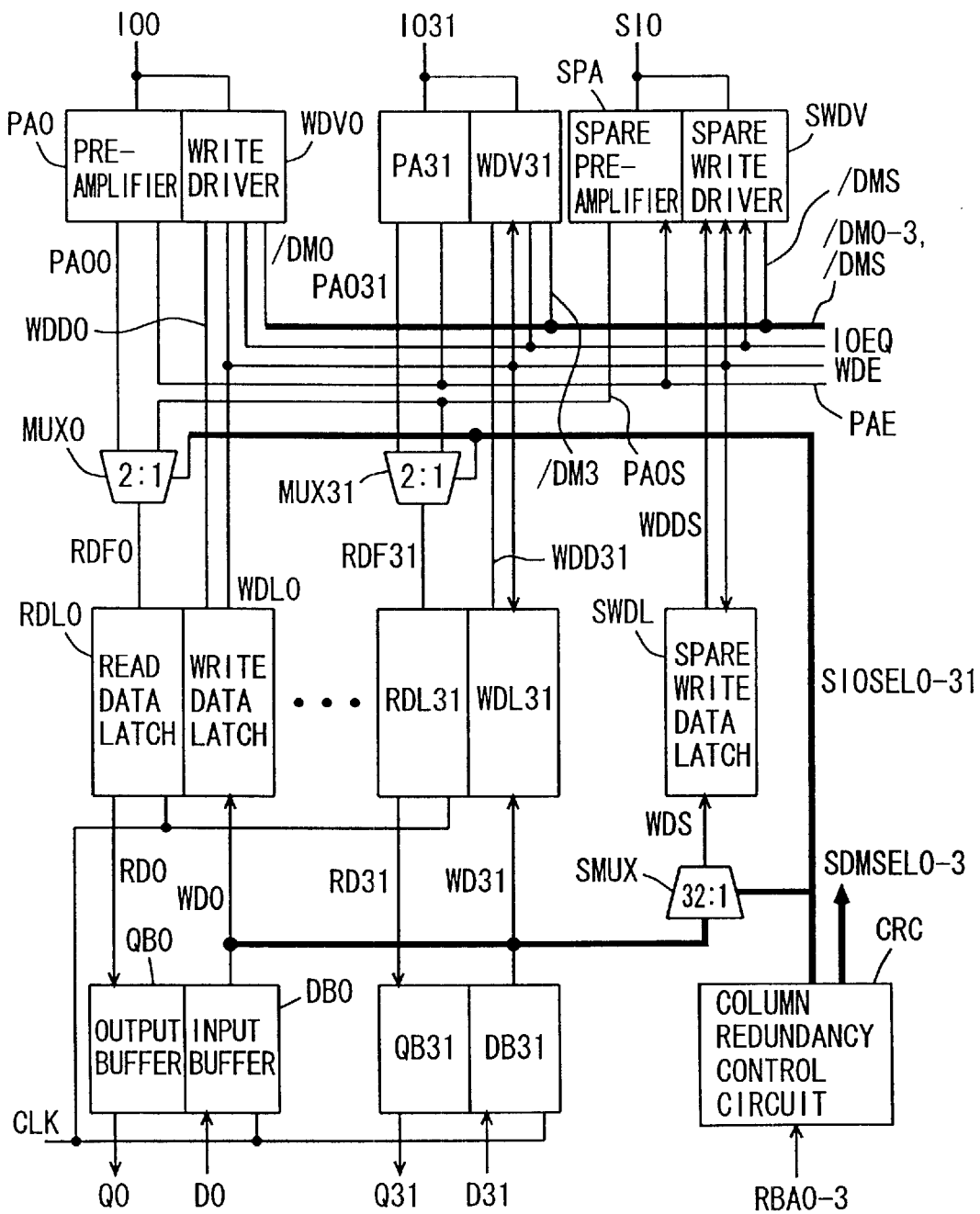
FIG. 63 is a schematic representation of an arrangement of a data path shown in FIG. 60.
Figure 64:
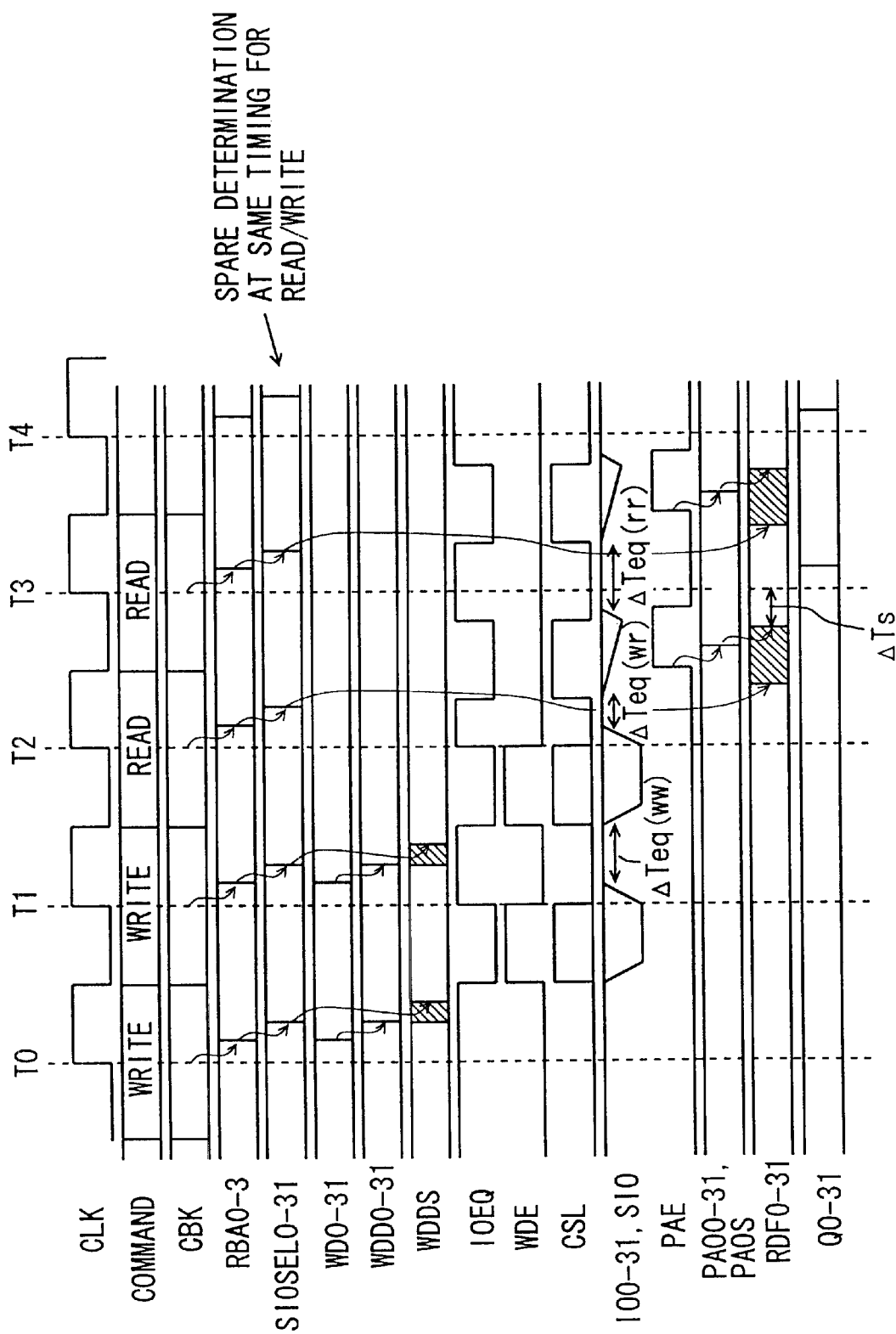
FIG. 64 is a timing chart representing operations of arrangements shown in FIGS. 60 to 63.
Figure 65:
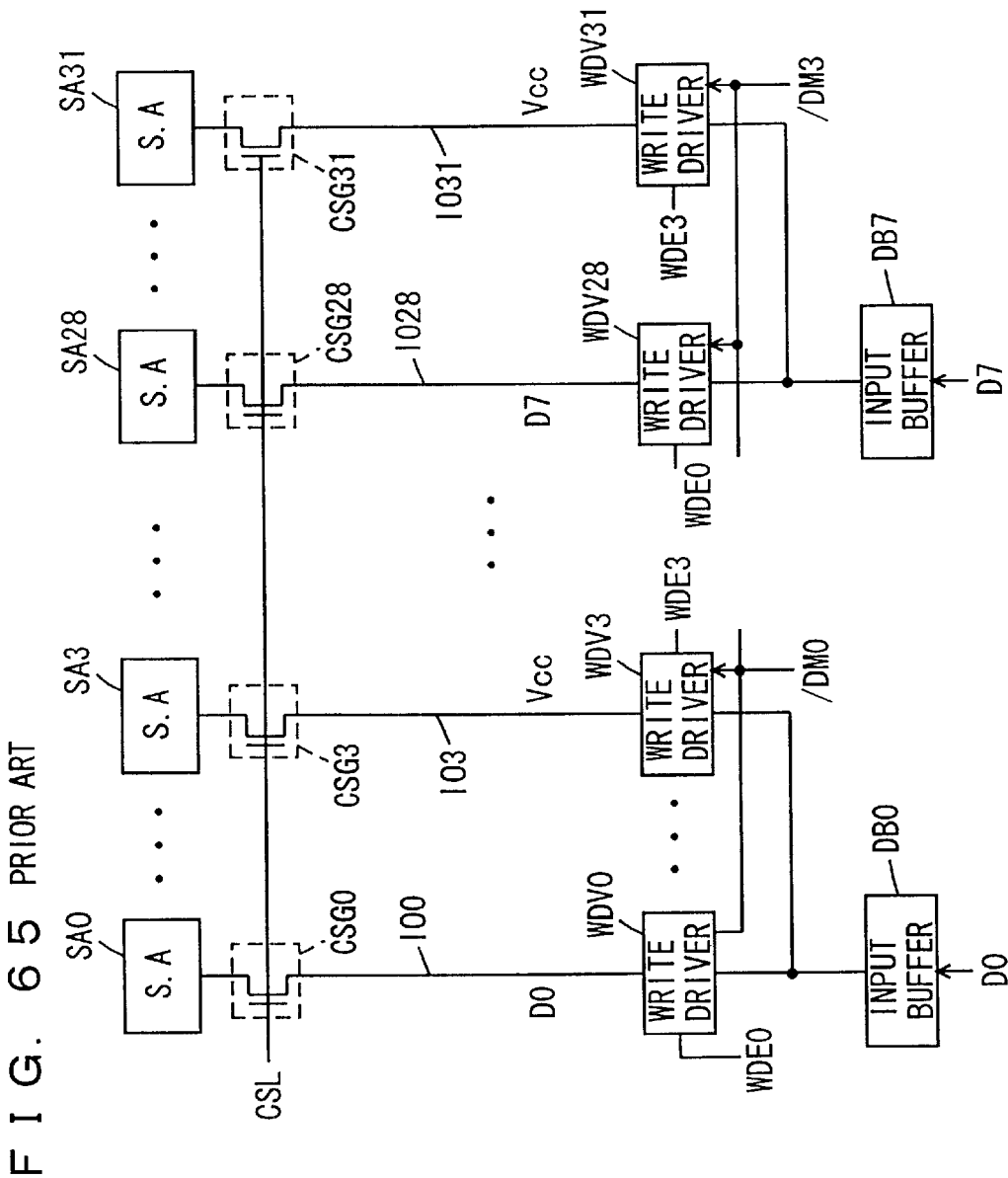
FIG. 65 is a diagram showing an arrangement of a main portion of a conventional variable data bit semiconductor memory device.

FIG. 56 is a diagram schematically showing the connection of a write/read circuit and a data input/output circuit when 32-bit data is reduced to 8-bit data.

In FIG. 56, four write/read circuit blocks WBK0 to WBK3 are provided. Read data line pairs R0 to R7 and write data line pairs W0 to W7 are provided to write/read circuit block WBK0. Read data line pairs R8 to R15 and write data line pairs W8 to W15 are provided to write/read circuit block WBK1. Read data line pairs R16 to R23 and write data line pairs W16 to W23 are provided to write/read circuit block WBK2. Read data line pairs R24 to R31 and write data line pairs W24 to WW31 are provided to write/read circuit block WBK3.

For write/read circuit blocks WBK0 to WBK3, mask gate circuits MG0 to MG3 are provided for generating write mask instruction signals /DM0 to /DM3 according to an internal write mask instruction signal WM from a mask input circuit MIK.

8-bit write drivers and preamplifiers of write/read circuit block WBK0 are coupled in parallel to input/output circuits DIOK0 to DIOK7. 8-bit write drivers and preamplifiers of write/read circuit blocks BK1 are coupled to input/output circuits DIOK0 to DIOK7, respectively. In each of write/read circuit blocks WBK2 and WBK3, 8-bit write drivers and preamplifiers are coupled to input/output circuits DIOK0 to DIOK7, respectively.

One of write/read circuit blocks WBK0 to WBK3 is activated according to internal data line selecting signal YDj and communicates data with input/output circuits DIOK0 to DIOK7. For an unselected circuit block, write mask instruction signal /DM becomes active during a data write operation, and a write mask circuit is rendered non-conductive so that a sense amplifier block is disconnected from corresponding write data line pairs. During a data read operation, no masking is effected, and data is transmitted to the unselected circuit block via read data line pairs. The corresponding preamplifiers, however, are in the output high impedance state or in the inactive state, and the reading of data is not performed. Further, a read gate is a differential amplifier circuit, in which gate of an MOS transistor is connected to a bit line (a sense node). Thus, the latch data of a sense amplifier is in no way affected. Thus, a semiconductor memory device having a write masking function and being capable of changing the data input bit width with accuracy can be implemented by changing the connections between write/read circuit blocks and data input/output circuits for each write data mask for effecting a write mask.

FIG. 57 is a diagram schematically showing the connections of a write/read circuit when 32-bit data is reduced to 16-bit data. As shown in FIG. 57, data input/output circuits DIOK0 to DIOK15 of 16 bits are provided. Each of data input/output circuits DIOK0 to DIOK15 includes a data input circuit and a data output circuit. 8-bit write drivers and 8-bit preamplifiers contained in write/read circuit block WBK0 are coupled to data input/output circuits DIOK0 to DIOK7, and 8-bit write drivers and 8-bit preamplifiers of write/read circuit block WBK1 are coupled to data input/output circuits DIOK0 to DIOK7, respectively.

8-bit write drivers and 8-bit preamplifiers contained in write/read circuit block WBK2 are coupled to data input/output circuits DIOK8 to DIOK15 respectively, and 8-bit write drivers and 8-bit preamplifiers contained in write/read circuit block WBK3 are coupled in parallel to data input/output circuits DIOK8 to DIOK15.

Mask input circuit MIK0 receiving a mask instruction signal M0 is provided corresponding to write data D0 to D7, and mask input circuit MIK1 receiving a mask instruction signal M1 is provided for data input bits D8 to D15. The write mask instruction signal from mask input circuit MIK0 is applied to mask gate circuits MG0 and MG1, and a write mask instruction signal from mask input circuit MIK1 is applied to mask gate circuits MG2 and MG3.

As shown in FIG. 57, internal write/read data RD0 to RD7 of 8 bits are transmitted or received by one of write/read circuit blocks WBK0 and WBK1, and internal write/read data RD8 to RD15 are transmitted or received by one of write/read circuit blocks WBK2 and WBK3.

Thus, in the arrangement shown in FIG. 57, the connections of a data input/output circuits with write drivers and preamplifiers are switched for each write/read circuit block of a unit for a write data mask. The switching of the connections is effected by internal data line selecting signals YD0 to YD3. Write/read circuit blocks WBK0 and WBK1 are rendered active or inactive by internal data line selecting signals YD0 and YD1 respectively, and internal data line selecting signals YD2 and YD3 control the activation and the inactivation of write/read circuit blocks WBK2 and WBK3. Thus, in this 16-bit arrangement, write mask circuit can reliably be rendered non-conductive by internal write mask instruction signals /DM0 to /DM3 during a write mask in a non-selected circuit block so that the inversion of latch data of an unselected sense amplifier circuit during a write operation can be prevented.

In addition, the same arrangement of the spare determination circuit as that employed in the previous fifth embodiment can be utilized in the arrangement of the seventh embodiment. This is due to the fact that [the arrangement for changing a write masking is the same as that in the fifth embodiment.

As described above, according to the seventh embodiment of the present invention, a semiconductor memory device having a write masking function and being capable of changing the data bit width with accuracy can be implemented, since switching of the connection between a data input/output circuit and a write driver/preamplifier is performed on a unit of a write mask even in the arrangement in which an internal read data line pair and an internal write data line pair are provided separately. In addition, a write data line and a read data line are provided separately and precharging of the write data line is unnecessary so that the read operation can be performed at a high speed after the completion of a write operation. Accordingly, a semiconductor memory device capable of a high-speed operation can be implemented. Further, since the precharging operation is not required, the consumed current can be reduced. A write driver is formed by a two-value driver having a latch circuit, and no charging or discharging of an internal write data line pair takes place during operations for writing the same data so that the consumed current can be reduced.

As seen from the above, according to the present invention, a semiconductor memory device suitable for merging with a logic and capable of performing an accurate data write at a high speed with low current consumption is provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array including normal memory cells arranged in a matrix of rows and columns and spare memory cells for replacing a defective normal memory cell among said normal memory cells, a row of said spare memory cells being arranged corresponding to a row of said normal memory cells,
   redundancy control circuitry for storing a defective address of said defective normal memory cell, and for determining whether a provided address signal indicating the defective address stored therein, said redundancy control circuitry outputting a result of spare determination at different timing in a data write mode and in a data read mode.

2. The semiconductor memory device according to claim 1, wherein said redundancy control circuitry includes a circuit for setting an outputting of the result of spare determination in said data write mode at an earlier timing than a timing at which the result of spare determination is output in said data read mode.

3. The semiconductor memory device according to claim 2, further comprising:
   a write data bus provided extending over said memory cell array for transmitting write data to selected memory cells in said memory cell array, said write data bus including a plurality of normal write data lines for transmitting write data in parallel to a plurality of normal memory cells of said normal memory cells and a spare write data line for transmitting write data to a spare memory cell of said spare memory cells;
   a read data bus provided extending over said memory cell array for transmitting read data from selected memory cells in said memory cell array, said read data bus including a plurality of normal read data lines for transmitting read data in parallel from selected normal memory cells of said normal memory cells and a spare read data line for transmitting read data from a selected spare memory cell of said spare memory cells;
   write column select circuitry enabled in response to a data write instruction for connecting selected normal memory cell columns designated by said provided address signal to respective normal write data lines of said write data bus, said write column select circuitry simultaneously selecting a spare memory cell column and connecting the spare memory cell column to said spare write data line;
   a read column select circuit enabled in response to a data read instruction for simultaneously reading out data from selected normal memory cell columns and a spare memory cell column designated by said provided address signal in parallel on said read data bus;
   a plurality of read repair selecting circuits provided to the respective normal read data lines, each for selecting one of read data from a corresponding normal read data line and read data from said spare read data line according to the result of spare determination output from said redundancy control circuitry;
   a read circuit for receiving and outputting data from said plurality of read repair selecting circuits;
   a plurality of normal write circuits provided to the respective normal write data lines for transmitting write data to corresponding normal write data lines when activated;
   a spare write circuit provided corresponding to said spare write data line for transmitting write data to said spare write data line when activated;
   a write repair selecting circuit for selecting one of write data provided to said plurality of normal write circuits according to the result of spare determination from said redundancy control circuitry and providing selected write data to said spare write circuit, wherein
   said redundancy control circuitry includes
      a circuit for storing said defective address, and
      a circuit for outputting a replacement instruction signal for instructing a normal read data line or a normal write data line to be replaced and a signal indicating whether to use a spare memory cell of the spare memory cells both as the result of spare determination according to said provided address signal and the stored defective address.

4. The semiconductor memory device according to claim 3, wherein timing of a column select by said read column selection circuit is earlier than timing of a column select by said write column select circuit.

5. The semiconductor memory device according to claim 3, wherein said memory cell array is divided into a plurality of row blocks along a column direction, and
   the defective address storing circuit of said redundancy control circuitry circuit stores addresses of a normal read data line and a normal write data line to be replaced for predetermined number of row blocks, with said predetermined number greater than zero.

6. The semiconductor memory device according to claim 3, wherein said memory cell array is divided into a plurality of row blocks along a column direction,
   said semiconductor memory device further comprises:
      a plurality of sense amplifier bands provided corresponding to said plurality of row blocks and each including a plurality of sense amplifier circuits each provided corresponding to a column of a corresponding row block, said write column select circuit includes
a write gate arranged to each column of each of said row blocks and
a plurality of write column select signal lines extending in said row direction in the sense amplifier bands and each provided in common to a column of said normal memory cells and a column of said spare memory cells, and said read column select circuit includes
a read gate arranged corresponding to each column of each of said row blocks, and
a plurality of read column select signal lines extending in said row direction in the sense amplifier bands and each provided in common to a column of said normal memory cells and a column of said spare memory cells.

7. The semiconductor memory device according to claim 1, further comprising a plurality of write column select circuits provided corresponding to the respective normal memory cell columns and a column of said spare memory cells for electrically connecting corresponding memory cell columns to write data lines when made conductive, each of said plurality of write column select circuits including
a write mask gate for receiving a data write mask instruction signal, and
a write column select gate connected in series to said write mask gate and made conductive in response to a column select signal.

8. The semiconductor memory device according to claim 7, further comprising a plurality of sense amplifier circuits arranged corresponding to said normal memory cell columns and the spare memory cell column for sensing and amplifying data on corresponding columns when activated, wherein each of said plurality of write column select circuits is disposed between a corresponding sense amplifier circuit and a corresponding write data line, said write mask gate is arranged to connect to the corresponding sense amplifier circuit, and said write column select gate is arranged to connect to the corresponding write data line.

9. The semiconductor memory device according to claim 7, wherein said write data lines are provided extending in a column direction over said memory cell array, said memory cell array is divided into a plurality of row blocks along the column direction, each of said plurality of write column select circuits is disposed corresponding to a column of each of said row blocks, and said column select signal is generated in response to a row block designating signal and a column address signal.

10. The semiconductor memory device according to claim 9, further comprising a write mask data line for transmitting said data write mask instruction signal, wherein said write mask data line has a first portion arranged extending in the column direction on said memory cell array and a second portion arranged extending along a row direction in which said rows extend and connected to said first portion, said second portion being coupled to said write mask gate.

11. The semiconductor memory device according to claim 10, wherein each of said row blocks is divided into a plurality of memory cell blocks along the row direction, each of said memory cell blocks includes a plurality of sub-word lines disposed corresponding to the memory cell rows and connecting memory cells of corresponding rows, each of said row blocks includes a main word line provided in common to corresponding memory cell blocks and a plurality of sub-word line drivers arranged corresponding to sub-word lines of said corresponding memory cell blocks each for driving to a selected state a corresponding sub-word line according to at least a signal on a corresponding main word line, and said first portion is provided in a region for disposing the sub-word line drivers.

12. The semiconductor memory device according to claim 10, further comprising sense amplifier circuits each is arranged corresponding to a column of a corresponding row block and activated in response to a corresponding sense amplifier activating signal; and a logic gate for transmitting the data write mask instruction signal to said second portion according to a signal on said first portion and a sense amplifier activating signal for a corresponding sense amplifier circuit.

13. The semiconductor memory device according to claim 3, wherein each of the normal write circuits and the spare write circuit includes a write driver coupled to a corresponding write data line for two-state driving the corresponding write data line according to write data when activated, said write driver includes a bi-state buffer for outputting a two-state signal, and said corresponding write data line is constantly driven by said bi-state buffer.

14. The semiconductor memory device according to claim 7, further comprising a plurality of sense amplifier circuits arranged corresponding to the columns of said memory cells for sensing and amplifying memory cell data on corresponding column when activated, wherein said plurality of sense amplifier circuits receive a voltage from a sense power supply as an operation power supply voltage when activated, and an amplitude of said data write mask instruction signal substantially equals a voltage value of said sense power supply.

15. The semiconductor memory device according to claim 14, wherein said write data lines include a plurality of global write data line pairs disposed extending in a column direction over said memory cell array, wherein said semiconductor memory device further comprises write circuitry for driving said plurality of global write data line pairs according to write data in said data write mode, said write circuitry operates receiving a voltage from another power supply other than said sense power supply as an operation power supply voltage.

16. The semiconductor memory device according to claim 12, wherein said logic gate receives a voltage of a same level as operation power supply voltage of the sense amplifier circuits as an operation power supply voltage to generate the data write mask instruction signal of a same amplitude as the operation power supply voltage of said sense amplifier circuits.

17. The semiconductor memory device according to claim 1, wherein said memory cell array is divided into a plurality of row blocks along a column extending direction, said semiconductor memory device further comprises:

a plurality of global write data line pairs arranged extending along the column extending direction over said memory cell array for transmitting write data in parallel;

a plurality of global read data line pairs provided separately from said plurality of global write data line pairs and extending in said column extending direction over said memory cell array for transmitting data read from selected memory cells in said memory cell array in parallel;

a plurality of sense amplifier bands arranged corresponding to said plurality of row blocks and each including a plurality of sense amplifier circuits, each sense amplifier circuit arranged corresponding to a column of a corresponding row block for sensing and amplifying data on a corresponding column;

a plurality of column select lines arranged extending in a row direction in said plurality of sense amplifier bands, each for transmitting a column select signal for selecting a column of a corresponding row block; and a column select signal generating circuit arranged in one side in the row direction of said plurality of row blocks for driving to a selected state a column select line corresponding to an addressed column among said plurality of column select lines according to a row block designating signal and a column address signal.

18. The semiconductor memory device according to claim 16, wherein the voltage from said another power supply is a voltage provided from outside to said semiconductor memory device.

19. The semiconductor memory device according to claim 6, wherein a write column select signal provided to said write gate has a substantially same amplitude value as a value of operation power supply voltage of the sense amplifier circuit.

20. A semiconductor memory device, comprising:

a plurality of memory cells arranged in rows and columns;

a plurality of sense amplifier circuits disposed corresponding to the columns of said memory cells, for sensing and amplifying data of memory cells of corresponding columns, said plurality of sense amplifier circuits being divided into a plurality of sense amplifier units, each of said plurality of sense amplifier units including a prescribed number of sense amplifier circuits;

a plurality of internal data lines provided corresponding to said plurality of sense amplifier units;

a plurality of column select units provided corresponding to said plurality of sense amplifier units, each for selecting a sense amplifier circuit from a corresponding sense amplifier unit in response to a column select signal;

a plurality of write mask circuits each provided corresponding to a sense block including a predetermined number of the sense amplifier units, each for inhibiting connection between a sense amplifier circuit of a corresponding sense block and a corresponding internal data line in response to a corresponding data mask instruction signal;

a plurality of write drivers provided corresponding to said plurality of internal data lines for transmitting internal write data to corresponding internal data lines when activated, said plurality of write drivers being divided into a plurality of write driver blocks corresponding to said plurality of write mask circuits; and a plurality of mask gate circuits provided corresponding to said plurality of write mask circuits, each for applying the corresponding data mask instruction signal to a corresponding write mask circuit in response to a data mask instruction, each of the mask gate circuits including a gate circuit for activating the corresponding data mask instruction signal to inhibit connection through a corresponding write mask circuit when a corresponding write driver block is inactive.

21. The semiconductor memory device according to claim 20, wherein each of said plurality of column select units includes column select gates provided corresponding to the respective sense amplifier circuits of a corresponding sense amplifier unit, each of said column select gates is rendered conductive in response to a corresponding selected column designating signal, different selected column designating signals are applied to different column select gates in each of said column select units, and said column select signal includes said different selected column designating signals, and each of the write mask circuits includes a write mask gate provided corresponding to each sense amplifier circuit of each sense amplifier unit of a corresponding sense block, and the write mask gate is connected in series with a corresponding column select gate, and is rendered non-conductive when the corresponding data mask instruction signal instructs a write data masking.

22. The semiconductor memory device according to claim 20, further comprising a write driver control circuit provided corresponding to each of the write driver blocks, for activating a write driver of a corresponding write driver block in response to a data line selecting signal to transmit data from a data input circuit to a corresponding internal data line, wherein said data line selecting signal is activated individually for each write driver block, and a number of the write driver blocks to be activated at one time is determined according to an input data bit width.

23. The semiconductor memory device according to claim 22, wherein said data line selecting signal is applied in a combination of a write driver activating signal and a prescribed column address signal of at least one bit, and the data mask instruction signal is generated by a combination of said data mask instruction and said prescribed column address signal of at least one bit.

24. The semiconductor memory device according to claim 20, wherein said plurality of internal data lines include an internal write data line for transmitting write data provided separately from an internal read data bus for transmitting data read from a memory cell, and each of the write drivers includes a bi-state buffer for two-value driving a corresponding internal write data line, and said bi-state buffer includes a latch circuit for latching received data, for two-value driving a corresponding internal write data line according to latched data.

25. The semiconductor memory device according to claim 1, wherein said memory cell array is divided into a plurality of data path blocks each including columns of the normal memory cells and at least one column of the spare memory cells, and said redundancy control circuit comprises a plurality of redundancy control circuits provided corresponding to the respective data path blocks, and performing the spare determination individually.

26. The semiconductor memory device according to claim 25, wherein each of said plurality of redundancy control circuits includes a program circuit for storing a defective address indicating a defective normal cell in a corresponding data path block through programming.

27. The semiconductor memory device according to claim 25, wherein each data path block includes a predetermined number of memory blocks arranged in alignment in a column direction, and each redundancy control circuit includes fuse groups of the predetermined number for storing a defective address indicating a defective memory cell in each respective memory block through fuse programming.

28. The semiconductor memory device according to claim 2, further comprising:

a write data bus for transmitting write data to selected memory cells in said memory cell array, said write data bus including a plurality of normal write data lines for transmitting write data in parallel to a plurality of normal memory cells of said normal cells and a spare write data line for transmitting write data to a spare memory cell of said spare memory cells;

a read data bus for transmitting read data from selected memory cells in said memory cell array, said read data bus including a plurality of normal data lines for transmitting read data in parallel from selected normal memory cells of said normal memory cells and a spare read data line for transmitting read data from a selected spare memory cell of said spare memory cells;

write column select circuitry enabled in response to a data write instruction for connecting selected normal memory cell columns designated by said provided address signal to respective normal write data lines of said write data bus, said write column select circuitry simultaneously selecting a spare memory cell column and connecting the spare memory cell column to said spare write data line;

read column select circuitry enabled in response to a data read instruction for simultaneously reading out data from selected normal cell columns and a spare memory cell column designated by said provided address signal in parallel on said read data bus;

a plurality of read repair selecting circuits provided to the respective normal read data lines, each for selecting one of read data from a corresponding normal read data line and read data from said spare read data line according to the result of spare determination output from said redundancy control circuitry;

a read circuit for receiving and outputting data from said plurality of read repair selecting circuits;

a plurality of normal write circuits provided to the respective normal write data lines for transmitting write data to corresponding normal write data lines when activated;

a spare write circuit provided corresponding to said spare write data line for transmitting write data to said spare write data line when activated;

a write repair selecting circuit for selecting one of write data provided to said plurality of normal write circuits according to the result of spare determination from said redundancy control circuit and providing selected write data to said spare write circuit; wherein said redundancy control circuitry includes a circuit for storing said defective address, and a circuit for outputting a replacement instruction signal for instructing a normal read data line or a normal write data line to be replaced and a signal indicating whether to use a spare memory cell of the spare memory cells both as the result of spare determination according to said provided address signal and the stored defective address.

* * * * *